(12) United States Patent
Yoshizumi et al.

(10) Patent No.: US 9,940,086 B2
(45) Date of Patent: Apr. 10, 2018

(54) DISPLAY DEVICE, DISPLAY UNIT, AND DISPLAY SYSTEM

(71) Applicant: Semiconductor Energy Laboratory Co., Ltd., Atsugi-shi, Kanagawa-ken (JP)

(72) Inventors: Kensuke Yoshizumi, Kanagawa (JP); Yuichi Yanagisawa, Kanagawa (JP); Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 63 days.

(21) Appl. No.: 14/994,335

(22) Filed: Jan. 13, 2016

(65) Prior Publication Data
US 2016/0210103 A1    Jul. 21, 2016

(30) Foreign Application Priority Data

Jan. 21, 2015  (JP) .................................. 2015-009453
Mar. 2, 2015   (JP) .................................. 2015-040295

(51) Int. Cl.
*G06F 3/14* (2006.01)
*H01L 51/00* (2006.01)
(Continued)

(52) U.S. Cl.
CPC ............ *G06F 3/1446* (2013.01); *G06F 3/147* (2013.01); *H01L 27/14681* (2013.01); *H01L 51/0097* (2013.01); *G09G 2300/023* (2013.01); *G09G 2300/0456* (2013.01); *G09G 2330/021* (2013.01); *G09G 2380/02* (2013.01);
(Continued)

(58) Field of Classification Search
CPC . G06F 3/1446; G06F 3/147; G09G 2300/023; G09G 2300/0456; G09G 2330/021; G09G 2380/02; G09G 2300/026; H01L 2251/5338; H01L 27/14681; H01L 51/0097; H04N 5/64; Y02E 10/549; Y02P 70/521
See application file for complete search history.

(56) References Cited

U.S. PATENT DOCUMENTS 5,801,797 A *  9/1998  Iida et al. ........... G02F 1/13336
                                                    349/139
8,970,455 B2 *  3/2015  Thorson .................. G06F 3/147
                                                    345/105
(Continued)

FOREIGN PATENT DOCUMENTS

JP     11-265785 A    9/1999
JP    2002-297066 A   10/2002
(Continued)

*Primary Examiner* — Dmitriy Bolotin
(74) *Attorney, Agent, or Firm* — Fish & Richardson P.C.

(57) ABSTRACT

Provided is a display device or a display system capable of displaying images along a curved surface, a display device or a display system capable of displaying images seamlessly in the form of a ring, or a display device or a display system that is suitable for increasing in size. The display device includes a display panel. The display panel includes a first part and a second part and is flexible. The first part can display images. The second part can transmit visible light. The display panel is curved so that the second part and the first part overlap with each other.

17 Claims, 42 Drawing Sheets

(51) Int. Cl.
  *G06F 3/147* (2006.01)
  *H01L 27/146* (2006.01)
  *H04N 5/64* (2006.01)

(52) U.S. Cl.
  CPC ........ *H01L 2251/5338* (2013.01); *H04N 5/64* (2013.01); *Y02E 10/549* (2013.01); *Y02P 70/521* (2015.11)

(56) References Cited

U.S. PATENT DOCUMENTS

| | | | |
|---|---|---|---|
| 9,088,006 | B2 | 7/2015 | Yamazaki et al. |
| 9,570,038 | B2 * | 2/2017 | Lee .................... G09G 5/006 |
| 2005/0285811 | A1 * | 12/2005 | Kawase ............ G02F 1/13336 |
| | | | 345/1.1 |
| 2008/0084657 | A1 * | 4/2008 | Baba ...................... G04G 17/08 |
| | | | 361/679.01 |
| 2008/0291225 | A1 * | 11/2008 | Arneson ................. G06F 3/011 |
| | | | 345/698 |
| 2010/0164906 | A1 | 7/2010 | Fukunaga et al. |
| 2010/0177018 | A1 * | 7/2010 | Wang .................... G06F 1/1601 |
| | | | 345/1.3 |
| 2011/0050657 | A1 | 3/2011 | Yamada |
| 2013/0044215 | A1 * | 2/2013 | Rothkopf ................ G06F 1/163 |
| | | | 348/143 |
| 2013/0201637 | A1 * | 8/2013 | De Kok ............. H01L 27/3293 |
| | | | 361/749 |
| 2014/0055924 | A1 * | 2/2014 | Baek .................... H05K 5/0017 |
| | | | 361/679.01 |
| 2014/0099479 | A1 * | 4/2014 | Krall ....................... B32B 3/14 |
| | | | 428/174 |
| 2014/0353613 | A1 * | 12/2014 | Cheon ................ H01L 51/0097 |
| | | | 257/40 |
| 2015/0028316 | A1 * | 1/2015 | Kojima .............. H01L 51/5212 |
| | | | 257/40 |
| 2015/0138699 | A1 * | 5/2015 | Yamazaki ............... G06F 1/163 |
| | | | 361/679.03 |
| 2015/0228704 | A1 * | 8/2015 | Miyake .............. H01L 51/0097 |
| | | | 257/40 |
| 2015/0262331 | A1 * | 9/2015 | Bang ..................... G06F 3/1431 |
| | | | 345/1.3 |
| 2015/0325812 | A1 | 11/2015 | Yamazaki et al. |
| 2015/0355729 | A1 * | 12/2015 | Park ...................... G06F 3/1446 |
| | | | 345/173 |
| 2016/0014882 | A1 * | 1/2016 | Jongman ............ H01L 27/3293 |
| | | | 361/749 |
| 2016/0018846 | A1 * | 1/2016 | Zenoff ................... G09G 3/002 |
| | | | 345/174 |
| 2016/0103649 | A1 * | 4/2016 | Yoshitani .............. G06F 3/1446 |
| | | | 345/694 |
| 2016/0132281 | A1 * | 5/2016 | Yamazaki ............. G06F 3/1446 |
| | | | 345/1.3 |
| 2016/0212837 | A1 * | 7/2016 | Kim ...................... G06F 1/1652 |
| 2016/0282899 | A1 * | 9/2016 | Inagaki ..................... G04G 9/04 |
| 2016/0291640 | A1 * | 10/2016 | Seo ........................... G09G 3/00 |
| 2016/0299526 | A1 * | 10/2016 | Inagaki ................... G06F 1/163 |

FOREIGN PATENT DOCUMENTS

| | | |
|---|---|---|
| JP | 2012-028638 A | 2/2012 |
| JP | 2014-197522 A | 10/2014 |

* cited by examiner

505A

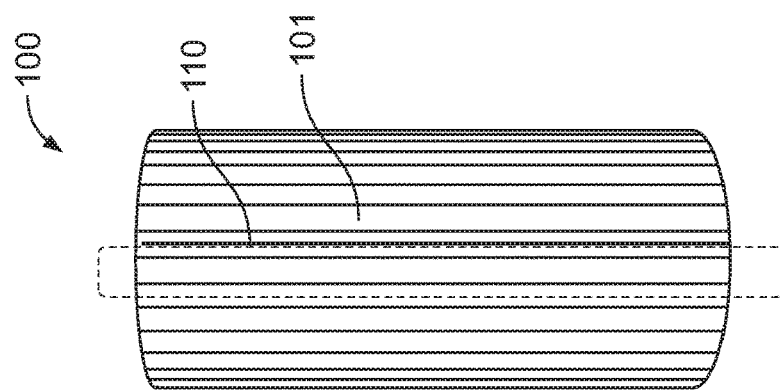
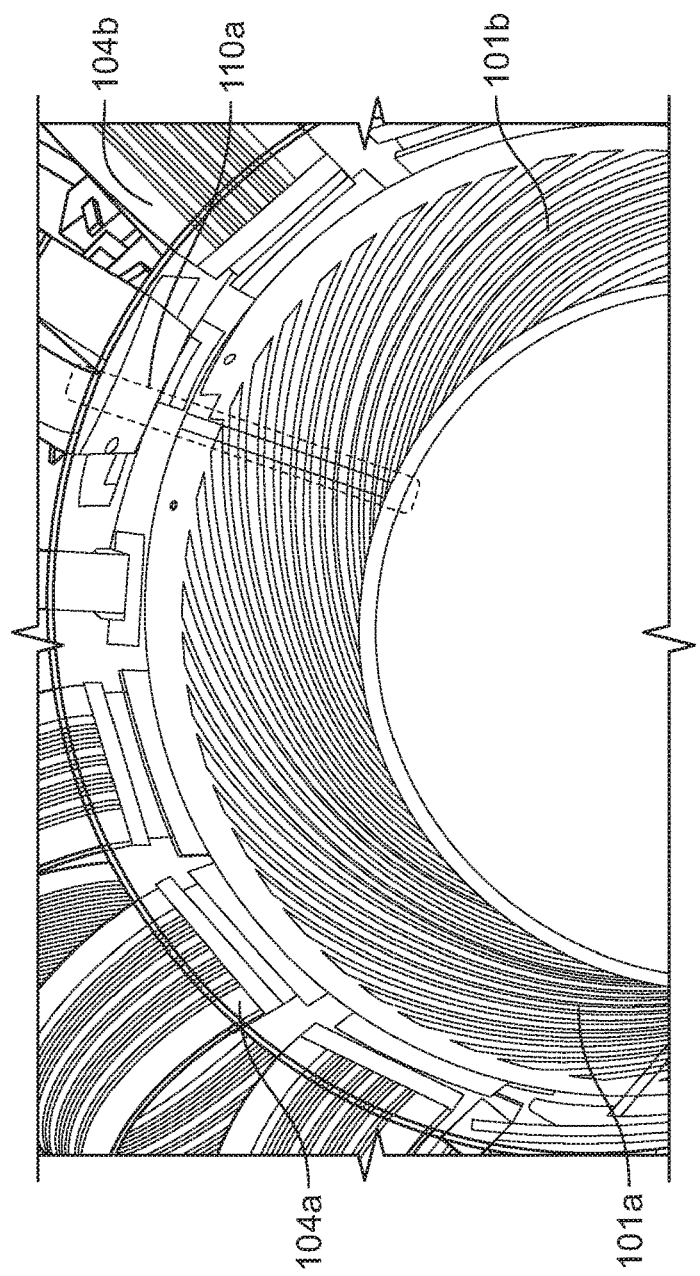
FIG. 41C
FIG. 41B

DISPLAY DEVICE, DISPLAY UNIT, AND DISPLAY SYSTEM

BACKGROUND OF THE INVENTION

1. Field of the Invention

One embodiment of the present invention relates to a display device for displaying images.

Note that one embodiment of the present invention should not limited this technical field. Examples of the technical field of one embodiment of the present invention disclosed in this specification include a semiconductor device, a display device, a light-emitting device, a lighting device, a power storage device, a storage device, a method for driving any of them, and a method for manufacturing any of them.

2. Description of the Related Art

In recent years, it has been required to increase display devices in size and type. Examples include a television device for home use (also referred to as a TV or a television receiver), digital signage, and a public information display (PID). Larger digital signage, PID, and the like provide the increased amount of information, and attract more attention when used for advertisement or the like, so that the effectiveness of the advertisement is expected to be increased.

Examples of the display device include, typically, a light-emitting device including a light-emitting element such as an organic electroluminescent (EL) element or a light-emitting diode (LED), a liquid crystal display device, and an electronic paper performing display by an electrophoretic method or the like.

For example, in a basic structure of an organic EL element, a layer containing a light-emitting organic compound is provided between a pair of electrodes. Voltage application to the element makes the light-emitting organic compound to emit light. A display device including such an organic EL element needs no backlight which is necessary for liquid crystal display devices and the like; therefore, thin, lightweight, high contrast, and low power consumption display devices are obtained.

Patent Document 1 discloses a flexible light-emitting device in which an organic EL element is used.

REFERENCE

Patent Document

[Patent Document 1] Japanese Published Patent Application No. 2014-197522

SUMMARY OF THE INVENTION

An object of one embodiment of the present invention is to provide a display device or a display system capable of displaying images along a curved surface. An object of one embodiment of the present invention is to provide a display device or a display system capable of displaying images seamlessly in the form of a ring. An object of one embodiment of the present invention is to provide a display device or a display system that is suitable for increasing in size. An object of one embodiment of the present invention is to provide a display device or a display system which attracts more attention and has a high advertising effect. An object of one embodiment of the present invention is to provide a display device or a display system which is easily maintained and controlled. An object of one embodiment of the present invention is to provide a display system with high power feeding efficiency. An object of one embodiment of the present invention is to provide a novel display device, display unit, display system, or the like.

Note that the descriptions of these objects do not disturb the existence of other objects. In one embodiment of the present invention, there is no need to achieve all the objects. Objects other than the above objects can be derived from the description of the specification and like.

One embodiment of the present invention is a display device including a display panel. The display panel includes a first part and a second part and is flexible. The first part displays an image. The second part transmits visible light. The display panel is curved so that the first part overlaps with the second part.

Another embodiment of the present invention is a display device including a first display panel and a second display panel. Each of the first display panel and the second display panel includes a first part and a second part. The first display panel and the second display panel are flexible. The first part displays an image. The second part transmits visible light. At least one of the first display panel and the second display panel is curved to overlap with each other. The first part of the first display panel and the second part of the second display panel includes a region overlapping with each other. The first part of the second display panel and the second part of the first display panel includes a region overlapping with each other.

Another embodiment of the present invention is a display device including a first display panel to an n-th display panel (n is an integer of 2 or more). Each of the first to n-th display panels includes a first part and a second part and is flexible. The first part can display an image. The second part can transmit visible light. The first to n-th display panels include every two adjacent display panels which are curved to partly overlap with each other. The first part of a k-th display panel (k is an integer of 1 or more and n−1 or less) to overlap with the second part of an (k+1)-th display panel. The first part of the n-th display panel overlaps with the second part of the first display panel.

Another embodiment of the present invention is a display unit including a display panel and a support. The display panel includes a first part and a second part and is flexible. The first part displays an image. The second part transmits visible light. The support includes a first surface having a curved surface and an attachment mechanism on a side opposite to the first surface. The attachment mechanism fixes the support to a frame. The display panel is fixed along the first surface of the support. The second part of the display panel partly extends beyond the support.

The display unit preferably includes a power receiving device. The power receiving device includes a power receiving resonance coil, a power receiving coil, a rectifier circuit, a DC-DC converter, and a battery. The power receiving resonance coil induces a high-frequency voltage by magnetic resonance. The power receiving coil induces a high-frequency voltage by electromagnetic induction with the power receiving resonance coil. The rectifier circuit rectifies the high-frequency voltage induced by the power receiving coil. The DC-DC converter receives a direct current voltage that is output from the rectifier circuit. The battery feeds power using the direct current voltage that is output from the DC-DC converter. It is preferable that the DC-DC converter include an input power detection unit and a voltage conversion unit, the input power detection unit be supplied with a first direct voltage, and the voltage conversion unit convert the first direct voltage into a second direct voltage and output it. The input power detection unit includes a load, a first means for detecting a first voltage proportional to the first direct-current voltage, and a second means for detecting a second voltage proportional to a current generated in the load. The voltage conversion unit includes a switch for controlling a current generated in the load, and a third means for keeping a ratio of the first voltage and the second voltage constant by controlling the switch in accordance with the first voltage and the second voltage.

The display unit preferably includes a flexible printed circuit (FPC) and a driving device. It is preferable that the driving device output a first signal to the display panel, be fixed to part of the support other than the first surface, and be electrically connected to the display panel through the FPC.

Another embodiment of the present invention is a display system including n display units described above, the frame, and an output device. The frame includes an arm having a ring shape and a leg supporting the arm. The output device outputs a second signal to the display unit. The display unit is attached to the arm with the attachment mechanism. When a first to an n-th display units are attached to the arm, the first part of the display panel of a k-th display unit (k is an integer of 1 or more and n−1 or less) preferably overlaps with the second part of the display panel of a (k+1)-th display unit, and the first part of the display panel of the n-th display unit preferably overlaps with the second part of the display panel of the first display unit.

In the display system descried above, the frame preferably includes a plurality of protrusions or depressions each fitting the attachment mechanism of the display unit and a mechanism for changing the shape of the arm between a closed ring shape and an opened ring shape.

In the display system descried above, the output device preferably output the second signal to the display unit wirelessly.

In the display system descried above, the output device preferably includes a memory device or a terminal for connecting with an external memory device, and obtains information over a network.

According to one embodiment of the present invention, a display device or a display system capable of displaying images along the curved surface a display device or a display system capable of displaying images seamlessly in the form of a ring, a display device or a display system that is suitable for increasing in size, a display device or a display system which attracts more attention and has a high advertising effect, a display device or a display system which is be easily maintained and controlled, a display system with high power feeding efficiency, or a novel display device, display unit, display system, or the like is provided.

BRIEF DESCRIPTION OF THE DRAWINGS

FIGS. 41A to 41C are photographs of a display device according to one example.

DETAILED DESCRIPTION OF THE INVENTION

Figure 1A:
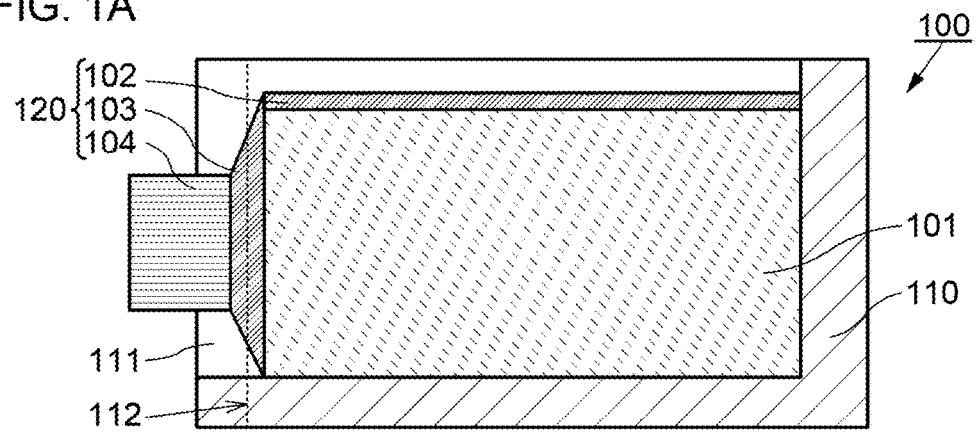
FIGS. 1A to 1C illustrate a structure example of a display panel and a display device according to one embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

In this specification and the like, unless otherwise described, the term "image" refers to any image which is displayed in a display region of a display device or the like, such as a still image, a moving image, or an image including a still image and a moving image.

Embodiment 1

This embodiment describes a display panel, a display device, a display unit, a display system, and the like which are embodiments of the present invention, with reference to drawings.

In one embodiment of the present invention, a plurality of display panels is arranged in one or more directions (e.g., in a row or in matrix), whereby a display device and a display system each having a large display region are manufactured.

When a plurality of display panels for the display device and display system each having a large display region are used, each display panel does not need to be large in size. Therefore, an apparatus for manufacturing the display panel does not need to be increased in size, which leads to space saving. In addition, since an apparatus for manufacturing small- and medium-size display panels can be used, there is no need to use a novel manufacturing apparatus for increasing the size of a display device, which leads to a reduction in manufacturing cost. Furthermore, a decrease in yield caused by increasing the size of a display panel can be suppressed.

A display device and a display system which include a plurality of display panels have a larger display region and have an effect of displaying more information at a time than those which include one display panel when the display panels have the same size, for example.

However, conventional display panels have a non-display region that surrounds a display region. For this reason, when the plurality of display panels is arranged to unite respective output images to display a single image, for example, the image appears divided to a user of the display device.

Although narrowing the non-display regions of display panels (using display panels with narrower frames) prevents the images of the display panels from appearing divided, it is difficult to totally remove the non-display region.

In addition, a smaller non-display region leads to a decrease in the distance between the edge of the display panel and an element in the display panel, so that the element easily deteriorates by impurities entering from the outside of the display panel in some cases.

In view of them, a display device and a display system of embodiments of the present invention include a plurality of display panels overlapping with each other. In every two display panel overlapping with each other, at least a display panel positioned on the display surface side (upper side) includes a region transmitting visible light that is adjacent to a display region. In one embodiment of the present invention, a display region of a display panel positioned on a lower side and the region that transmits visible light of the display panel on the upper side overlap with each other. Therefore, a non-display region between the display regions of the overlapping two display panels reduced or even removed. As a result, a large-sized display device and display system in which a joined portion of the display panels is hardly seen by the user are obtained.

In addition, in one embodiment of the present invention, at least part of the non-display region of the display panel positioned on the upper side transmits visible light and thus can overlap with the display region of the display panel positioned on the lower side. Furthermore, in one embodiment of the present invention, at least part of the non-display region of the display panel positioned on the lower side can overlap with a display region of the display panel positioned on the upper side or a region blocking visible light thereof. It is not necessary to reduce the areas of these regions because a reduction in the area of the frame of the display device (a reduction in area except a display region) is not affected by these regions.

A larger non-display region leads to an increase in the distance between the edge of the display panel and an element in the display panel, so that the deterioration of the element due to impurities entering from the outside of the display panel is suppressed. For example, in the case where an organic EL element is used as a display element, as the distance between the edge of the display panel and the organic EL element in the display panel increases, impurities such as moisture or oxygen are less likely to enter (or less likely to reach) the organic EL element from the outside of the display panel. Since a sufficient area of the non-display region of the display panel is secured in the display device of one embodiment of the present invention, a highly reliable large display device and display system are fabricated even when a display panel including an organic EL element or the like is used.

In one embodiment of the present invention, a plurality of display panels is arranged in a row and every two adjacent display panels partly overlap with each other; thus, a region in which the display regions of the plurality of display panels form a continuous display region in the form of a band is used as a single display region. In addition, two display panels at both ends partly overlap with each other; accordingly, some or all of the plurality of display panels are curved. In other words, a region in which the display regions of the plurality of display panels are seamlessly joined in the form of a cylinder is used as a single display region.

Structure examples are specifically described below.

[Structure Example of Display Panel]

FIG. 1A is a schematic top view of a display panel 100 which can be used for a display device, a display unit, a display system, and the like of which are embodiments of the present invention.

The display panel 100 includes a substrate 111, a substrate 112, a display region 101, a driver circuit 102, a wiring 103, and an FPC 104.

Each of the substrate 111 and the substrate 112 preferably has flexibility, in which case the display panel 100 can be curved so that the display region 101 can have a convex or a concave display surface. Alternatively, a curved substrate having rigidity may be used as the substrate 111 and/or the substrate 112.

The display region 101 is a region for displaying images. A plurality of pixels is included in the display region 101 between the substrate 111 and the substrate 112.

The driver circuit 102 is a circuit for driving the pixels included in the display region 101. Although the driver circuit 102 is formed over the substrate 111 in this non-limiting example, an integrated circuit (IC) chip may be used as the driver circuit 102 to be mounted on the substrate 111 or the FPC 104.

The FPC 104 has a function of supplying a signal from the outside to the pixels included in the display region 101 and to the driver circuit 102 through the wiring 103.

The display panel 100 includes a region 110 transmitting visible light (hereinafter also simply referred to as region 110). The region 110 is in contact with the display region 101. Specifically, the region 110 transmitting visible light is located along part of the outline of the display region 101. In the example shown in FIG. 1A, the region 110 transmitting visible light is provided along both the long side and the short side of the display region 101 which is rectangular. The driver circuit 102 and the wiring 103 are provided along one long side and one short side of the display region 101 and not provided along the other long side and the other short side, in which case the region 110 transmitting visible light is adjacent to and in contact with the display region 101.

The region 110 transmitting visible light is preferably provided on a side opposite to the side where the FPC 104 is connected so that the display region 101 is provided between the region 110 and the FPC 104 as shown in FIG. 1A. This is because the display panel 100 can be curved so that the FPC 104 is located on the side opposite to the display surface of the display region 101, which will be described in detail.

A region of the display panel 100 where the driver circuit 102, the wiring 103, the FPC 104, and the like are included is referred to as a region 120 blocking visible light (hereinafter also simply referred to as region 120). Note that in the case where the driver circuit 102, the wiring 103, and the FPC 104 are formed using light-transmitting materials and accordingly the region transmits visible light, the region is regarded as part of the region 110 transmitting visible light.

In FIG. 1A, the substrate 112 is denoted by a dashed line and covers at least the display region 101. The substrate 112 may partly or entirely cover the driver circuit 102, the wiring 103, the region 110, and the like. In addition, the substrate 112 is provided to avoid a terminal portion for connecting the FPC 104 and the wiring 103. Note that an opening may be formed in the substrate 112, in which case the opening overlaps with the terminal portion so that the surface of the terminal portion is exposed from the opening.

Structure Example 1 of Display Device

Figure 1B:
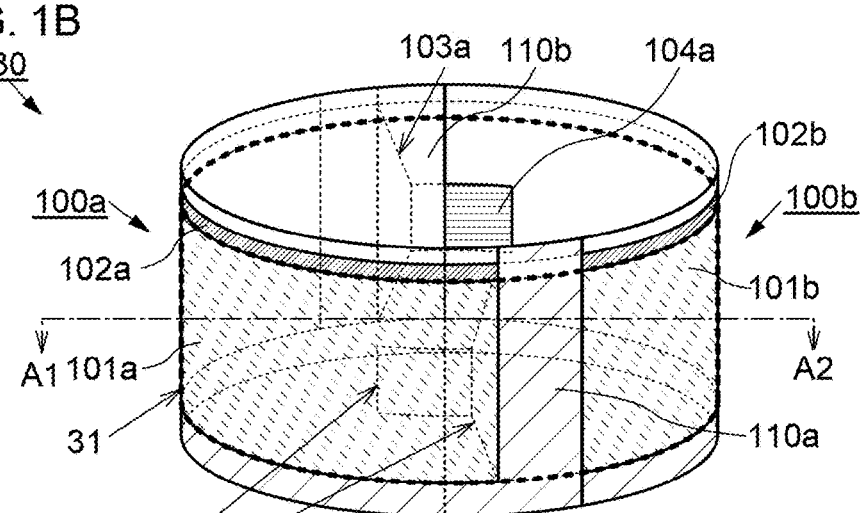
Figure 2A:
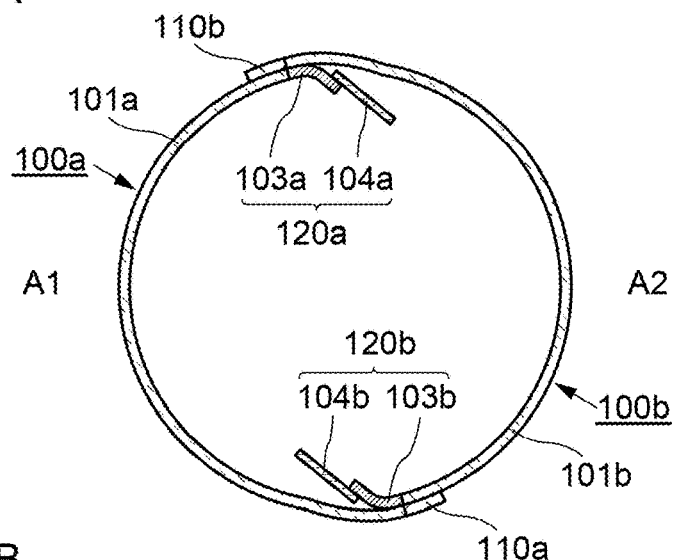
FIGS. 2A to 2C illustrate a structure example of a display device according to one embodiment.
Figure 2B:
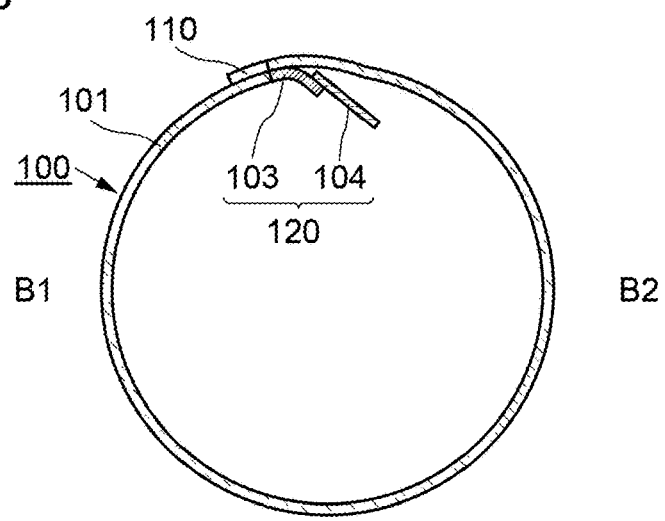
Figure 2C:
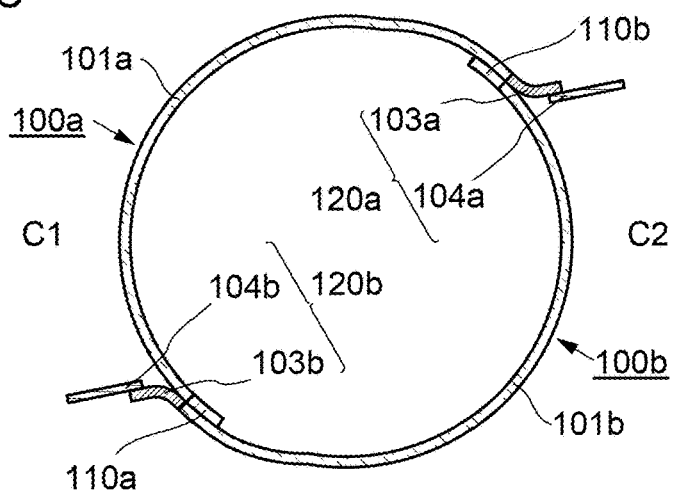

FIG. 1B shows a structure example of a display device 30 including two display panels 100. In addition, FIG. 2A is a schematic cross-sectional view taken along section line A1-A2 in FIG. 1B.

Hereinafter, to distinguish the display panels from each other, the same components included in the display panels from each other, or the same components relating to the display panels from each other, letters (e.g., a, b) are added to reference numerals. Unless otherwise specified, in describing a structure in which a plurality of display panels is included, letters are not added when a common part of the display panels or the components is described.

The display device 30 includes a display panel 100*a* and a display panel 100*b* which are joined to form a ring. Each display surface faces outward and the display device 30 displays images outward.

The display panel 100*a* includes a region 110*a* transmitting visible light, a region 120*a* blocking visible light, and a display region 101*a*. The display panel 100*b* includes a region 110*b* transmitting visible light, a region 120*b* blocking visible light, and a display region 101*b*. Part of the region 110*a* transmitting visible light overlaps with the display surface side of the display region 101*b*, so that a viewer sees the image displayed in the display region 101*b* partly through the region 110*a*.

An FPC 104*b*, a wiring 103*b*, and the like are part of the region 120*b* blocking visible light and included in the display panel 100*b*, and are covered with the display region 101*a* included in the display panel 100*a*. Thus, in the display device 30, the display region 101*a* and the display region 101*b* which is partly covered with the region 110*a* are joined seamlessly.

Similarly, part of the region 110*b* transmitting visible light and included in the display panel 100*b* overlaps with the display surface of the display region 101*a* included in the display panel 100*a*. In addition, an FPC 104*a*, a wiring 103*a*, and the like included in the display panel 100*a* are covered with the display region 101*b* included in the display panel 100*b*. Thus, in the display device 30, the display region 101*b* and the display region 101*a* which is partly covered with the region 110*b* are joined seamlessly.

A display region 31 in the display device 30 is surrounded by a bold dashed line in FIG. 1B. The display region 31 corresponds to the display region 101*a* and the display region 101*b* which are seamlessly joined to form a ring; accordingly, seamless, ring-shaped images are displayed in the display region 31. When the display device 30 is applied to a pillar, for example, a viewer sees a seamless image at any angle to the pillar.

The display device 30 which is one embodiment of the present invention is characterized by being capable of displaying a 360-degree seamless image in the display region 31. Two adjacent display panels 100 are arranged with their respective display regions 101 joined together, and the joined portion is not perceived by a viewer. As long as the joined portion is not perceived by a viewer, the two display panels 100 are not necessarily in contact with each other. For the same reason, there is no need to fix the two display panels 100 to each other by bonding or the like.

Therefore, in this specification and the like, the state where a display panel "forms a ring" also refers to a state in which the display panel is curved so that part including one end of the display panel overlaps with part including the other end of the display panel or a state in which these parts are in contact with each other. Here, a gap or another structure may be provided between the overlapping parts of the display panel. In addition, the state in which a plurality of display panels "forms a ring" refers to a state in which the plurality of display panels includes one or more regions where part including an end of one display panel and part including an end of the other display panel which is adjacent to the one display panel overlap or are in contact with each other. Here, a gap or a structure may be provided between the overlapping parts of the two adjacent display panels.

Three or more display panels 100 may be used, though two display panels 100 are used in FIG. 1B. An increase in the number of display panels 100 increases the size of the display region 31 of the display device 30 (the circumference of a ring formed of display region) without a change in the size or design of the display panel 100, and there is no limit to the size of the display region 31 either.

Figure 1C:
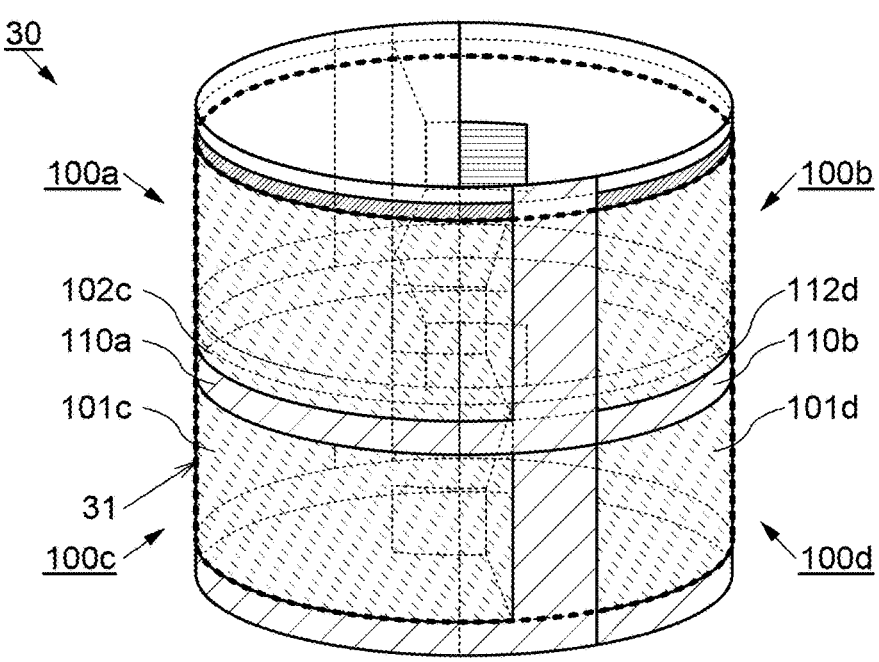

FIG. 1C shows an example in which two sets of two display panels 100 forming a ring are stacked vertically.

Specifically, the display device 30 shown in FIG. 1C includes four display panels (a display panel 100a, a display panel 100b, a display panel 100c, and a display panel 100d).

The positional relationship between the display panel 100a and the display panel 100b is similar to that in FIG. 1B. The positional relationship between the display panel 100c and the display panel 100d is also similar to that in FIG. 1B.

Part of the region 110a transmitting visible light and included in the display panel 100a overlaps with the display surface side of a display region 101c included in the display panel 100c. Furthermore, part of the display region 101a included in the display panel 100a covers each part of a wiring 103c, a driver circuit 102c, and the like, which are part of a region 120c (not shown) blocking visible light and included in the display panel 100c.

Similarly, part of the region 110b transmitting visible light and included in the display panel 100b overlaps with the display surface side of a display region 101d included in the display panel 100d. Furthermore, part of the display region 101b included in the display panel 100b covers each part of a wiring 103d, a driver circuit 102d, and the like, which are part of a region 120d (not shown) blocking visible light and included in the display panel 100d.

The two display regions 101 are joined seamlessly in the vertical direction in the display region 31 of the display device 30 shown in FIG. 1C, and accordingly, images are displayed seamlessly in the vertical direction as well. Furthermore, in the case where the display device 30 is applied to a pillar or the like, an increase in the number of display panels 100 disposed in the vertical direction extends the display region 31 in the height direction of the pillar, and there is no limit to the size of the display region 31 either.

Note that the display region 31 of the display device 30 has any one of various shapes, though it has a columnar shape in the non-limiting example here. For example, the outline of the display region 31 in the cross section can have various shapes, such as a circle, an oval, a polygon, or a rounded polygon. Alternatively, the display region 31 may have a cone shape or a pyramidal shape. In addition, the display region 31 can have a polyhedron shape, a rounded polyhedron shape, or the like without limitation to the pillar and the conic solid.

For example, the display device 30 applied to a pillar or the like in public facilities displays advertisements and the like in every direction to attract more attention, which leads to an increase in advertising effects.

For displaying images on the surface of a pillar or the like, for example, there is a method of providing one curved display panel along the surface of the pillar or the like. The structure, however, has a limited region for displaying images and thus displays images only in a limited direction. There is another method of disposing a plurality of display panels along the surface of a pillar or the like; however, in the method, a joint portion between two display panels causes a seam in an image.

There is another method of using a projection-type imaging device, such as a projector, to project images onto the surface of a pillar. In order to display images on the pillar in every direction using the method, however, a plurality of projectors is needed for each pillar. In addition, a large space is needed because the projector and the pillar needs to be distanced several meters (from 2 m to 5 m or more, typically), which is also a problem. Furthermore, there are some other problems when a projection-type imaging device is used: the contrast of a projected image is decreased in a bright environment by the influence of light reflected from a pillar or the like; the definition of a projected image is decreased; if an interrupting object exists between the projector and the pillar, the shadow of the interrupting object is casted on the pillar; and the like. In addition, distortion of a projected image might be caused depending on the shape of the surface of the pillar or positional relationship between the pillar and the projector.

In contrast, the display device 30 of one embodiment of the present invention displays images by itself and is preferably used at home and the like and even in a location having limited space. In addition, the display device 30 does not have the above-described problems in principle, such as image distortion, a decrease in contrast depending on the brightness of the surroundings, a decrease in definition, reflection in the projected image, and the like, and thus displays images with extremely high display quality. The display device 30 does not need a light source, such as a lamp, which is necessary for a projection-type imaging device; thus, power consumption is reduced, there is no danger of heat generation, and the display device 30 is freed of the need to replace light sources. Accordingly, the display device 30 of one embodiment of the present invention can be referred to as a display device with high reliability and a low running cost.

The thickness of each of the plurality of display panels 100 can be, for example, greater than or equal to 10 μm and less than or equal to 5 mm, preferably greater than or equal to 20 μm and less than or equal to 4 mm, further preferably greater than or equal to 30 μm and less than or equal to 3 mm, typically greater than or equal to 40 μm and less than or equal to 1 mm. As the thickness of the display panel 100 becomes small, the display device 30 is made more compact in size. On the other hand, the display panel 100 having too small a thickness might be reduced in mechanical strength. To increase the mechanical strength of the display panel 100 without sacrificing the small thickness and weight, for example, a flexible protection sheet or the like is bonded to each of the display panels 100 so that each of the display panels 100 has a moderate thickness of more than or equal to 0.5 mm and less than or equal to 5 mm in total.

The great decrease in thickness of the display panel 100, the use of a flexible member for the display panels 100, or the like allow the weight of the display panels 100 to be extremely small. The weight of the display panel 100 per display surface area of 100 cm$^2$ can be more than or equal to 0.1 g and less than or equal to 50 g, preferably more than or equal to 0.1 g and less than or equal to 30 g, further preferably more than or equal to 0.1 g and less than or equal to 10 g, still further preferably more than or equal to 0.1 g and less than or equal to 5 g.

Note that the weight of the display panel 100 may denote the weight of the display panel 100 itself (i.e., a portion performing a minimum function of displaying images, such as a pair of substrates including an element and the like). The weight of the display panel 100 may further include the weight of a member for securing the strength of the display panel 100 (e.g., a sheet or a frame), the weight of an FPC, a wiring, a connector, and the like which are electrically connected to the display panel 100. The use of such lightweight display panels 100 allows the weight of the display device 30 to be equal to or less than that of a screen or the like which is used for the projection-type display device.

The use of a plurality of relatively small display panels 100 for the display device achieves high-yield fabrication. If all the display panels 100 are the same in type, the display devices 30 with different sizes of the display regions 31 are easily fabricated by changing the number or arrangement of the display panels 100. As a result, addition of a product category and low-volume production in accordance with the needs of customers becomes easier. The easy customization depending on facilities and location is useful particularly in applying the display device 30 to digital signage or the like. In addition, manufacturers can separately sell the units including the display panel 100 and users can customize the size and shape of the display region 31.

The number of pixels (also referred to as screen resolution) in the display region 31 of the display device 30 is the sum of pixels used for displaying images in the display regions 101 of the display panels 100. To fabricate the display device 30 with a predetermined number of pixels in the display region 31, part of the display region 101 of the display panel 100 which is located on the other side of the display surface may be covered with the display region 101 of the display panel 100 on the display surface side, thereby adjusting the number of pixels in the display region 31 of the display device 30. The display device 30 in which the number of pixels in the display region 31 meets user's demand and specifications is thus provided.

The above is the description of Structure Example 1.

Modification Examples of Structure Example 1

The display device 30 can be formed using a single display panel 100, though the above-described display device 30 is formed using a plurality of display panels 100 to have a large display region 31.

Figure 3A:
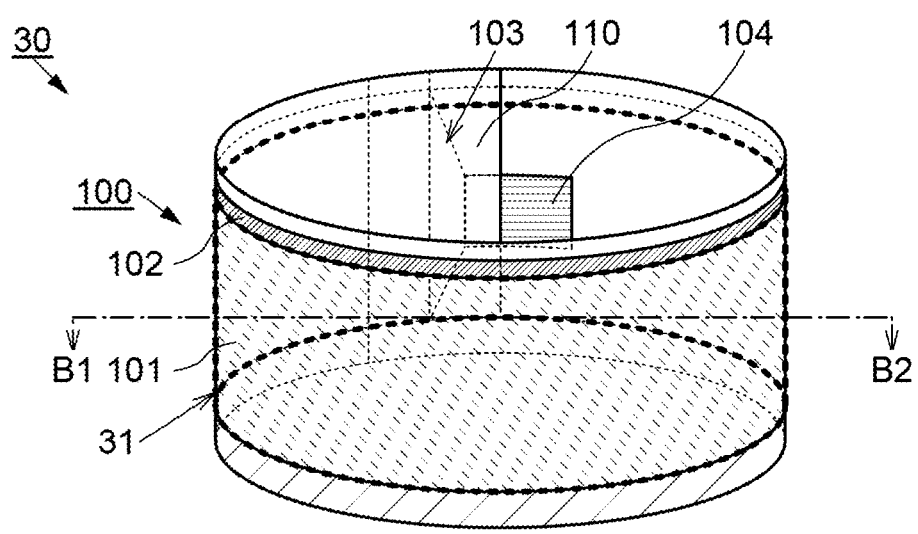
FIGS. 3A and 3B illustrate a structure example of a display device according to one embodiment.
Figure 3B:
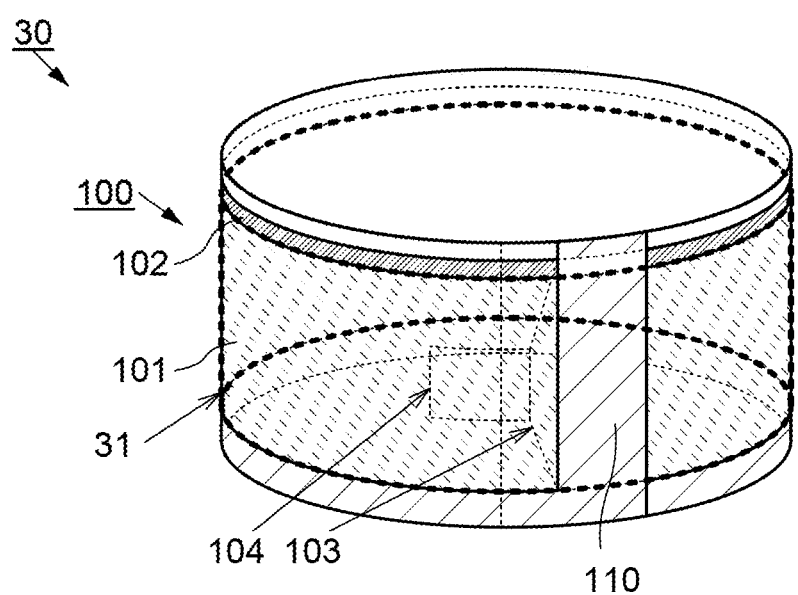

FIGS. 3A and 3B show the display device 30 formed using a single display panel 100. FIG. 3B shows the display device 30 shown in FIG. 3A which is rotated about 180 degrees. FIG. 16B is a schematic cross-sectional view taken along section line B1-B2 in FIG. 3A.

The display panel 100 is curved to form a ring with the display surface facing outward. In addition, part of the region 110 transmitting visible light, which is along one side of the display region 101, covers part of the display region 101 adjacent to the other side of the display region 101.

Part of the display region 101 of the display panel 100 covers the wiring 103, the FPC 104, and the like which are included in the region 120 blocking visible light.

A single display panel 100 having such a structure displays seamless images in the ring-shaped display region 31.

The display device 30 including a single display panel 100 is preferably applied to the following compact devices: wearable devices, such as a ring-type wearable device, a bangle-type wearable device, a watch-type wearable device, a choker-type wearable device, and a headband-type wearable device; table-top devices, such as a digital photo frame.

It is needless to say that the display device 30 including two or more display panels 100 may be applied to these devices.

The above is the description of Modification Example of Structure Example 1.

Structure Example 2

Structure Example 1 describes an example of the display device 30 in which the display panel 100 is curved so that the display surface facing outward can display images outward, whereas Structure Example 2 describes another example of the display device 30 in which the display panel 100 is curved so that the display surface facing inward can display images inward.

Figure 4A:
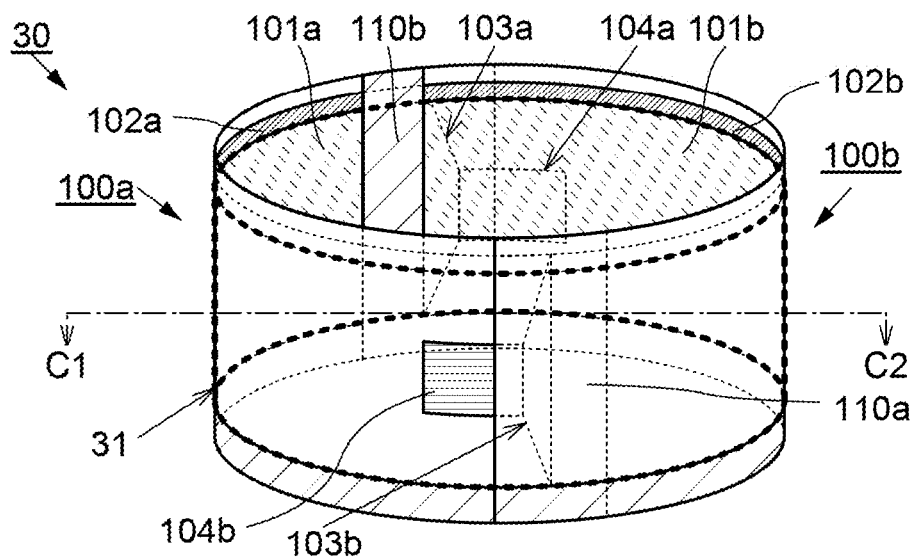
FIGS. 4A and 4B illustrate a structure example of a display device according to one embodiment.
Figure 4B:
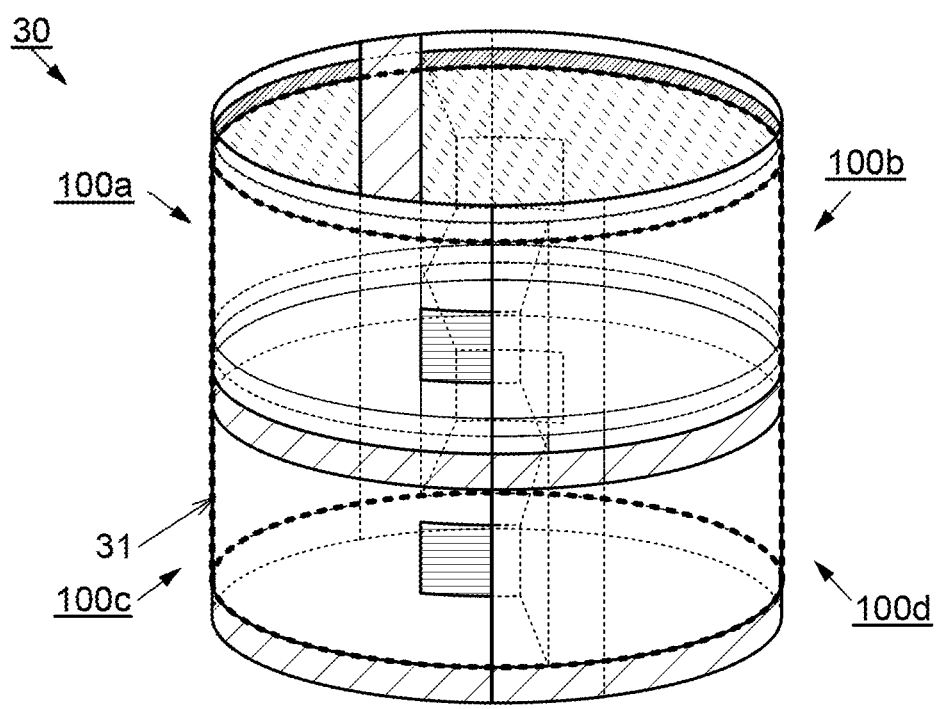

In FIG. 4A, each display surface of the two display panels (the display panel 100a and the display panel 100b in FIG. 1B) faces inward. FIG. 16C is a schematic cross-sectional view taken along section line C1-C2 in FIG. 4A. In FIG. 4B, each display surface of the four display panels (the display panels 100a to 100d in FIG. 1C) faces inward. The structure of the overlapping part of the two adjacent display panels 100 is similar to that in Structure Example 1 except the curve direction of the display panels 100.

Owing to the plurality of display regions 101 disposed seamlessly to form a ring as described above, the display region 31 of the display device 30 displays seamless images inwardly (i.e., to the inside of the ring).

It is preferable that a viewer see an image from the inside of the ring-shaped display device 30, in which case the viewer sees a 360-degree view of the image and feel a highly realistic sensation. In addition, there is no seam in the displayed image, which reduces a sense that the displayed image is a virtual image on the display device 30 and creates a high sense of immersion in the image. Such a display device 30 is thus suitable for the use in virtual reality (VR). When the display device 30 is used for VR, the display device 30 may be provided so that the head of a viewer is surrounded by the display region 101 or may have the display region 101 large enough to let a viewer inside.

In the case where a single large display panel is disposed in front of a viewer and the case where a plurality of display panels is arranged to surround a viewer, for example, the ends of the display panel(s) and the boundary of two adjacent display panels are visible, which leads to a reduction in a sense of reality and immersion. This applies to a head mounted display (HMD) and the like.

In the case where an image is projected along the inside wall using a projector or the like, the image is projected on the curved surface, which leads to problems such as a blur in the image and a reduction in clarity (definition) or luminance of the image depending on the distance between the wall and the projector. However, one embodiment of the present invention displays seamless images surrounding viewers at high definition and luminance, leading to an enhancement of a sense of reality and immersion.

A plurality of viewers inside the display device 30 of one embodiment of the present invention sees the same image to have a shared experience. For example, the display device 30 is preferably used in amusement facilities, such as an amusement park and a game arcade. The display device 30 is applied to exhibition in a planetarium, a museum, an art museum, a science museum, an aquarium, and the like. The display device 30 is also used in simulation facilities of sports, such as winter sports like skiing and marine sports like diving, and in facilities that simulate travel to sightseeing spots, outer space, and the like.

The display device 30 is easily disassembled: the plurality of display panels 100 is easily detached to transfer and build on site, which enables the use in outdoor or indoor events for a limited time.

In addition to the structures shown in FIGS. 4A and 4B, another display panel having a flat or curved display surface may be provided to close one or both of the top opening and the bottom opening. This structure displays images in all directions (on the left, right, top, and bottom) of viewers inside, leading to an enhancement of a sense of reality. In addition, a chair or the like for viewers may be put inside the display device 30.

The above is the description of Structure Example 2.

[Structure Examples of Display Unit]

A structure example of a display unit including a display panel, which is preferably applied to the display devices described above as examples and a display system described later, will be described below.

Figure 5A:
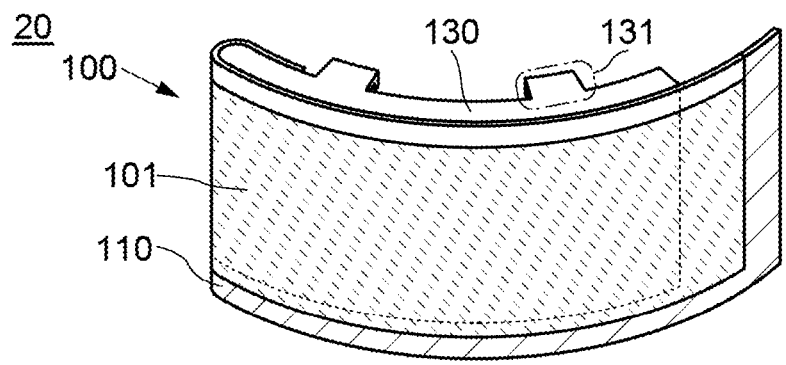
FIGS. 5A and 5B illustrate a structure example of a display unit according to one embodiment.
Figure 5B:
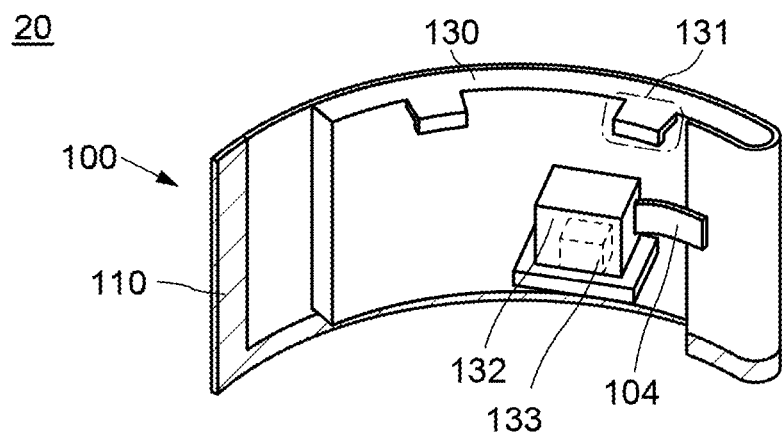

FIGS. 5A and 5B show a structure example of a display unit 20. FIG. 5B shows the display unit 20 in FIG. 5A which is rotated about 180 degrees.

The display unit 20 includes the display panel 100, a support 130, and a driving device 132.

Part of the surface of the support 130 includes a curved surface. The display panel 100 is fixed along the curved surface. Although the display panel 100 in FIGS. 5A and 5B is fixed to the support 130 so that the display surface is curved convexly, it may be fixed to the support 130 so that the display surface is curved concavely as in FIGS. 6A and 6B.

The support 130 and the display panel 100 are preferably fixed detachably using an adhesive whose adhesive strength is low enough to allow them to be detached, an adhesive sheet, a double-sided tape, or the like.

The support 130 has a mechanical strength high enough to hold the shape of the display panel 100. Materials, such as resin, metal, and alloy, can be used, for example. Resin is preferable because the display unit 20 is reduced in weight.

Figure 6A:
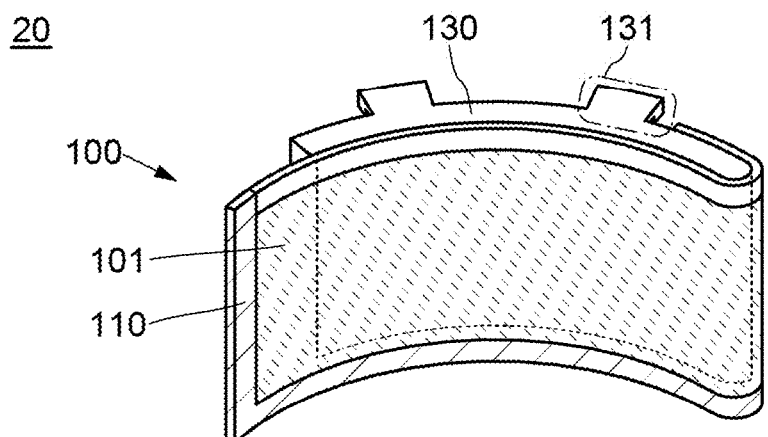
FIGS. 6A to 6C illustrate a structure example of a display unit according to one embodiment.
Figure 6B:
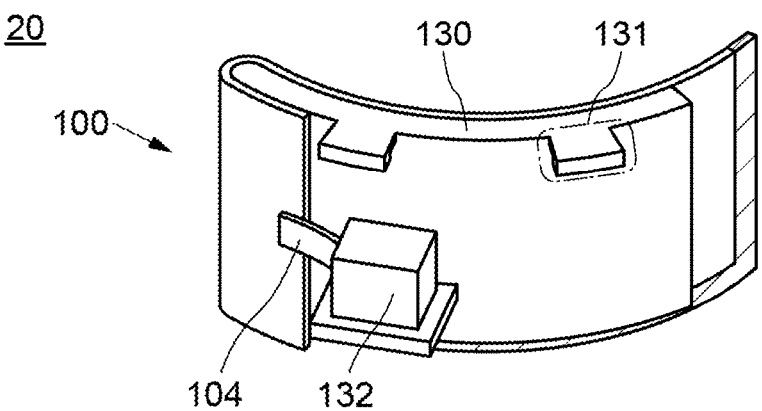

A plastic member may be used so that the surface curvature of the support 130 is freely changed, in which case a mode that the support 130 has a convex surface as in FIGS. 5A and 5B and the like and a mode that the support 130 has a concave surface as in FIGS. 6A and 6B and the like are interchanged. In addition, in that case, it is preferable that the bonding of the display panel 100 be performed after the support 130 is curved at a desired curvature because too much of external force is not applied to the display panel 100.

Part of the end of the support 130 preferably has a surface continuously curved from the surface where the display panel 100 is bonded toward the other surface, in which case the display panel 100 is gently curved along the support 130 toward the other surface of the support 130 (i.e., the surface opposite to the surface where the display panel 100 is bonded) and there is no need to bend part of the display panel 100.

The display panel 100 is preferably fixed to the support 130 so that at least the region 110 transmitting visible light extends beyond the support 130. With the structure, when two display units 20 are arranged, the region 110 of one display panel 100 overlaps the display region 101 of the other display panel 100 with no physical interference between the supports 130.

The display panel 100 is preferably fixed to the support 130 so that at least the region 110 transmitting visible light and part of the display region 101 extends beyond the support 130. With the structure, when two display units 20 are arranged, the part of the display region 101 which extends beyond the support 130 and included in one display panel 100 covers the region 120 blocking visible light and included in the other display panel 100 with no physical interference between the supports 130; thus, the two display regions 101 of the display panels 100 are easily arranged seamlessly.

The support 130 includes an attachment mechanism 131 on a different portion from the surface where the display panel 100 is fixed. Using the attachment mechanism 131, the support 130 is fixed to a frame 151 which is described later. The attachment mechanism 131 in FIGS. 5A and 5B and the like corresponds to part of the support 130 having a claw-like shape. Without limitation thereon, other modes can be employed as the attachment mechanism 131 as long as the support 130 is fixed to the frame 151, such as a mechanism for fixing the support 130 to the frame 150 using a spring, or a structure including a hole in part of the support 130 and a screw or the like for fixing the support 130 and the frame 151 via the hole.

In addition, the attachment mechanism 131 preferably includes a mechanism for adjusting the position of the support 130 after the support 130 is attached to the frame 151, such as a mechanism for adjusting the support 130 in the directions parallel to two orthogonal axes along the curved surface of the support 130. Alternatively, a mechanism for adjusting the support 130 in the following three directions is preferably included: a direction parallel to an axis perpendicular to the two orthogonal axes in addition to the directions parallel to the two orthogonal axes. Further preferably, the attachment mechanism 131 also includes a mechanism for adjusting the rotation angle of the support 130 using the axis perpendicular to the curved surface of the support 130 as a rotation axis. The mechanisms adjusts the positional relationship between the display regions 101 of two adjacent display units 20 if their positional relationship shifts after the display units 20 are fixed to the frame 151, which is described later. Note that such position adjustment mechanisms may be mounted on not the attachment mechanism 131 but the frame 151.

On the side opposite to the side of the support 130 to which the display panel 100 is fixed, the driving device 132 is preferably mounted. Note that there is no positional limitation and the driving device 132 is fixed anywhere except the side of the support 130 to which the display panel 100 is fixed. The display panel 100 is curved so that part thereof is located on the back side of the support 130 to be electrically connected to the driving device 132 through the FPC 104.

The driving device 132 supplies a signal and potential for driving the display panel 100 through the FPC 104. The driving device 132 preferably converts a signal (hereinafter, also referred to as an image signal) containing image data input from an output device 152 which is described later into the signal or potential for driving the display panel 100 and supplies it to the display panel 100. The driving device 132 may be configured to output the signal for driving the display panel 100 by itself without being electrically connected to the output device 152, in which case the image data is stored in a memory device incorporated in the driving device 132 or an external memory device (memory medium), such as a flash memory, storing the image data is connected to the driving device 132, for example.

The driving device 132 may include at least one of an antenna, a wireless receiver, a wireless transmitter, a battery, a printed board (a circuit board), and the like. A printed board mounted with an IC, such as an arithmetic device or a memory device, can be used. In particular, the driving device 132 configured to receive the signal from the output device 152 by wireless communication has a simpler configuration because a cable is not needed.

The driving device 132 may include a power receiving device 133. The display unit may include a power receiving device in addition to the driving device 132, though it is the driving device 132 that includes a power receiving device in the example of this embodiment. A power receiving device in Embodiment 5 can be used for example, though there is no particular limitation thereon. A power receiving device including a resonance coil, a rectifier circuit, a DC-DC converter, and a battery, and a power receiving device using a magnetic resonance method for power feeding can be used as the power receiving device 133, for example. Since the driving device 132 includes the power receiving device, a cable for supplying power to the driving devices is not needed, which leads to simplifying the structure.

Although the driving device 132 in FIG. 5B is mounted on a portion sticking out of the support 130, other structures can be used as long as the positional relationship between the driving device 132 and the support 130 does not shift.

Figure 6C:
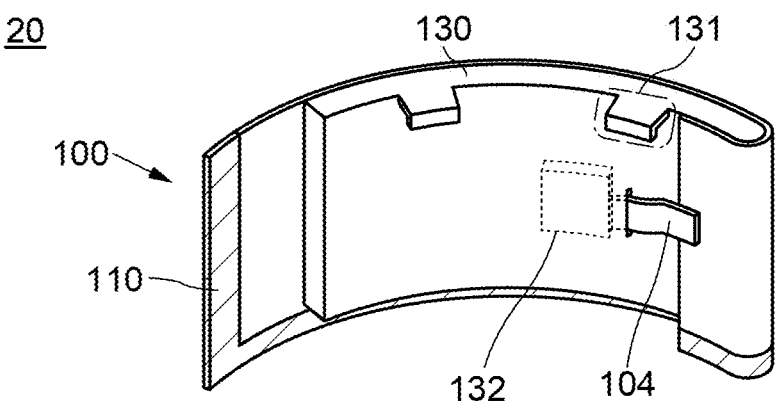

The driving device 132 may be incorporated in the support 130 as shown in FIG. 6C, in which case the FPC 104 is configured to be electrically connected to the driving device 132 through an opening in the support 130. Alternatively, the surface of the support 130 may be provided with a connector electrically connected to the driving device 132, a cable having the connector, or the like, thereto electrically connecting the connector and the FPC 104.

The above is the description of the structure examples of the display unit.

[Structure Examples of Display System]

Structure examples of a display system to which the display unit can be applied will be described.

Figure 7:
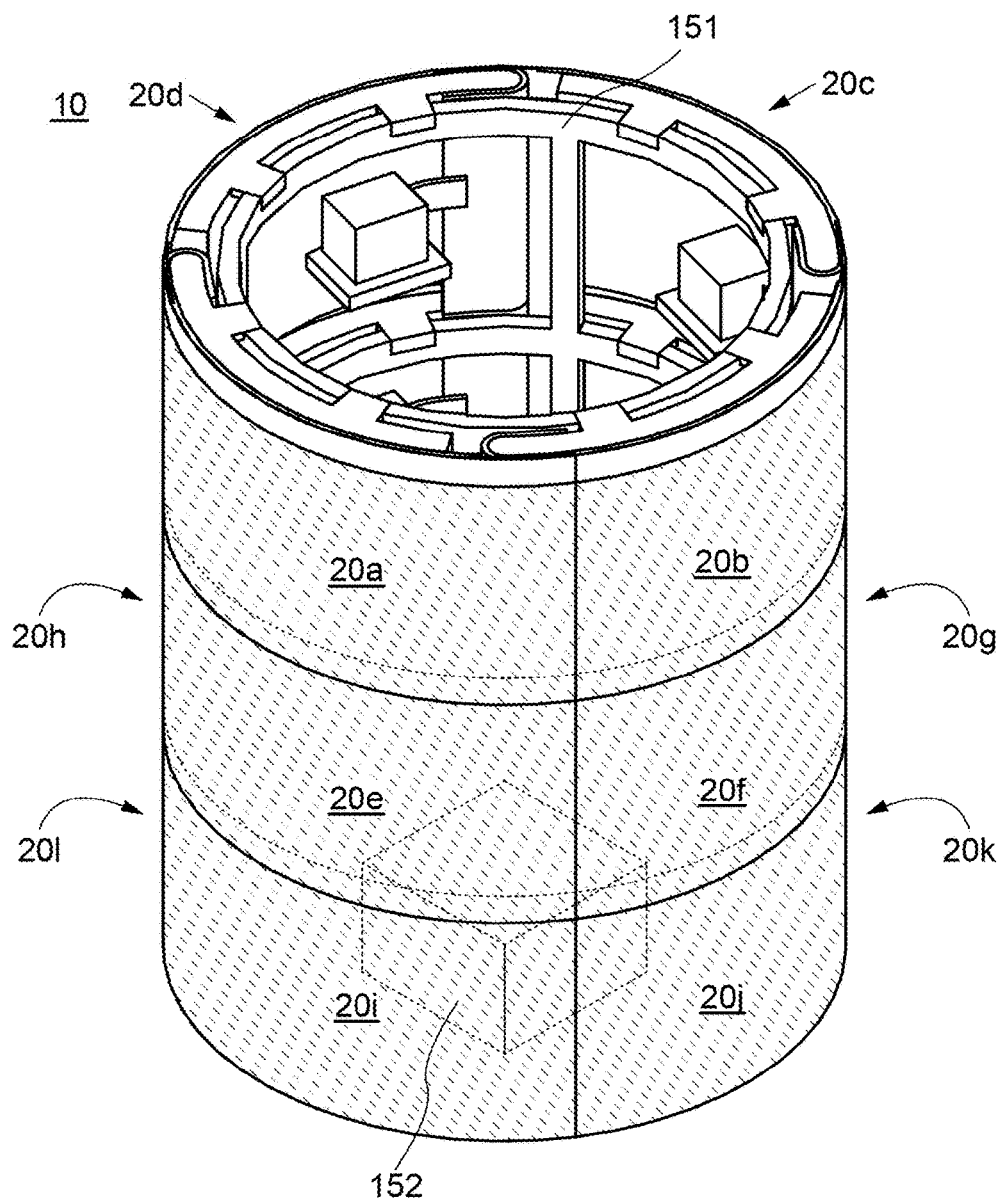
FIG. 7 illustrates a structure example of a display system according to one embodiment.

FIG. 7 shows a display system 10 including a plurality of display units 20 (display units 20a to 20l), the frame 151, and the output device 152.

Figure 8:
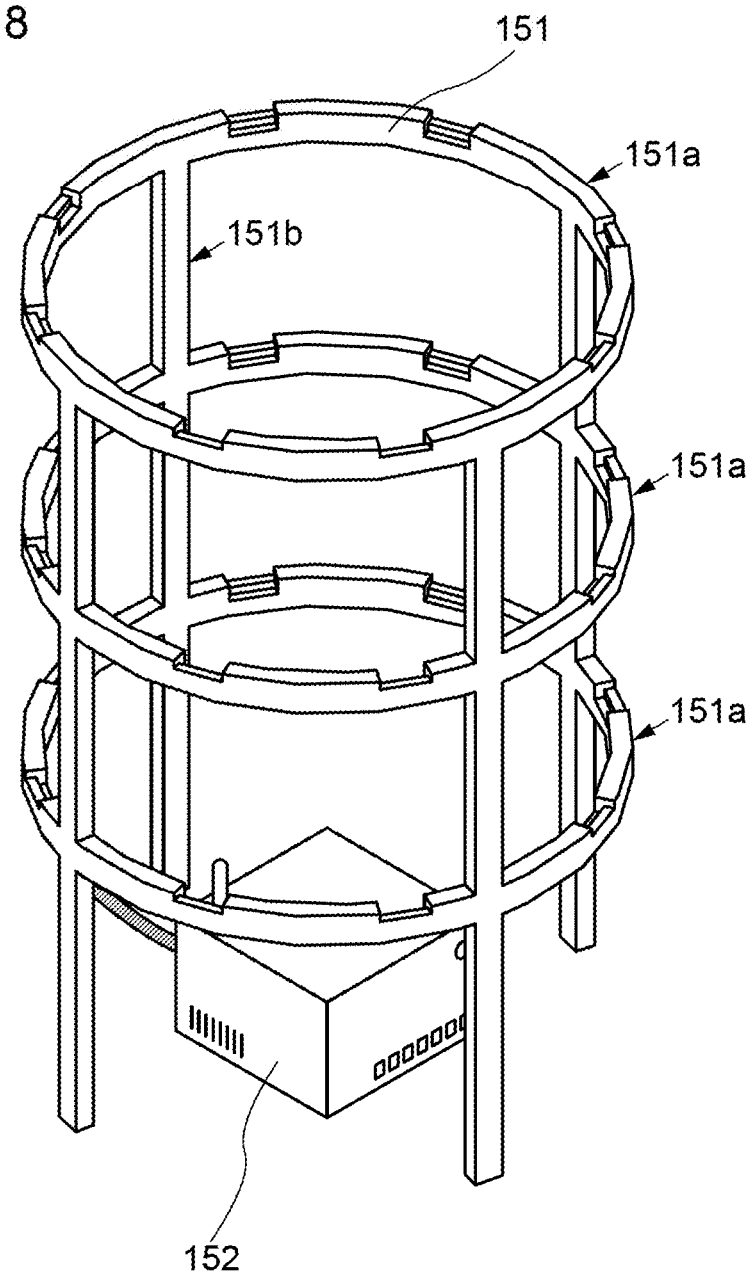
FIG. 8 illustrates a structure example of a frame according to one embodiment.
Figure 9:
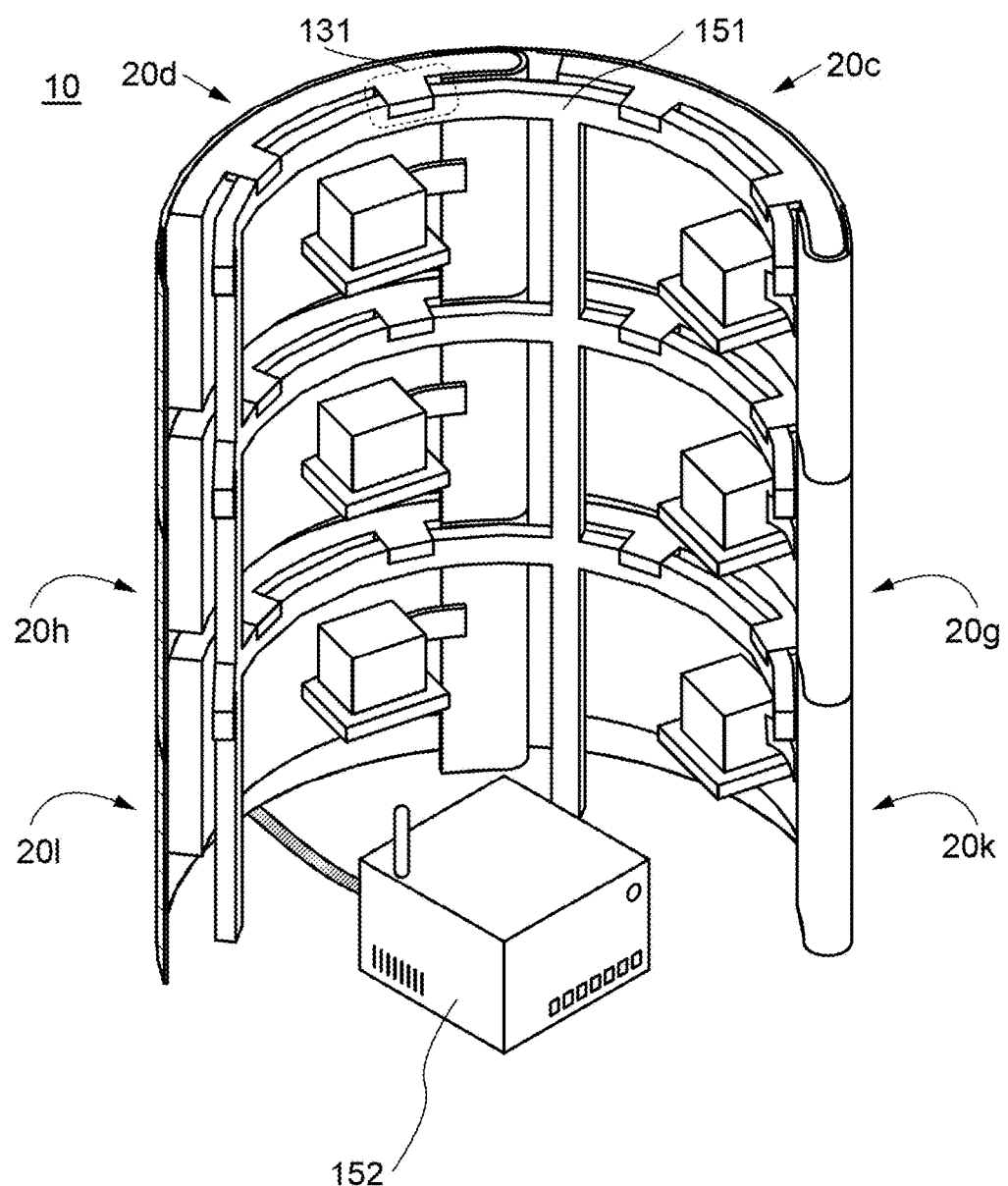
FIG. 9 illustrates a structure example of a display system according to one embodiment.

FIG. 8 shows an external view of the frame 151 and the output device 152. FIG. 9 is a sectional drawing to show the inside of the display system 10 in FIG. 7, in which part of the frame 151 and the like (on the front side in the diagram) are cut.

As shown in FIG. 8, the frame 151 includes a plurality of ring-shaped arms 151a and a plurality of legs 151b supporting the arms 151a at regular intervals. In the case where the plurality of display unit 20 is the same in size, two adjacent arms 151a are preferably disposed at the same intervals.

As shown in FIG. 8 and FIG. 9, each arm 151a is configured to fix the support 130 with the attachment mechanism 131 of the support 130 of the display unit 20. For example, each arm 151a has protrusions or depressions fitting the attachment mechanisms 131. The protrusions or depressions are preferably disposed accurately at regular intervals, which prevents positional shift between the display regions 101 of two adjacent display units 20. As described above, each arm 151a may include a mechanism for adjusting the positional relationship between the frame 151 and the support 130 of the display unit 20.

Each display unit 20 is fixed to the frame 151 detachably so that part of one display panel 100 covers part of another display panel 100 adjacent to the one display panel 100 as shown in FIG. 9. Specifically, each display unit 20 is fixed to the frame 151 detachably so that the region 110 transmitting visible light and included in the one display panel 100 covers part of the display region 101 of the other display panel 100, and the display region 101 of the other display panel 100 overlaps with part of the region 120 blocking visible light and included in the one display panel 100. The structure displays seamless images across the entire display region of the display system 10.

The display unit 20 can be detached from the frame 151; thus, in the case where one display unit 20 malfunctions, only the display unit 20 is replaced easily, which leads to the display system 10 easily maintained and controlled. Furthermore, since the display panel 100 is detached from the display unit 20, only the display panel 100 is replaced and other components can be reused, which leads to a reduction in cost. A manufacturer can sell the display unit 20 to a user in various ways: sell the display unit 20 as a whole, sell only the display panel 100 as a replacement part, or recover the display unit 20 to change only the display panel 100 and then resell the display unit 20.

When the display unit 20 is detached from the frame 181 or when the display unit is attached to the frame 151, the display unit 20 to be detached or attached and the adjacent display units 20 physically interfere with each other sometimes. This is because the display panels 100 of the adjacent display units 20 cover the display unit 20 to be detached or attached. To prevent the physical interference between the display unit 20 to be detached or attached and the display panels of the adjacent display units 20, the display system 10 includes a mechanism for pushing out the display units 20 toward the display surface side when the display unit 20 is detached or attached. Specifically, it is preferable that the frame 151 or the support 130 or the attachment mechanism 131 of each display unit 20 include the mechanisms for pushing out the display units 20 whose display panels 100 cover the display unit 20 to be detached or attached.

The case shown in FIG. 7 and the like is described as an example. In FIG. 7, between two display units 20 stacked vertically, the display panel 100 of the upper display unit 20 covers the lower display unit 20. In replacing a display unit 20, a plurality of display units 20 at the same level as the display unit 20 and a plurality of display units 20 over the display unit 20 are pushed out at the same time toward the display surface side. In the case where the display panel 100 of the lower display units 20 covers the lower display units 20, a plurality of display units 20 under the display unit 20 to be replaced is pushed out.

For example, in replacing the display unit 20a in FIG. 7, the display units 20b, 20d, and 20c are pushed out toward the display surface side. In replacing the display unit 20e, the display units 20f, 20g, 20h, 20a, 20b, 20c, and 20d are pushed out toward the display surface side.

Although the display system 10 includes the mechanism for pushing out the display units 20 from the frame 151 to the display surface side in the example, other mechanisms may be used as long as a display unit 20 to be replaced does not interfere with display panels 100 of display units 20 adjacent to the display unit 20. For example, a mechanism for sliding along the rim of the frame 151 or a mechanism for temporarily detaching the display unit 20 from the display panel 100 may be included. Alternatively, the display unit 20 may be replaced with the frame 151 opened using a mechanism for opening and closing the frame 151 as described later (see FIGS. 12A and 12B and FIGS. 13A and 13B).

The output device 152 outputs an image signal to the driving device 132 of each display unit 20.

The output device 152 is preferably configured to transmit and receive a signal by wireless communication, though the output device 152 may be electrically connected to each driving device 132 by a cable. In addition, when the output device 152 is disposed inside the frame 151 as in FIG. 8 and the like, space is saved.

A reproducing device or a recording/reproducing device for a memory medium such as a flash memory, a Blu-ray Disc, a digital versatile disc (DVD), or the like; or a recording/reproducing device including a memory device, such as a hard disk drive (HDD) or a solid state drive (SSD), can be used as the output device 152. Image data stored in the memory device is output to each display unit 20 as an image signal. Alternatively, the output device 152 is preferably configured to output image data obtained via network to each display unit 20 as the image signal, which leads to ease of displaying the latest data; therefore, this configuration is suitable for digital signage or the like. In addition, the output device 152 is preferably configured to temporarily store data in a memory means included in the output device 152, thereby being capable of displaying images without network connection (offline).

An uncompressed disk recorder (UDR) capable of outputting an image with high resolution, e.g., full high-definition image quality (1920×1080 pixels), 4K (3840×2160 pixels), or 8K (7680×4320 pixels), without compression is preferably used as the output device 152.

The output device 152 is preferably configured to divide and convert image data into a plurality of image signals and output it, thereby displaying one large image in the display region of the display system 10. In addition, there is no need to divide the image data before the image data is input to the output device 152, leading to enhancing the general versatility.

Figure 10:
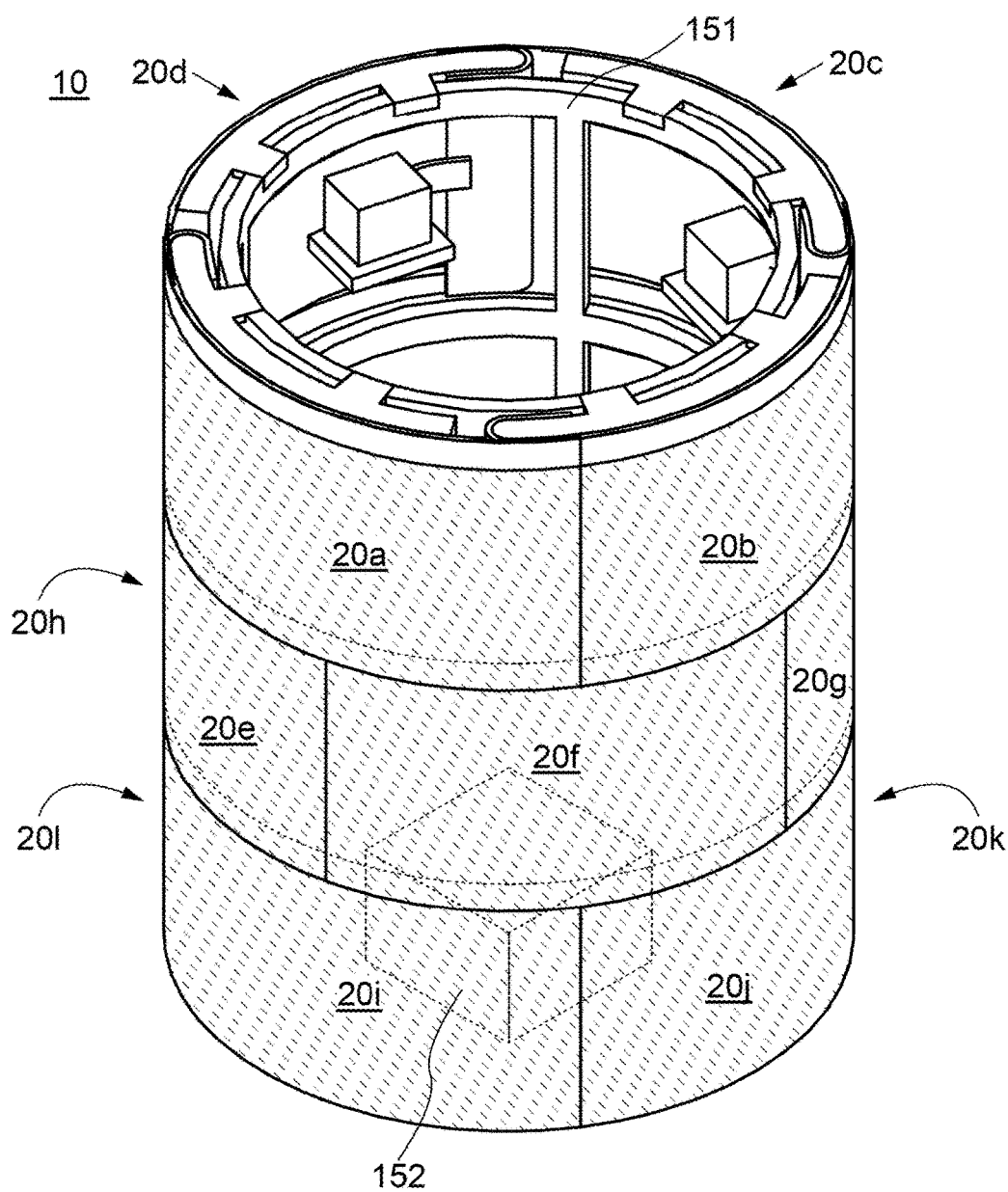
FIG. 10 illustrates a structure example of a display system according to one embodiment.

Although three display units 20 are stacked vertically in the non-limiting structure examples, the number of display units 20 may be one, two, four, or more. In addition, the display units 20 may be stacked zigzag as shown in FIG. 10, though the three display units are stacked and aligned in a row in FIG. 7 and the like.

In the case where the display unit 20 including the display region 101 having a concave surface as shown in FIGS. 6A and 6B is used, the display unit 20 can be disposed inside the frame 151, and the output device 152 can be disposed outside the frame 151 or at the level lower than the frame 151.

Figure 11A:
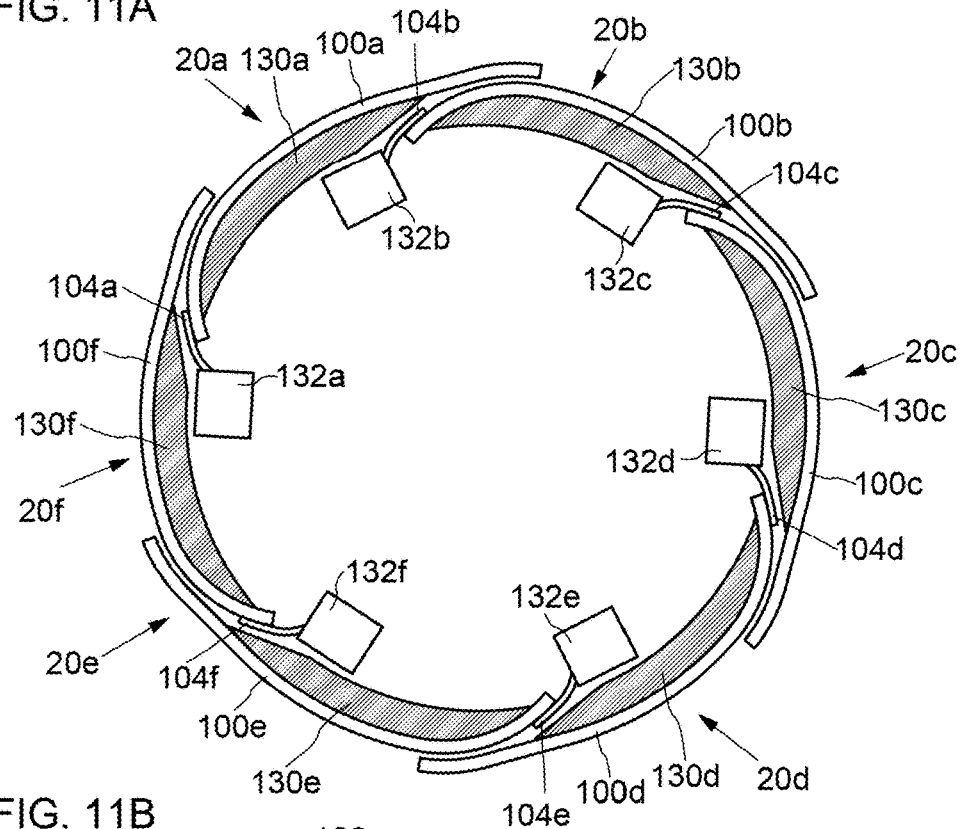
FIGS. 11A and 11B illustrate a structure example of a display system according to one embodiment.

Although four display units 20 are arranged along the rim of the frame 151 so that the four display panels 100 forms a ring in FIG. 7 and the like, the number of display panels is not limited thereto. FIG. 11A is a schematic cross-sectional view in which six display units 20 (display units 20a to 20f) are arranged along the rim of the frame 151 and which is taken along the plane parallel to the arm 151a. In FIG. 11A, six display panels 100a to 100f form a ring.

Figure 11B:
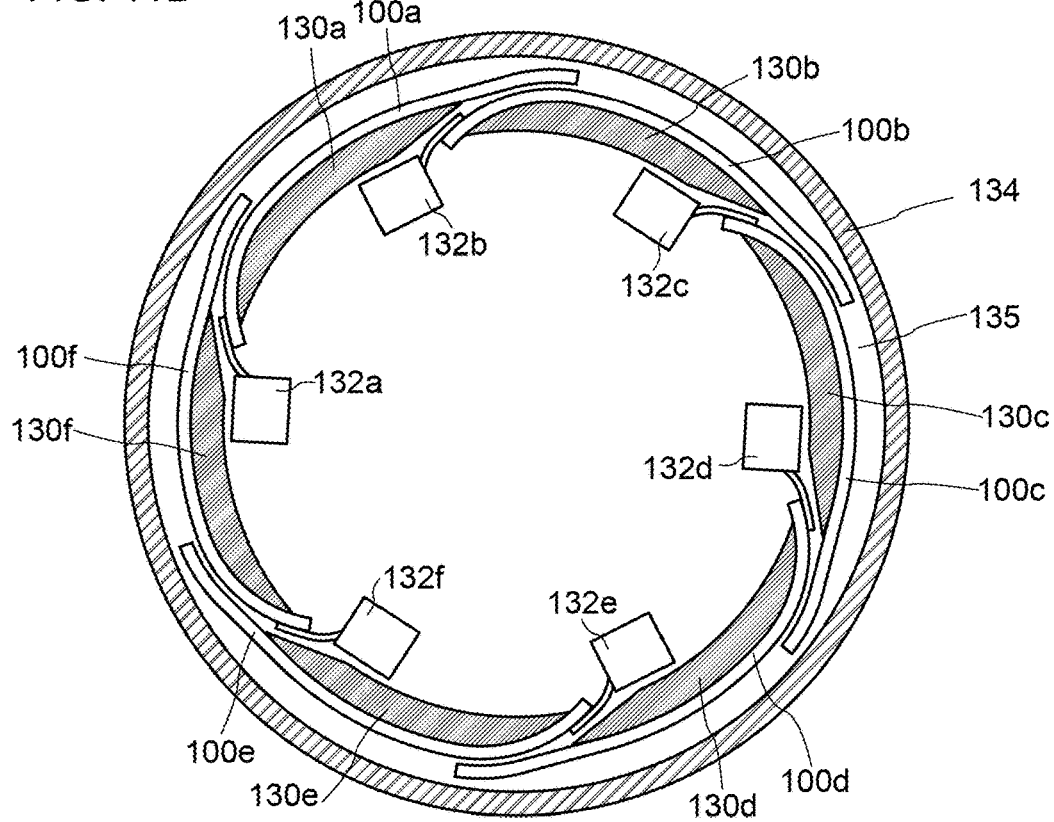

The display system may include a protective member 134 as in FIG. 11B. The protective member 134 is provided outside (on the display surface side) the plurality of display units 20 of the display system so as to surround them. FIG. 11B is an example in which the protective member 134 has a cylindrical shape. For the protective member 134 in a region overlapping with at least the display region in the display panel, a light-transmitting material is used. The protective member 134 in a region other than the region overlapping with the display region may have a light-blocking property so that a region other than the region overlapping with the display region is not visually recognized. As the protective member 134, a glass plate, a plastic plate, such as an acrylic plate or a polyvinyl chloride plate, or the like can be used. A plastic plate in the form of a film or a sheet may be used.

A space 135 between the display unit 20 and the protective member 134 may be filled with gas such as air or may include resin or the like for bonding the display unit 20 with the protective member 134.

The frame 151 preferably includes an opening and closing mechanism, which enables work inside the frame 151 after the display unit 20 is attached to the frame 151.

Figure 12A:
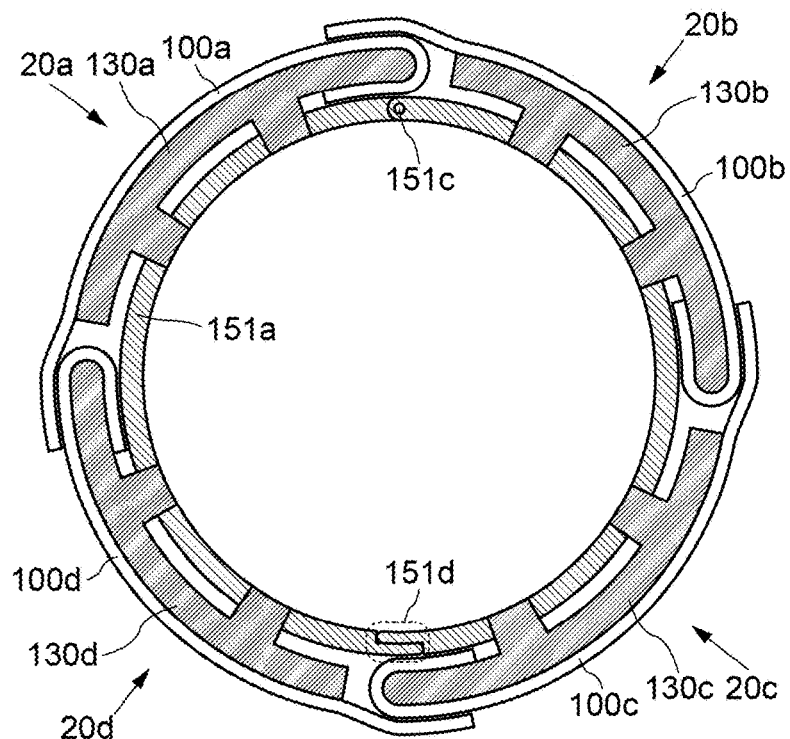
FIGS. 12A and 12B illustrate a structure example of a display system according to one embodiment.
Figure 12B:
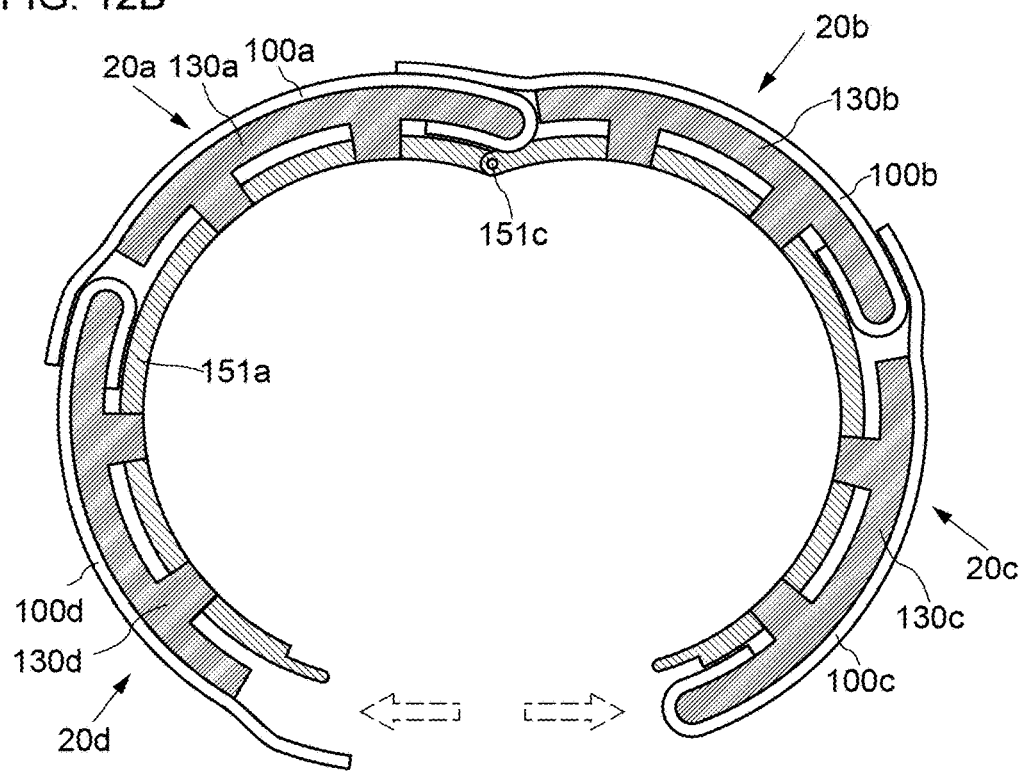

FIGS. 12A and 12B are schematic views of the display system 10 in which the frame 151 includes the opening and closing mechanism, seen from the direction parallel to the leg 151b of the frame 151.

The arm 151a in FIGS. 12A and 12B includes a hinge 151c and a notch 151d. Part of the arm 151a rotates about the hinge 151c, thereby opening the frame 151, that is, changing the frame 151 from the state in FIG. 12A to the state in FIG. 12B.

Although the hinge 151c is opposite to the notch 151d in FIGS. 12A and 12B, the positional relationship between the hinge 151c and the notch 151d shifts, in which case part of the frame 151 can be opened and closed like a door. In the case where such an opening and closing mechanism is provided, a wheel or the like is preferably attached to the leg 151b included in a moving portion of the frame 151 to easily change shapes. Here, the leg 151b included in a non-moving portion of the frame 151 may be fixed to the ground or the like.

Figure 13A:
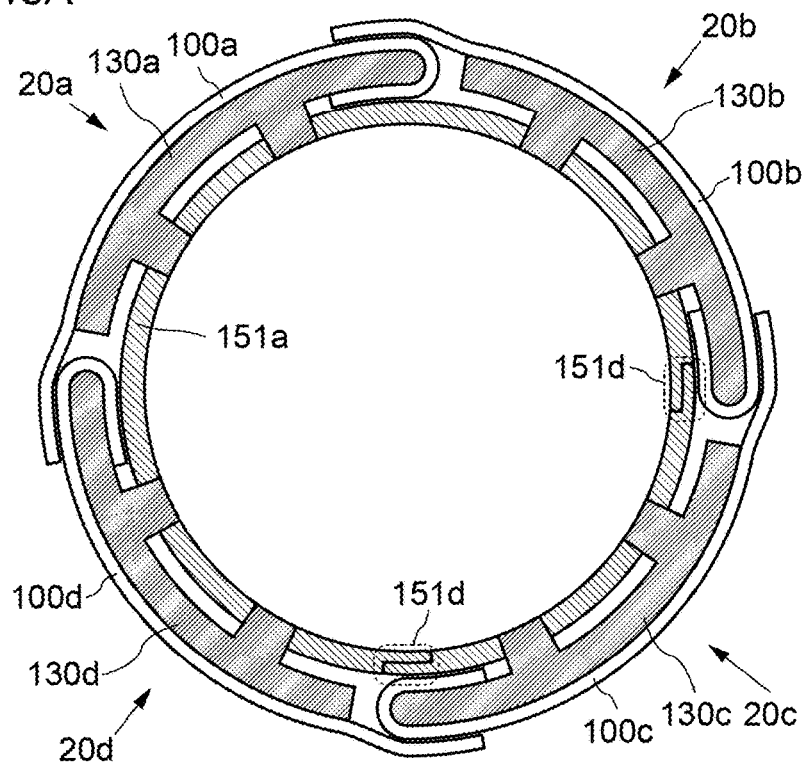
FIGS. 13A and 13B illustrate a structure example of a display system according to one embodiment.
Figure 13B:
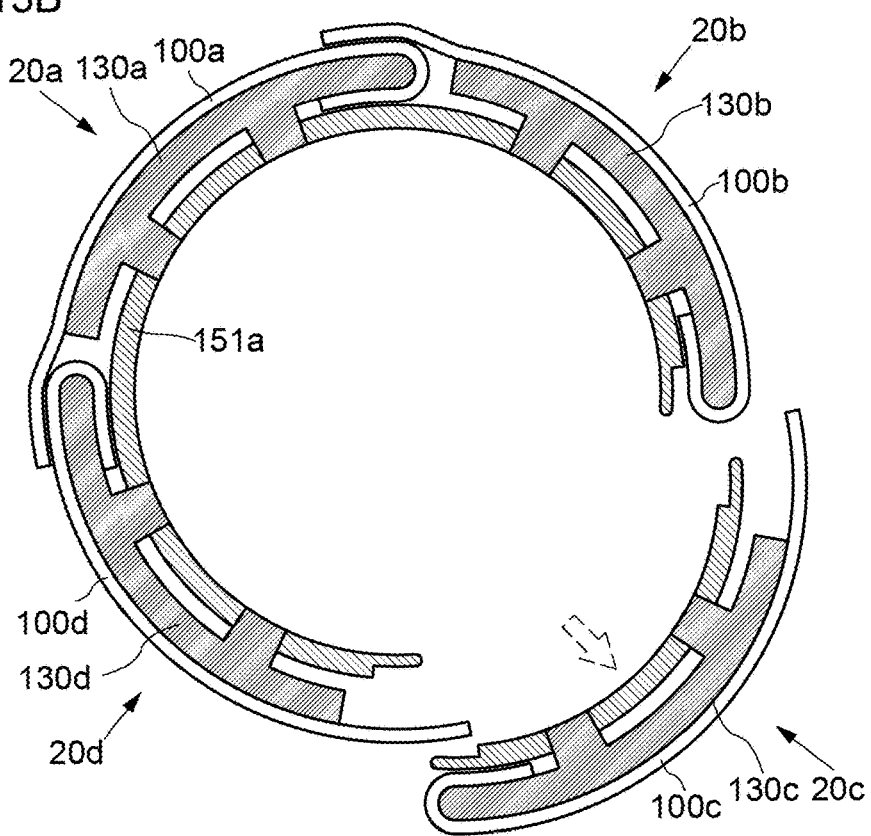

In FIGS. 13A and 13B, the arm 151a of the frame 151 includes two notches. With such a structure, part of the frame 151 is detached as shown in the state in FIG. 13B from the state in FIG. 13A.

Although the system for displaying images in the state where a plurality of display panels forms a ring is described so far, depending on the place to use the system, the system may be configured to display images in the state where a plurality of display panels does not form a ring. In other words, the system may be configured to display images along the curved surface or the flat surface.

[Usage Examples of Display System]

Next, usage examples of the display system of one embodiment of the present invention are described. FIGS. 14A to 14D are block diagrams showing the usage examples of the display system.

Figure 14A:
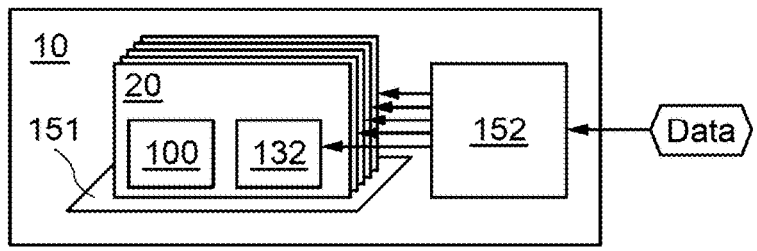
FIGS. 14A to 14D illustrate a structure example of a display system according to one embodiment.

The display system 10 in FIG. 14A includes the plurality of display units 20 attached to the frame 151 and the output device 152. Each display unit 20 includes the display panel 100 and the driving device 132.

The output device 152 outputs an image signal to each driving device 132 of the display units 20, thereby displaying an image on each display panel 100 of the display units 20. A user can display an image on the plurality of display panels 100 in real time by supplying image data (Data) that the user wants to display to the output device 152. In addition, a user can receive broadcasts on the public airwaves or the Internet by a television receiver, a modem, or the like to supply them as image data to the output device 152.

Figure 14B:
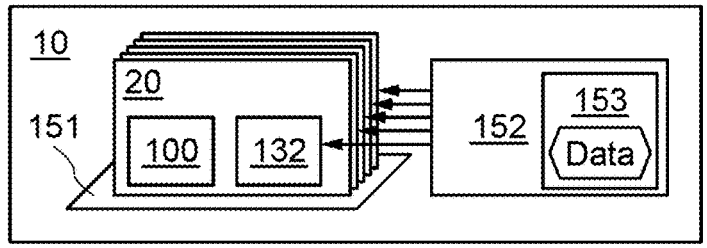

The output device 152 includes a memory device 153 in FIG. 14B. The memory device 153 stores image data. The output device 152 outputs an image signal in accordance with the image data to display an image on each display panel 100 of the display units 20. A user can display different images on the plurality of display panels 100 by updating the image data stored in the memory device 153 on a regular basis.

Figure 14C:
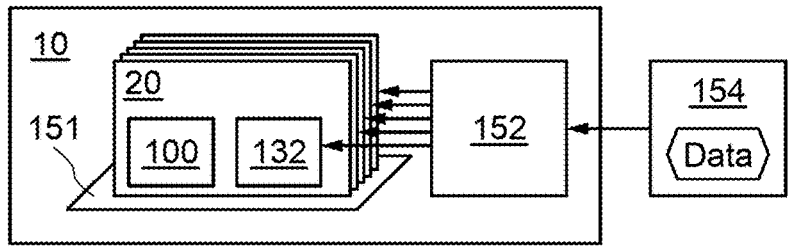

The output device 152 is connected to an external memory device 154 in FIG. 14C, in which case the output device 152 reads image data stored in the external memory device 154 to output an image signal. A user can display another image on the plurality of display panels 100 by replacing the external memory device 154 or updating the image data stored in the external memory device 154.

As the external memory device 154, a memory device which is connected to and disconnected from the output device 152 with a connector, such as an HDD or an SSD; or a memory media, such as a flash memory, a Blu-ray Disc, or a DVD can be used.

Figure 14D:
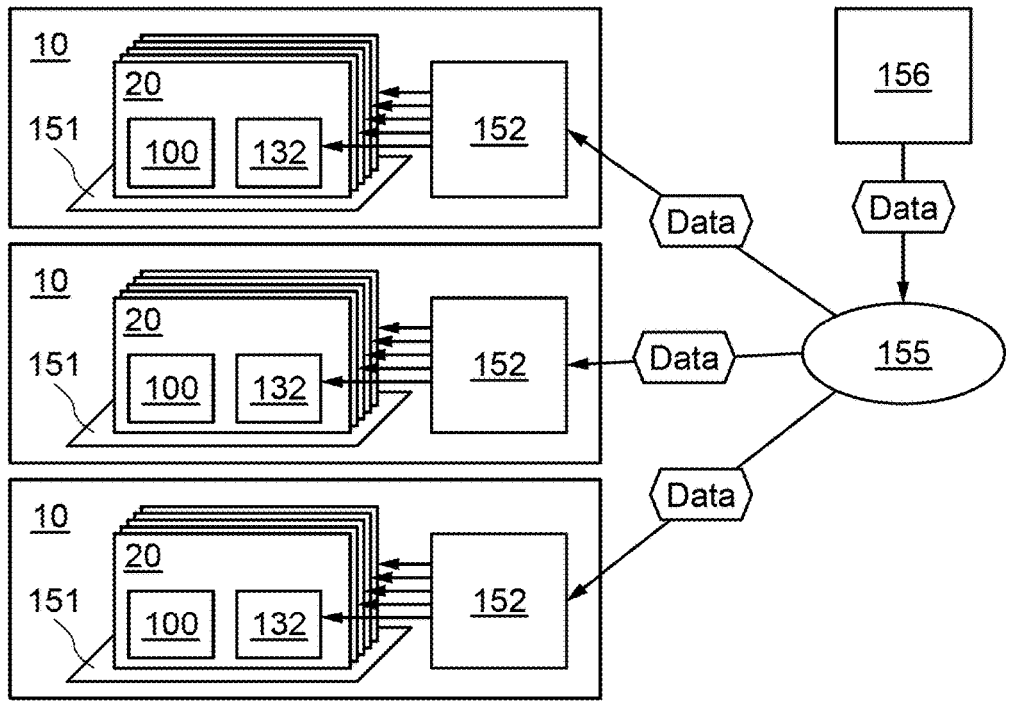

FIG. 14D is an example using the Internet 155 and a server 156. The server 156 distributes image data to the output device 152 on the Internet 155. In addition, the plurality of display systems 10 is connected to the Internet 155, so that the sever 156 controls the plurality of display systems 10 as a lump and continuous updates are provided as well.

Such a usage is particularly effective for displaying the same data on all the plurality of display systems 10: for example, huge commercial facilities; public facilities, such as an airport or a hospital; vehicles on public transportation, such as a railway or a bus line; an information service display operated by a municipality; and a chain-style business for wide-ranging store development.

Note that the output device 152 may include the memory device 153 in FIGS. 14C and 14D. If the memory device 153 is provided in FIG. 14C, the display system 10 displays images by itself without the external memory device 154. In addition, if the memory device 153 is provided in FIG. 14D, the display system 10 displays images by itself without connection to the Internet 155 (offline).

The display system of one embodiment of the present invention displays a seamless image along the inside or outside of the ring, which allows a viewer to get information from every direction. Furthermore, the display system attracts more attention than a conventional display device configured to display images on the flat surface. Therefore, the display system of one embodiment of the present invention is particularly useful when used for advertising, providing information in disaster situations, or the like.

The above is the description of the usage examples of the display system.

At least part of this embodiment can be implemented in combination with any of the embodiments described in this specification as appropriate.

Embodiment 2

In this embodiment, structure examples and application examples of a display device of one embodiment of the present invention are described with reference to drawings.

Structure Example 1

Figure 15A:
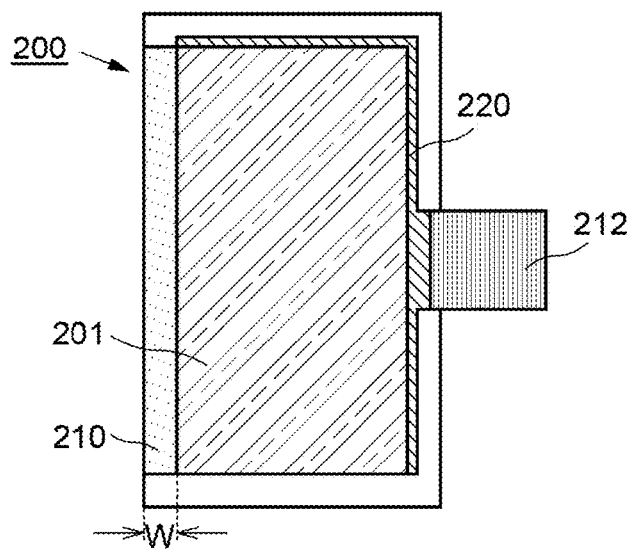
FIGS. 15A and 15B illustrate a structure example of a display device according to one embodiment.

FIG. 15A is a schematic top view of a display panel 200 included in a display device of one embodiment of the present invention.

The display panel 200 includes a display region 201, and a region 210 transmitting visible light and a region 220 blocking visible light that are adjacent to the display region 201. Furthermore, the display panel 200 is provided with an FPC 212 in the example illustrated in FIG. 15A.

The display region 201 includes a plurality of pixels arranged in matrix and displays an image. One or more display elements are provided in each pixel. As the display element, typically, a light-emitting element such as an organic EL element, a liquid crystal element, or the like can be used.

In the region 210, for example, a pair of substrates included in the display panel 200, a sealant for sealing the display element sandwiched between the pair of substrates, and the like may be provided. Here, for members provided in the region 210, materials that transmit visible light are used.

In the region 220, for example, a wiring electrically connected to the pixels included in the display region 201 is provided. In addition to the wiring, driver circuits (such as a scan line driver circuit and a signal line driver circuit) for driving the pixels may be provided. Furthermore, in the region 220, a terminal electrically connected to the FPC 212 (also referred to as a connection terminal), a wiring electrically connected to the terminal, and the like may be provided.

Figure 15B:
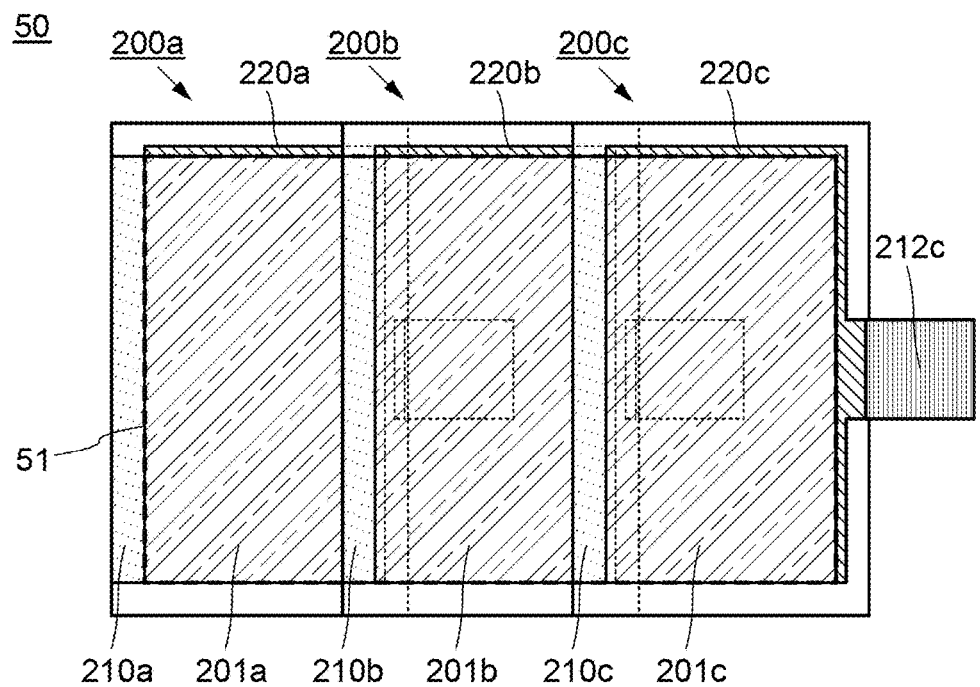

A display device 50 of one embodiment of the present invention includes a plurality of such display panels 200. FIG. 15B is a schematic top view of the display device 50 including three display panels.

Hereinafter, to distinguish the display panels from each other, the same components included in the display panels from each other, or the same components relating to the display panels from each other, letters are added to reference numerals. Unless otherwise specified, "a" is added to reference numerals for a display panel and components placed on the lowest side (the side opposite to the display surface side), and to one or more display panels and components placed thereover, "b" or letters after "b" in alphabetical order are added from the lower side. Furthermore, unless otherwise specified, in describing a structure in which a plurality of display panels is included, letters are not added when a common part of the display panels or the components is described.

The display device 50 in FIG. 15B includes a display panel 200a, a display panel 200b, and a display panel 200c.

The display panel 200b is placed so that part of the display panel 200b overlaps an upper side (a display surface side) of the display panel 200a. Specifically, the display panel 200b is placed so that a region 210b transmitting visible light of the display panel 200b overlaps part of a display region 201a of the display panel 200a, and the display region 201a of the display panel 200a and a region 220b blocking visible light of the display panel 200b do not overlap each other.

Furthermore, the display panel 200c is placed so that part of the display panel 200c overlaps an upper side (a display surface side) of the display panel 200b. Specifically, the display panel 200c is placed so that a region 210c transmitting visible light of the display panel 200c overlaps part of a display region 201b of the display panel 200b, and the display region 201b of the display panel 200b and a region 220c blocking visible light of the display panel 200c do not overlap each other.

The region 210b transmitting visible light overlaps the display region 201a; thus, the whole display region 201a is visually recognized from the display surface side. Similarly, the whole display region 201b is also visually recognized from the display surface side when the region 210c overlaps the display region 201b. Therefore, a region where the display region 201a, the display region 201b, and the display region 201c are placed seamlessly (a region surrounded by a bold dashed line in FIG. 15B) can serve as a display region 51 of the display device 50.

Here, the width W of the region 210 in FIG. 15A is greater than or equal to 0.5 mm and less than or equal to 150 mm, preferably greater than or equal to 1 mm and less than or equal to 100 mm, and further preferably greater than or equal to 2 mm and less than or equal to 50 mm. The region 210 serves as a sealing region, and as the width W of the region 210 is larger, the distance between an end surface of the display panel 200 and the display region 201 can become longer, so that entry of an impurity such as water into the display region 201 from the outside is effectively suppressed. In particular, in this structure example, the region 210 is provided adjacent to the display region 201; thus, it is important to set the width W of the region 210 at an appropriate value. For example, in the case where an organic EL element is used as the display element, the width W of the region 210 is set to be greater than or equal to 1 mm, whereby deterioration of the organic EL element is effectively suppressed. Note that also in a part other than the region 210, the distance between the end portion of the display region 201 and the end surface of the display panel 200 is preferably in the above range.

Structure Example 2

In FIG. 15B, the plurality of display panels 200 overlap each other in one direction; however, a plurality of display panels 200 may overlap each other in two directions of the vertical and horizontal directions.

Figure 16A:
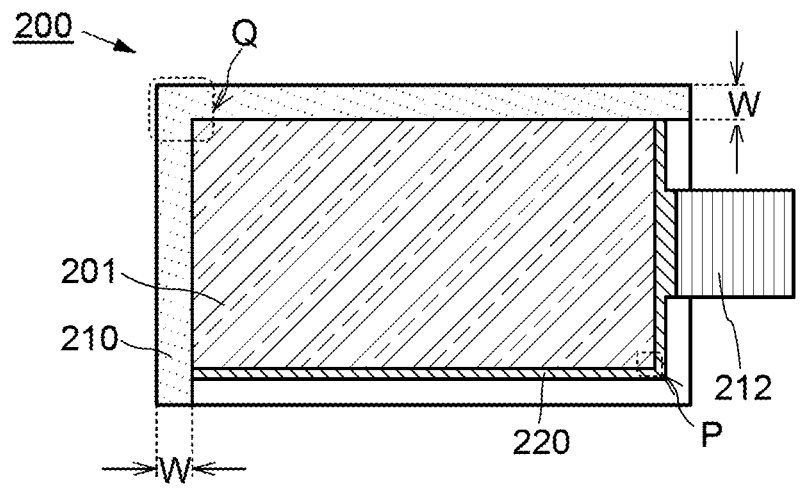
FIGS. 16A to 16C illustrate a structure example of a display device according to one embodiment.
Figure 16B:
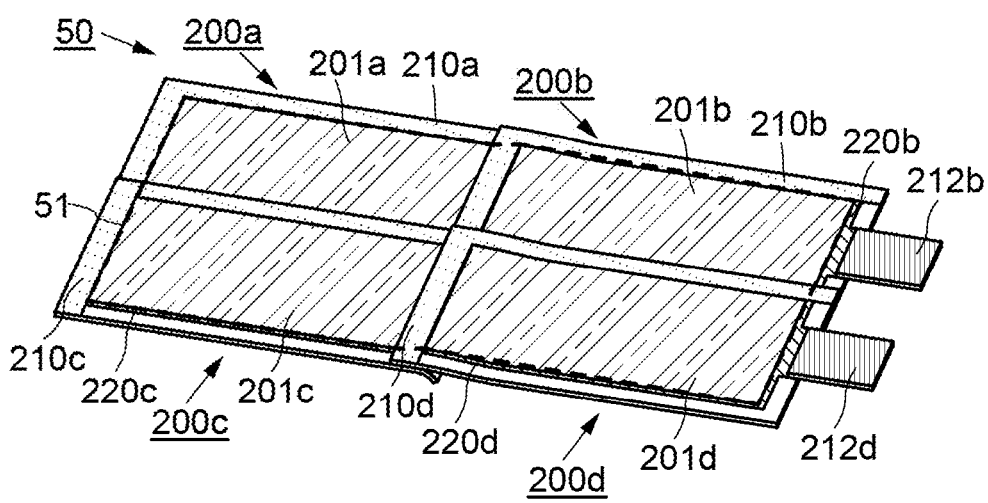
Figure 16C:
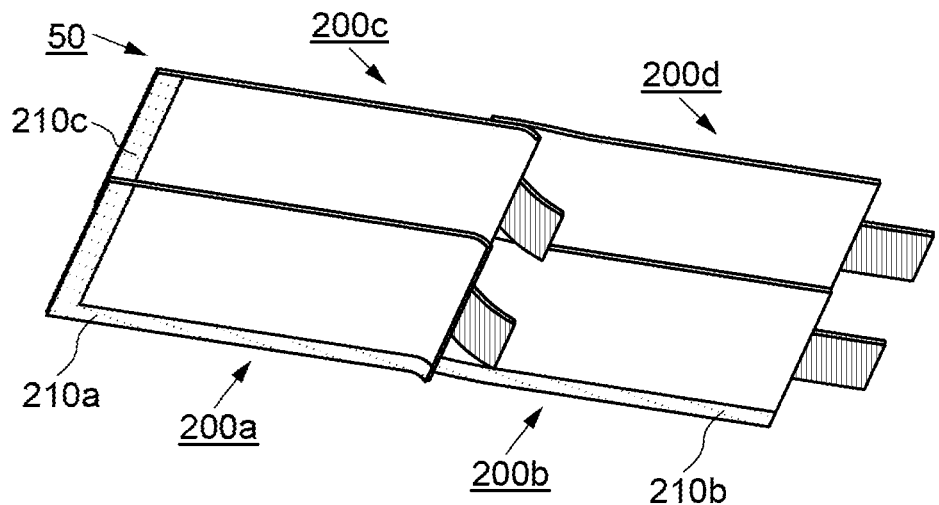

FIG. 16A shows an example of the display panel 200 in which the shape of the region 210 is different from that in FIG. 15A. In the display panel 200 in FIG. 16A, the region 210 is placed along adjacent two sides of the display region 201.

FIG. 16B is a schematic perspective view of the display device 50 in which the display panels 200 in FIG. 16A are arranged two by two in both vertical and horizontal directions. FIG. 16C is a schematic perspective view of the display device 50 when seen from a side opposite to the display surface side.

In FIGS. 16B and 16C, part of the region 210b of the display panel 200b overlaps a region along a short side of the display region 201a of the display panel 200a. In addition, part of the region 210c of the display panel 200c overlaps a region along a long side of the display region 201a of the display panel 200a. Moreover, the region 210d of the display panel 200d overlaps both a region along a long side of the display region 201b of the display panel 200b and a region along a short side of the display region 201c of the display panel 200c.

Therefore, as illustrated in FIG. 16B, a region where the display region 201a, the display region 201b, the display region 201c, and the display region 201d are placed seamlessly can serve as the display region 51 of the display device 50.

Here, it is preferable that a flexible material be used for the pair of substrates included in the display panel 200 and the display panel 200 have flexibility. Thus, as is the case of the display panel 200a in FIGS. 16B and 16C, part of the display panel 200a on the FPC 212a side is curved when the FPC 212a and the like are provided on the display surface side, whereby the FPC 212a is placed under the display region 201b of the adjacent display panel 200b so as to overlap with the display region 201b, for example. As a result, the FPC 212a is placed without physical interference with the rear surface of the display panel 200b. Furthermore, when the display panel 200a and the display panel 200b overlap and are bonded to each other, it is not necessary to consider the thickness of the FPC 212a; thus, the difference in height between the top surface of the region 210b of the display panel 200b and the top surface of the display region 201a of the display panel 200a is reduced. As a result, the end portion over the display region 201a of the display panel 200b is prevented from being visually recognized.

Moreover, each display panel 200 has flexibility, whereby the display panel 200b is curved gently so that the top surface of the display region 201b of the display panel 200b and the top surface of the display region 201a of the display panel 200a are equal to each other in height. Thus, the heights of the display regions can be equal to each other except in the vicinity of the region where the display panel 200a and the display panel 200b overlap each other, so that the display quality of an image displayed on the display region 51 of the display device 50 is improved.

Although, the relation between the display panel 200a and the display panel 200b is taken as an example in the above description, the same applies to the relation between any two adjacent display panels.

Furthermore, to reduce the step between two adjacent display panels 200, the thickness of the display panel 200 is preferably small. For example, the thickness of the display panel 200 is preferably less than or equal to 1 mm, further preferably less than or equal to 300 μm, still further preferably less than or equal to 100 μm.

Figure 17A:
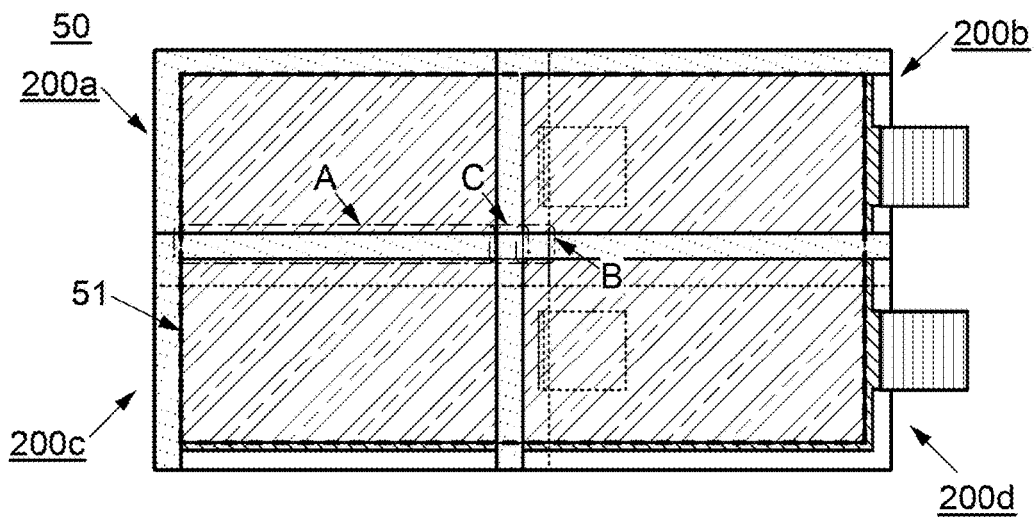
FIGS. 17A and 17B illustrate a structure example of a display device according to one embodiment.

FIG. 17A is a schematic top view of the display device 50 in FIGS. 16B and 16C when seen from the display surface side.

Here, when the region 210 of one display panel 200 does not have sufficiently high transmittance with respect to visible light (e.g., light with a wavelength of greater than or equal to 400 nm and less than or equal to 700 nm), luminance of a displayed image may be decreased depending on the number of display panels 200 overlapping the display regions 201. For example, in a region A in FIG. 17A, one display panel 200c overlaps the display region 201a of the display panel 200a. In a region B, the two display panels 200 (the display panels 200c and 200d) overlap the display region 201b of the display panel 200b. In a region C, the three display panels 200 (the display panels 200b, 200c and 200d) overlap the display region 201a of the display panel 200a.

In this case, it is preferable that data of the displayed image be corrected so that the gray scale of the pixels is locally increased depending on the number of display panels 200 overlapping the display regions 201. In this manner, a decrease in the display quality of the image displayed on the display region 51 of the display device 50 is suppressed.

Alternatively, the position of the display panel 200 placed in the upper portion may be shifted, whereby the number of display panels 200 overlapping the display regions 201 of the lower display panels 200 is reduced.

Figure 17B:
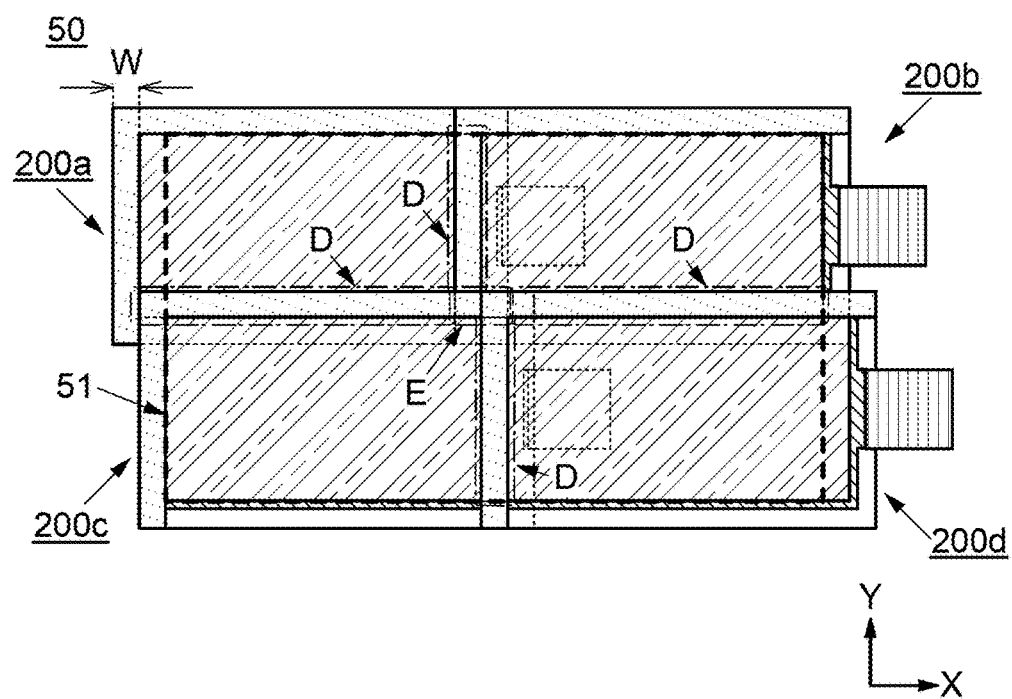

In FIG. 17B, the display panel 200c and the display panel 200d placed on the display panel 200a and the display panel 200b are relatively shifted in one direction (X direction) by the distance of the width W of the region 210. At this time, there are two kinds of regions: a region D in which one display panel 200 overlaps a display region 201 of another display panel 200, and a region E in which two display panels 200 overlap a display region 201 of another display panel 200.

Note that the display panel may be relatively shifted in a direction perpendicular to the X direction (Y direction).

In the case where the display panel 200 placed in the upper portion is relatively shifted, the shape of the contour of a region in which the display regions 201 of the display panels 200 are combined is different from a rectangular shape. Thus, in the case where the shape of the display region 51 of the display device 50 is set to a rectangular shape as illustrated in FIG. 17B, the display device 50 may be driven so that no image is displayed on the display regions 201 of the display panels 200 that are placed outside the display region 51. Here, considering the number of pixels in a region where an image is not displayed, more pixels than the number obtained by dividing the number of all the pixels in the rectangular display region 51 by the number of display panels 200 may be provided in the display region 201 of the display panel 200.

Although the distance of relative shift of each display panel 200 is set to an integral multiple of the width W of the region 210 in the above example, the distance is not limited thereto, and may be set as appropriate in consideration of the shape of the display panel 200, the shape of the display region 51 of the display device 50, in which the display panels 200 are combined, and the like.

[Cross-Sectional Structure Example]

Figure 18A:
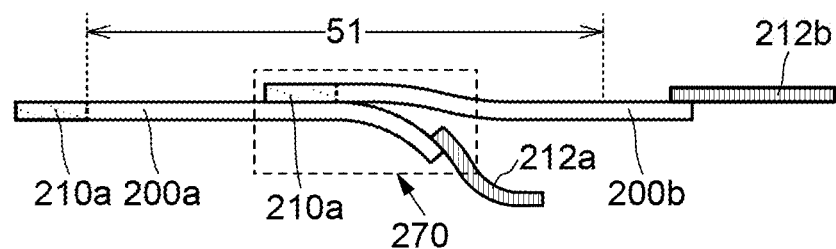
FIGS. 18A to 18D illustrate a structure example of a display device according to one embodiment.

FIG. 18A is a schematic cross-sectional view when the two display panels 200 are bonded to each other. In FIG. 18A, the FPC 212a and an FPC 212b are connected to the display panel 200a and the display panel 200b on the display surface side, respectively.

Figure 18B:
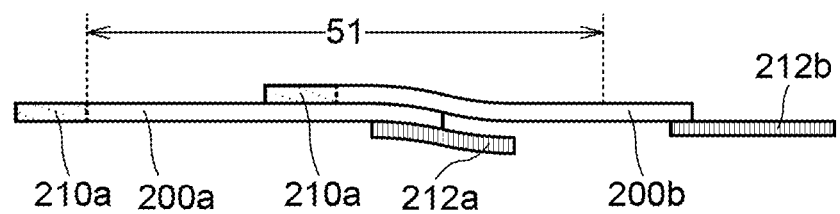

Alternatively, as illustrated in FIG. 18B, the FPC 212a and the FPC 212b may be connected to the display panel 200a and the display panel 200b on a side opposite to the display surface side, respectively. With this structure, the end portion of the display panel 200a positioned on the lower side is attached to the rear surface of the display panel 200b; thus, the attachment area and the mechanical strength of the attached portion are increased.

Figure 18C:
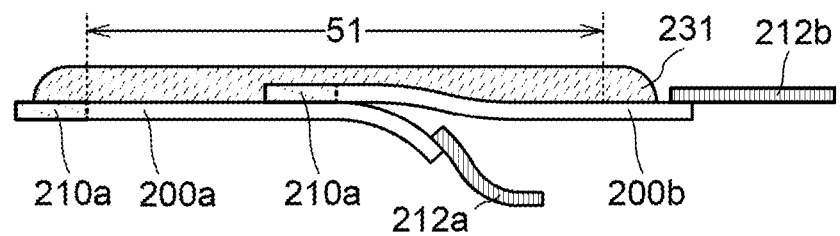
Figure 18D:
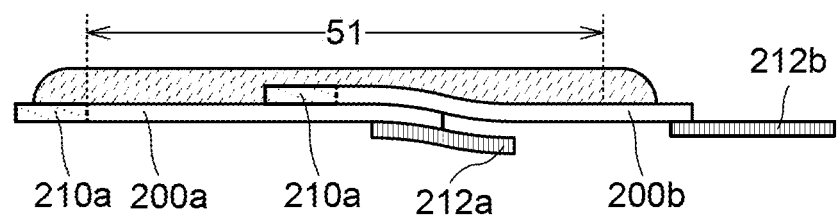

Alternatively, as illustrated in FIGS. 18C and 18D, a light-transmitting resin layer 231 may be provided to cover the top surfaces of the display panel 200a and the display panel 200b. Specifically, the resin layer 231 is preferably provided to cover the display regions of the display panels 200a and 200b and a region where the display panel 200a and the display panel 200b overlap.

By providing the resin layer 231 over the plurality of display panels 200, the mechanical strength of the display device 50 can be increased. In addition, the resin layer 231 is formed to have a flat surface, whereby the display quality of an image displayed on the display region 51 can be increased. For example, when a coating apparatus such as a slit coater, a curtain coater, a gravure coater, a roll coater, or a spin coater is used, the resin layer 231 with high flatness can be formed.

Furthermore, a difference in refractive index between the resin layer 231 and the substrate on the display surface side of the display panel 200 is preferably less than or equal to 20%, further preferably less than or equal to 10%, still further preferably less than or equal to 5%. By using the resin layer 231 having such a refractive index, the refractive index difference between the display panel 200 and the resin can be reduced and light can be efficiently extracted outside. In addition, the resin layer 231 with such a refractive index is provided to cover a step portion between the display panel 200a and the display panel 200b, whereby the step portion is not easily recognized visually, and the display quality of an image displayed on the display region 51 of the display device 50 can be increased.

As a material used for the resin layer 231, for example, an organic resin such as an epoxy resin, an aramid resin, an acrylic resin, a polyimide resin, a polyamide resin, or a polyamide-imide resin can be used.

Figure 19A:
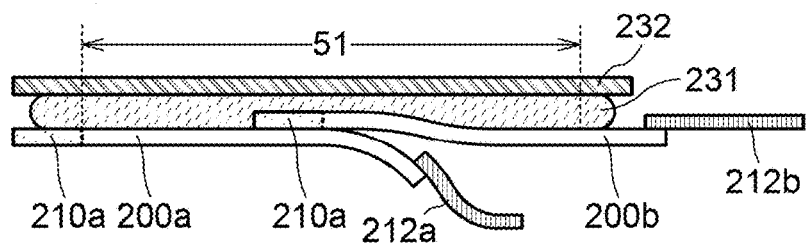
FIGS. 19A to 19E illustrate a structure example of a display device according to one embodiment.
Figure 19B:
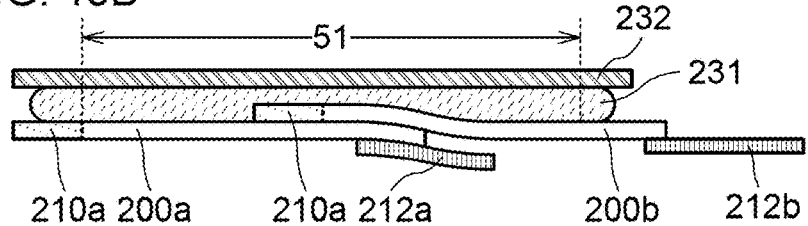

Alternatively, as illustrated in FIGS. 19A and 19B, a protective substrate 232 is preferably provided over the display device 50 with the resin layer 231 provided therebetween. Here, the resin layer 231 may serve as a bonding layer for bonding the protective substrate 232 to the display device 10. With the protective substrate 232, the surface of the display device 50 is protected, and moreover, the mechanical strength of the display device 50 can be increased. For the protective substrate 232 in a region overlapping at least the display region 11, a light-transmitting material is used. Furthermore, the protective substrate 232 in a region other than the region overlapping the display region 51 may have a light-blocking property not to be visually recognized.

The protective substrate 232 may have a function of a touch panel. In the case where the display panel 200 is flexible and can be bent, the protective substrate 232 is also preferably flexible.

Furthermore, a difference in refractive index between the protective substrate 232 and the substrate on the display surface side of the display panel 200 or the resin layer 231 is preferably less than or equal to 20%, further preferably less than or equal to 10%, still further preferably less than or equal to 5%.

As the protective substrate 232, a plastic substrate that is formed as a film, for example, a plastic substrate made from polyimide (PI), an aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, and the like, or a glass substrate can be used. The protective substrate 232 is preferably flexible. The protective substrate 232 includes a fiber or the like (e.g., a prepreg). Furthermore, the protective substrate 232 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

Figure 19C:
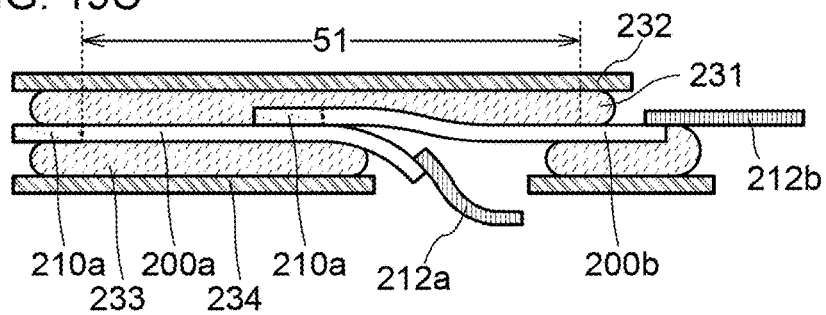
Figure 19D:
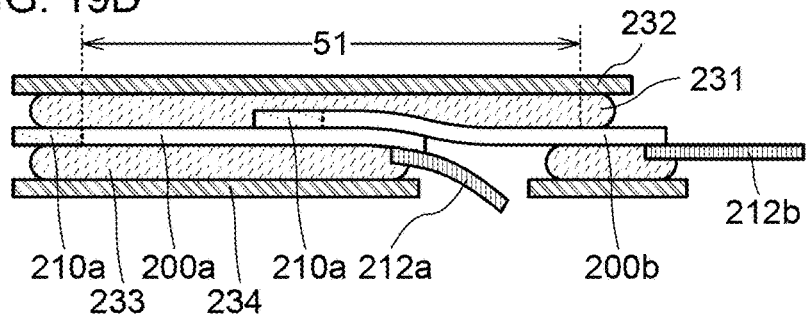

Alternatively, as illustrated in FIGS. 19C and 19D, a resin layer 233 may be provided on a surface opposite to the display surfaces of the display panel 200a and the display panel 200b, and a protective substrate 234 may be provided with the resin layer 233 provided between the protective substrate 234 and each of the display panels 200a and 200b. In this manner, the display panels 200a and 200b are sandwiched between the two protective substrates, whereby the mechanical strength of the display device 50 can be further increased. Furthermore, when the thicknesses of the resin layers 231 and 233 are substantially equal to each other, and for the protective substrates 232 and 234, materials having thicknesses which are substantially equal to each other are used, the plurality of display panels 200 is located at the center of the stack. For example, when the stack including the display panel 200 is bent, by locating the display panel 200 at the center in the thickness direction, stress in the lateral direction applied to the display panel 200 by bending can be relieved, so that damage can be prevented.

As illustrated in FIGS. 19C and 19D, an opening for extracting the FPC 212a is preferably provided in the resin layer 233 and the protective substrate 234, which are located on the rear surface sides of the display panels 200a and 200b. At this time, by providing the resin layer 233 to cover part of the FPC 212a, the mechanical strength at a connection portion between the display panel 200a and the FPC 212a can be increased, and defects such as peeling of the FPC 212a are suppressed. Similarly, the resin layer 233 is preferably provided to cover part of the FPC 212b.

Note that the resin layer 233 and the protective substrate 234, which are provided on the side opposite to the display surface, do not necessarily have a light-transmitting property, and a material which absorbs or reflects visible light may be used. When the resin layers 233 and 231, or the protective substrates 234 and 232 have the same materials, manufacturing cost can be reduced.

Figure 19E:
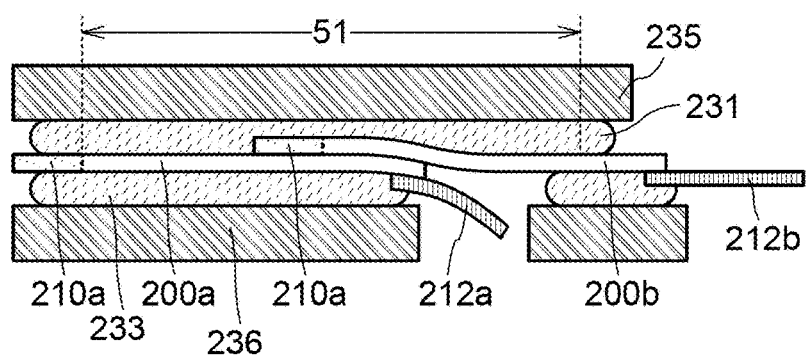

As shown in FIG. 19E, a protective substrate 235 may be provided over the display device 50. Similarly, a protective substrate 236 may be provided on the surface of the display panel opposite to the display surface. The protective substrate 235 is thicker than the protective substrate 232 in FIGS. 19A to 19D. The protective substrate 236 is thicker than the protective substrate 234 in FIGS. 19C and 19D.

As the protective substrate, a glass substrate, a plastic substrate, such as an acrylic substrate or a polyvinyl chloride substrate, or the like can be used. Alternatively, metal, wood, stone, or the like may be used as the protective substrate. The use of the thick protective substrate can increase the protection of the surface of the display device 50 and the mechanical strength of the display device 50.

For the protective substrate 235 in a region overlapping at least the display region 51, a light-transmitting material is used. Furthermore, the protective substrate 235 in a region other than the region overlapping the display region 51 may have a light-blocking property not to be visually recognized.

The protective substrate 236 does not necessarily have a light-transmitting property, and a material which absorbs or reflects visible light may be used.

[Structure Example of Display Region]

Figure 20A:
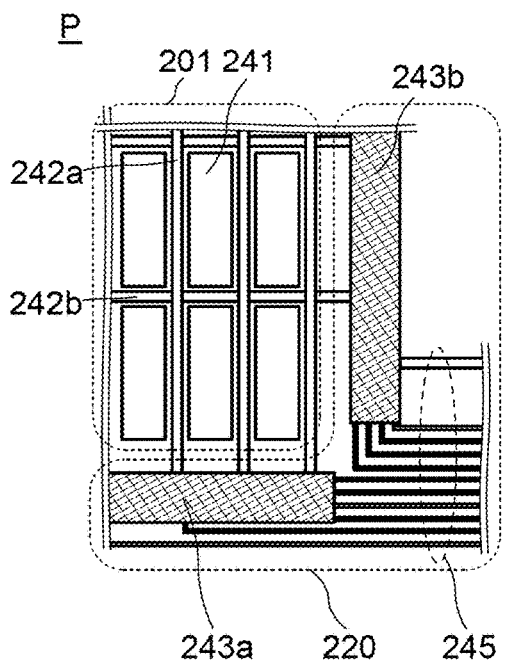
FIGS. 20A to 20C illustrate a structure example of a display panel according to one embodiment.
Figure 20B:
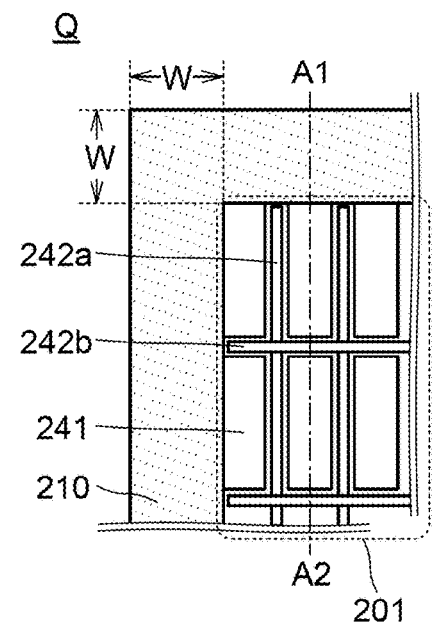

Next, a structure example of the display region 201 of the display panel 200 is described. FIG. 20A is a schematic top view in which a region P in FIG. 16A is enlarged, and FIG. 20B is a schematic top view in which a region Q in FIG. 16A is enlarged.

As illustrated in FIG. 20A, in the display region 201, a plurality of pixels 241 is arranged in matrix. In the case where the display panel 200 which is capable of full color display with three colors of red, blue, and green is formed, the pixel 241 can display any of the three colors. Alternatively, a pixel which can display white or yellow in addition to the three colors may be provided. A region including the pixels 241 corresponds to the display region 201.

A wiring 242a and a wiring 242b are electrically connected to one pixel 241. The plurality of wirings 242a each intersects with the wiring 242b, and is electrically connected to a circuit 243a. The plurality of wirings 242b is electrically connected to a circuit 243b. One of the circuits 243a and 243b can function as a scan line driver circuit, and the other can function as a signal line driver circuit. A structure without one of the circuits 243a and 243b or both of them may be employed.

In FIG. 20A, a plurality of wirings 245 electrically connected to the circuit 243a or the circuit 243b is provided. The wiring 245 is electrically connected to an FPC 223 in an unillustrated region and has a function of supplying a signal from the outside to the circuits 243a and 243b.

In FIG. 20A, a region including the circuit 243a, the circuit 243b, and the plurality of wirings 245 corresponds to the region 220 blocking visible light.

In FIG. 20B, a region outside the pixel 241 provided closest to the end corresponds to the region 210 transmitting visible light. The region 210 does not include the members blocking visible light, such as the pixel 241, the wiring 242a, and the wiring 242b. Note that in the case where part of the pixel 241, the wiring 242a, or the wiring 242b transmits visible light, the part of the pixel 241, the wiring 242a, or the wiring 242b may be provided to extend to the region 210.

Here, the width W of the region 210 indicates the narrowest width of the region 210 provided in the display panel 200 in some cases. In the case where the width W of the display panel 200 varies depending on the positions, the shortest length can be referred to as the width W. In FIG. 20B, the distance between the pixel 241 and the end surface of the substrate (that is, the width W of the region 210) in the vertical direction is the same as that in the horizontal direction.

Figure 20C:
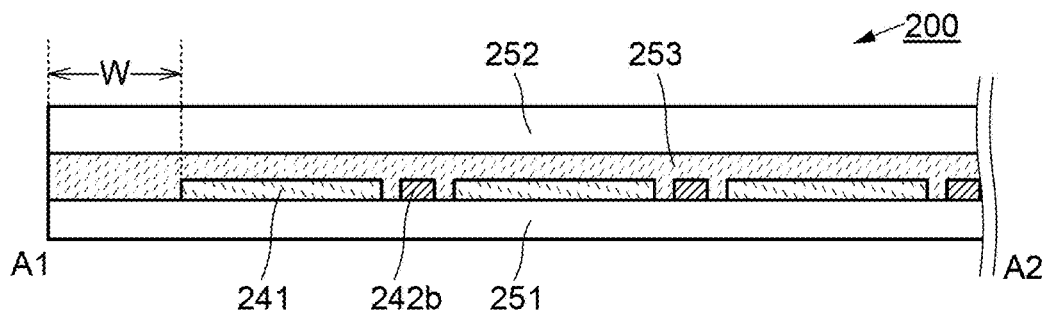

FIG. 20C is a schematic cross-sectional view taken along line A1-A2 in FIG. 20B. The display panels 200 include a pair of light-transmitting substrates (a substrate 251 and a substrate 252). The substrate 251 and the substrate 252 are bonded to each other with a bonding layer 253. Here, the substrate on which the pixel 241, the wiring 242b, and the like are formed is referred to as the substrate 251.

As illustrated in FIGS. 20B and 20C, in the case where the pixel 241 is positioned closest to the end of the display region 101, the width W of the region 210 transmitting visible light is the distance between the end portion of the substrate 251 or the substrate 252 and the end portion of the pixel 241.

Note that the end portion of the pixel 241 refers to the end portion of the member that is positioned closest to the end and blocks visible light in the pixel 241. Alternatively, in the case where a light-emitting element including a layer containing a light-emitting organic compound between a pair of electrodes (also referred to as an organic EL element) is used as the pixel 241, the end portion of the pixel 241 may be any of the end portion of the lower electrode, the end portion of the layer containing a light-emitting organic compound, and the end portion of the upper electrode.

Figure 21A:
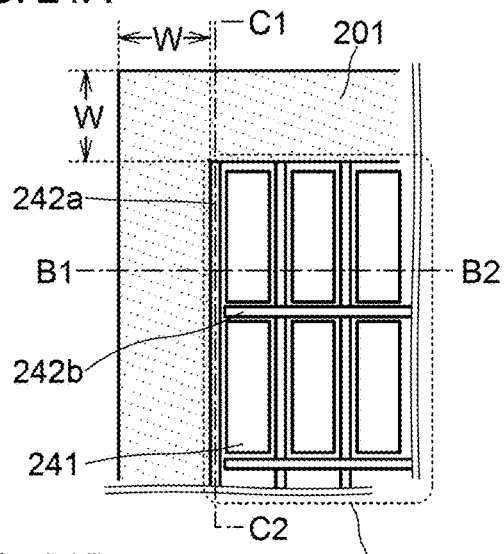
FIGS. 21A to 21C illustrate a structure example of a display panel according to one embodiment.
Figure 21B:
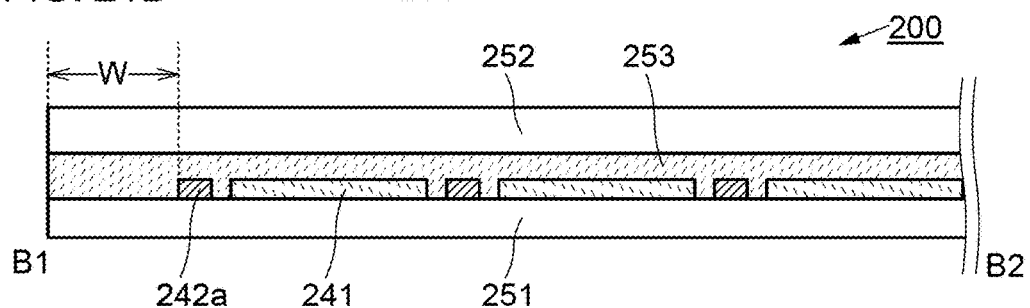

FIG. 21A shows the case where the position of the wiring 242a is different from that in FIG. 20B. FIG. 21B is a schematic cross-sectional view taken along line B1-B2 in FIG. 21A, and FIG. 21C is a schematic cross-sectional view taken along line C1-C2 in FIG. 21A.

Figure 21C:
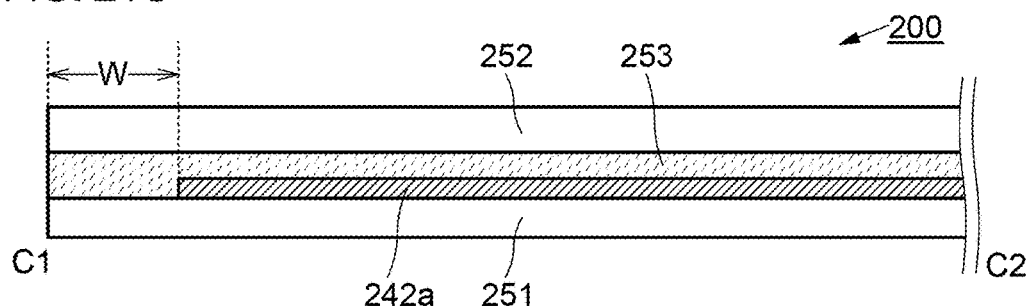

As illustrated in FIGS. 21A to 21C, in the case where the wiring 242a is positioned closest to the end of the display region 201, the width W of the region 210 transmitting visible light is the distance between the end portion of the substrate 251 or the substrate 252 and the end portion of the wiring 242a. In the case where the wiring 242a transmits visible light, the region 210 may include a region where the wiring 242a is provided.

Here, in the case where the density of pixels provided in the display region 201 of the display panel 200 is high, a portion where pixels are arranged discontinuously may be formed when the two display panels 200 are bonded or when there is a change in relative position of the two display panels.

Figure 22A:
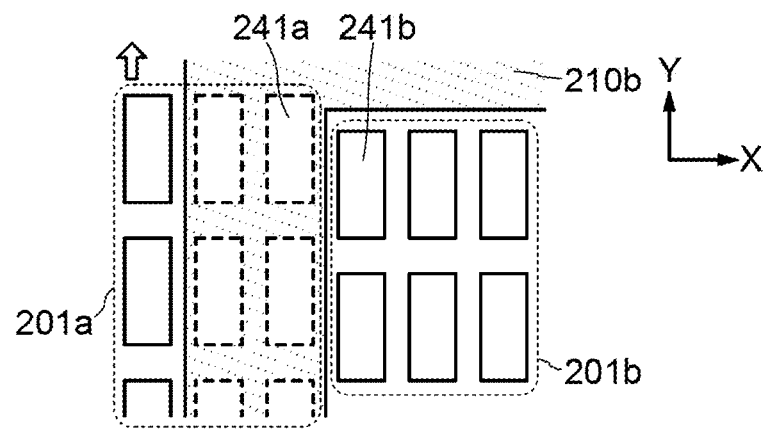
FIGS. 22A to 22C each illustrate a positional relationship between display panels according to one embodiment.

FIG. 22A shows a positional relation between the display region 201a of the display panel 200a provided on the lower side and the display region 201b of the display panel 200b provided on the upper side, seen from the display surface side. FIG. 22A shows the vicinities of the corner portions of the display regions 201a and 201b. Part of the display region 201a is covered with the region 210b.

Figure 22B:
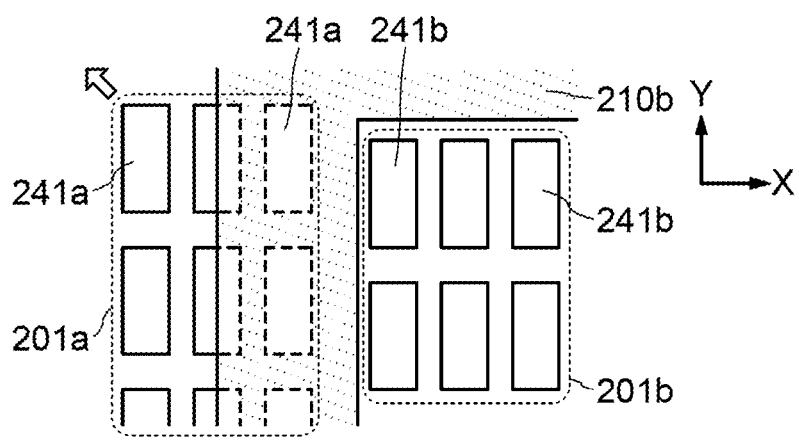

FIG. 22A shows an example in which adjacent pixels 241a and 241b are relatively deviated in one direction (Y direction). The arrow in the drawing denotes a direction in which the display panel 200a is deviated from the display panel 200b. FIG. 22B shows an example in which the adjacent pixels 241*a* and 241*b* are relatively deviated in a vertical direction and a horizontal direction (X direction and Y direction).

In the examples of FIGS. 22A and 22B, the distances deviated in the vertical direction and the horizontal direction are each shorter than the length of one pixel. In this case, image data of the image displayed on either one of the display regions 201*a* and 201*b* is corrected depending on the deviation distance, whereby the display quality can be maintained. Specifically, when the deviation makes the distance between the pixels smaller, the data is corrected so that the gray level (luminance) of the pixels is low, and when the deviation makes the distance between the pixels larger, the data is corrected so that the gray level (luminance) of the pixels is high. Alternatively, when the one or more pixels overlap, the data is corrected so that the pixel positioned on a lower side is not driven and the image data is shifted by one column.

Figure 22C:
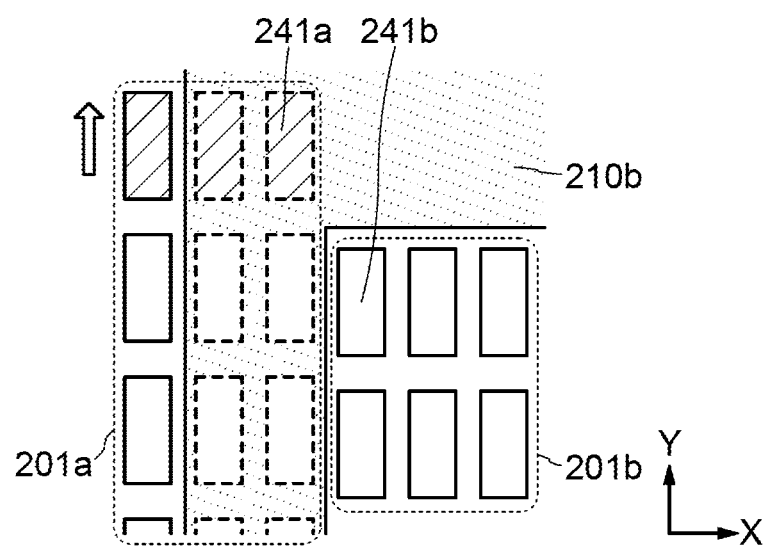

FIG. 22C shows an example in which the pixels 241*a* and 241*b*, which should be adjacent, are relatively deviated in one direction (Y direction) by a distance of more than one pixel. When the deviation of more than one pixel occurs, the pixels are driven so that projecting pixels (pixels which are hatched) are not displayed. Note that the same applies to the case where the deviation direction is the X direction.

When the plurality of display panels 200 are bonded, in order to suppress misalignment, each of the display panels 200 is preferably provided with an alignment marker or the like. Alternatively, a projection and a depression may be formed on the surfaces of the display panels 200, and the projection and the depression may be attached to each other in a region where the two display panels 200 overlap.

At least part of this embodiment can be implemented in combination with any of the embodiments described in this specification as appropriate.

Embodiment 3

In this embodiment, structure examples of a display panel which can be used in a display device, a display unit, and a display system of one embodiment of the present invention are described with reference to drawings.

Although a display panel mainly including an organic EL element is described in this embodiment as an example, a display panel which can be used in a display device of one embodiment of the present invention is not limited to this example. A light-emitting panel or a display panel including another light-emitting element or display element which will be described can also be used in a display device of one embodiment of the present invention.

Figure 23A:
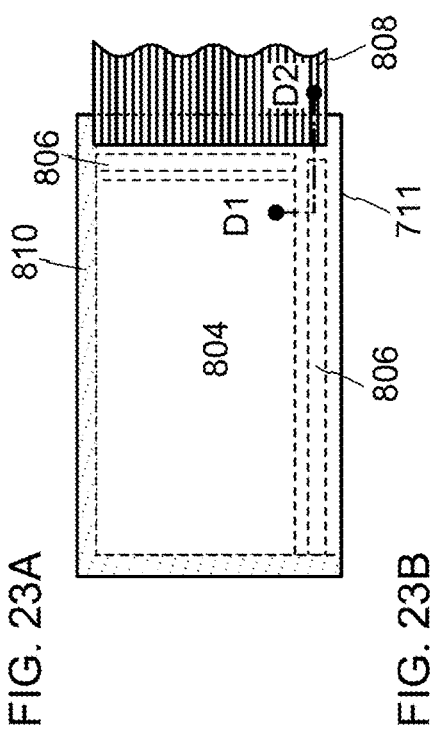
FIGS. 23A and 23B illustrate a structure example of a display panel according to one embodiment.
Figure 23B:
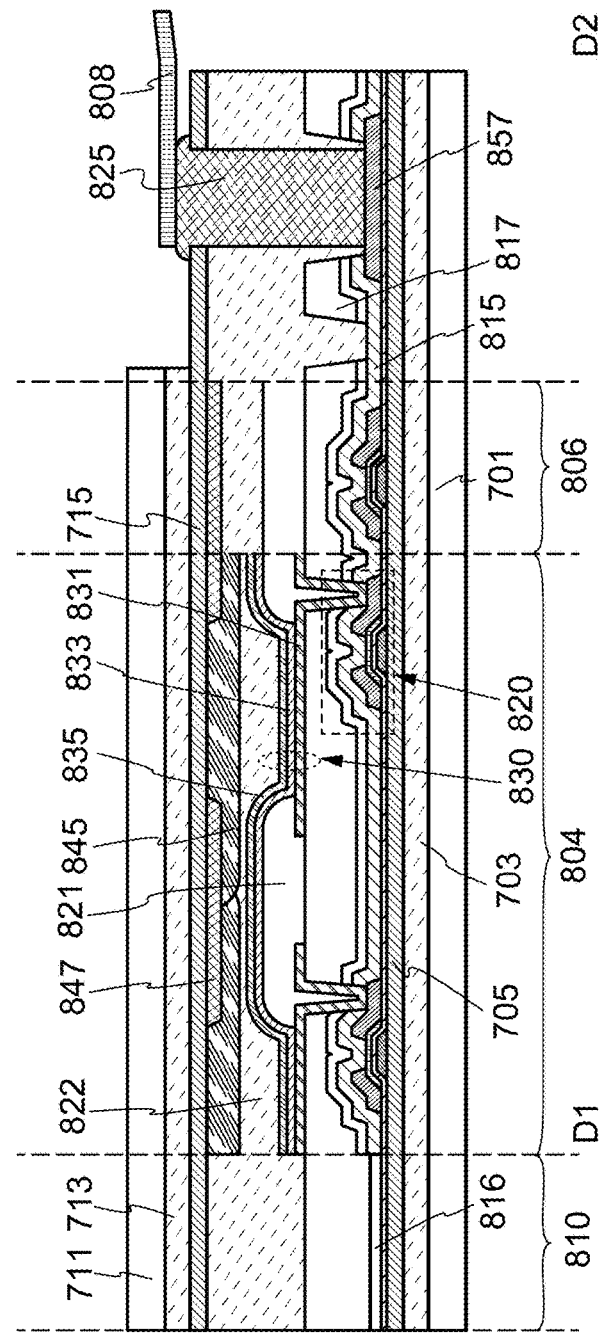

FIG. 23A is a plan view of the display panel, and FIG. 23B is an example of a cross-sectional view taken along the dashed-dotted line D1-D2 in FIG. 23A. FIG. 23B also shows an example of a cross-sectional view of a region transmitting visible light 810.

The display panel in Structure Example 1 is a top-emission display panel using a color filter method. In this embodiment, the display panel can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan, magenta, or the like may be used.

The display panel shown in FIG. 23A includes the region transmitting visible light 810, a display portion 804, an operating circuit portion 806, and an FPC 808. The region transmitting visible light 810 is adjacent to the display portion 804 and provided along two sides of the display portion 804. The operating circuit portion 806 includes a scan line driver circuit, a signal line driver circuit, and the like. The region transmitting visible light 810 includes a region transmitting visible light. The operation circuit portion 806 includes a region blocking visible light.

The display panel illustrated in FIG. 23B includes a substrate 701, an adhesive layer 703, an insulating layer 705, a plurality of transistors, a conductive layer 857, an insulating layer 815, an insulating layer 816, an insulating layer 817, a plurality of light-emitting elements, an insulating layer 821, an adhesive layer 822, a coloring layer 845, a light-blocking layer 847, an insulating layer 715, an adhesive layer 713, and a substrate 711. The adhesive layer 822, the insulating layer 715, the adhesive layer 713, and the substrate 711 transmit visible light. Light-emitting elements and transistors included in the display portion 804 and the operating circuit portion 806 are sealed with the insulating layer 705, the insulating layer 715, and the adhesive layer 822.

The display portion 804 includes a transistor 820 and a light-emitting element 830 over the substrate 701 with the adhesive layer 703 and the insulating layer 705 provided therebetween. The light-emitting element 830 includes a lower electrode 831 over the insulating layer 817, an EL layer 833 over the lower electrode 831, and an upper electrode 835 over the EL layer 833. That is, the light-emitting element 830 includes the lower electrode 831, the upper electrode 835, and the EL layer 833 provided between the lower electrode 831 and the upper electrode 835.

The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

In addition, the display portion 804 includes the coloring layer 845 overlapping with the light-emitting element 830 and the light-blocking layer 847 overlapping with the insulating layer 821. The space between the light-emitting element 830 and the coloring layer 845 is filled with the adhesive layer 822.

The insulating layer 815 and the insulating layer 816 have an effect of inhibiting diffusion of impurities to a semiconductor included in the transistors. As the insulating layer 817, an insulating layer having a planarization function is preferably selected in order to reduce surface unevenness due to the transistor.

Note that the insulating layer 815 and/or the insulating layer 816 may be omitted in a region where a transistor is not provided in the display panel. In particular, it is preferable that the insulating layer 815 and/or the insulating layer 816 not be formed in the region transmitting visible light 810 because the transmittance is improved. FIGS. 23A and 23B show structures in each of which the insulating layer 815 is not formed in the region transmitting visible light 810. For example, silicon nitride and silicon oxynitride can be used as the insulating layer 815 and the insulating layer 816, respectively.

The operating circuit portion 806 includes a plurality of transistors over the substrate 701 with the adhesive layer 703 and the insulating layer 705 provided therebetween. In FIG. 23B, one of transistors included in the operating circuit portion 806 is illustrated.

The insulating layer 705 and the insulating layer 715 are preferably highly resistant to moisture, in which case entry of impurities such as water into the light-emitting element 830 or the transistor 820 can be inhibited, leading to higher reliability of the display panel. When the display panel includes a substrate, the surface of the display panel can be protected from a physical impact, which is preferable. The substrate 701 is bonded to the insulating layer 705 with the adhesive layer 703. The substrate 711 is bonded to the insulating layer 715 with the adhesive layer 713.

The conductive layer 857 is electrically connected to an external electrode through which a signal (e.g., a video signal, a clock signal, a start signal, or a reset signal) or a potential from the outside is transmitted to the operating circuit portion 806. Here, an example in which the FPC 808 is provided as the external electrode is described. To prevent an increase in the number of manufacturing steps, the conductive layer 857 is preferably formed using the same material and the same step(s) as those of the electrode or the wiring in the display portion or the driver circuit portion. Here, an example is described in which the conductive layer 857 is formed using the same material and the same step(s) as those of the electrodes of the transistor 820.

In the display panel in FIG. 23B, the FPC 808 is positioned over the insulating layer 715. The connector 825 is connected to the conductive layer 857 through an opening provided in the insulating layer 715, the adhesive layer 822, the insulating layer 817, the insulating layer 816, and the insulating layer 815. The connector 825 is also connected to the FPC 808. The FPC 808 and the conductive layer 857 are electrically connected to each other via the connector 825.

Figure 24:
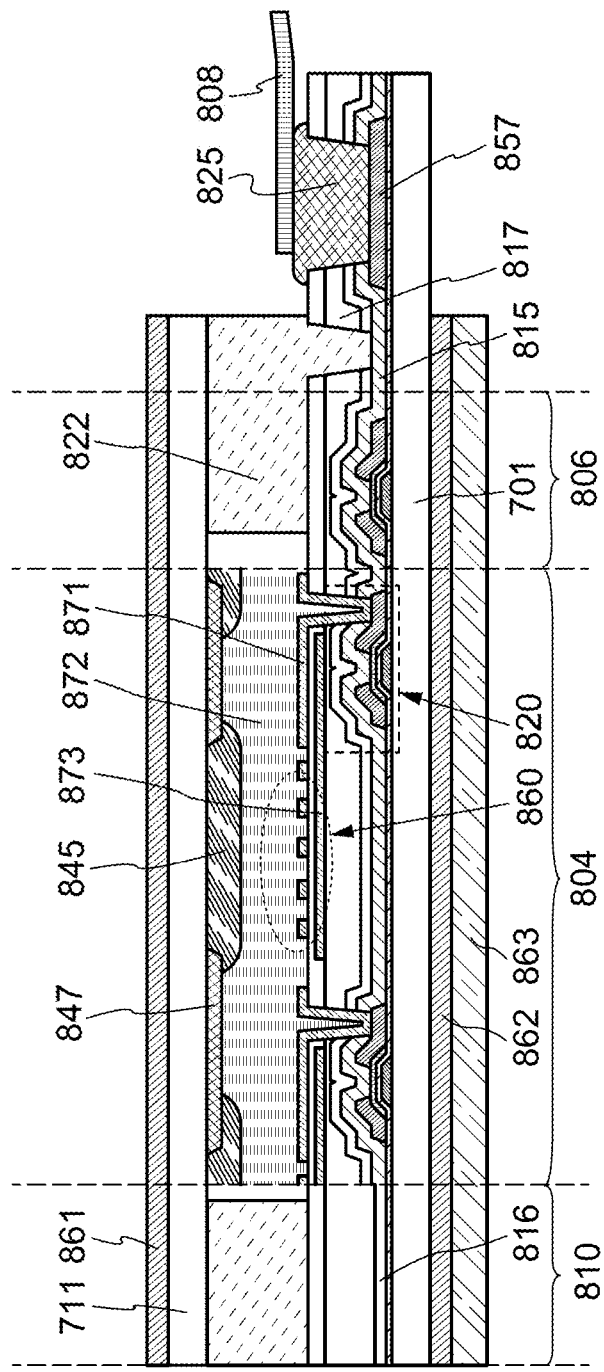
FIG. 24 illustrates a structure example of a display panel according to one embodiment.

FIG. 24 is a schematic cross-sectional view when using a liquid crystal element as a display element. In FIG. 24, a liquid crystal element using a fringe field switching (FFS) mode is used as the display element. The display panel in FIG. 24 includes a liquid crystal element 860, polarizing plates 861 and 862, a backlight 863, and the like. The liquid crystal element 860 includes a comb-shaped first electrode 871, a liquid crystal 872, and a second electrode 873.

Figure 25:
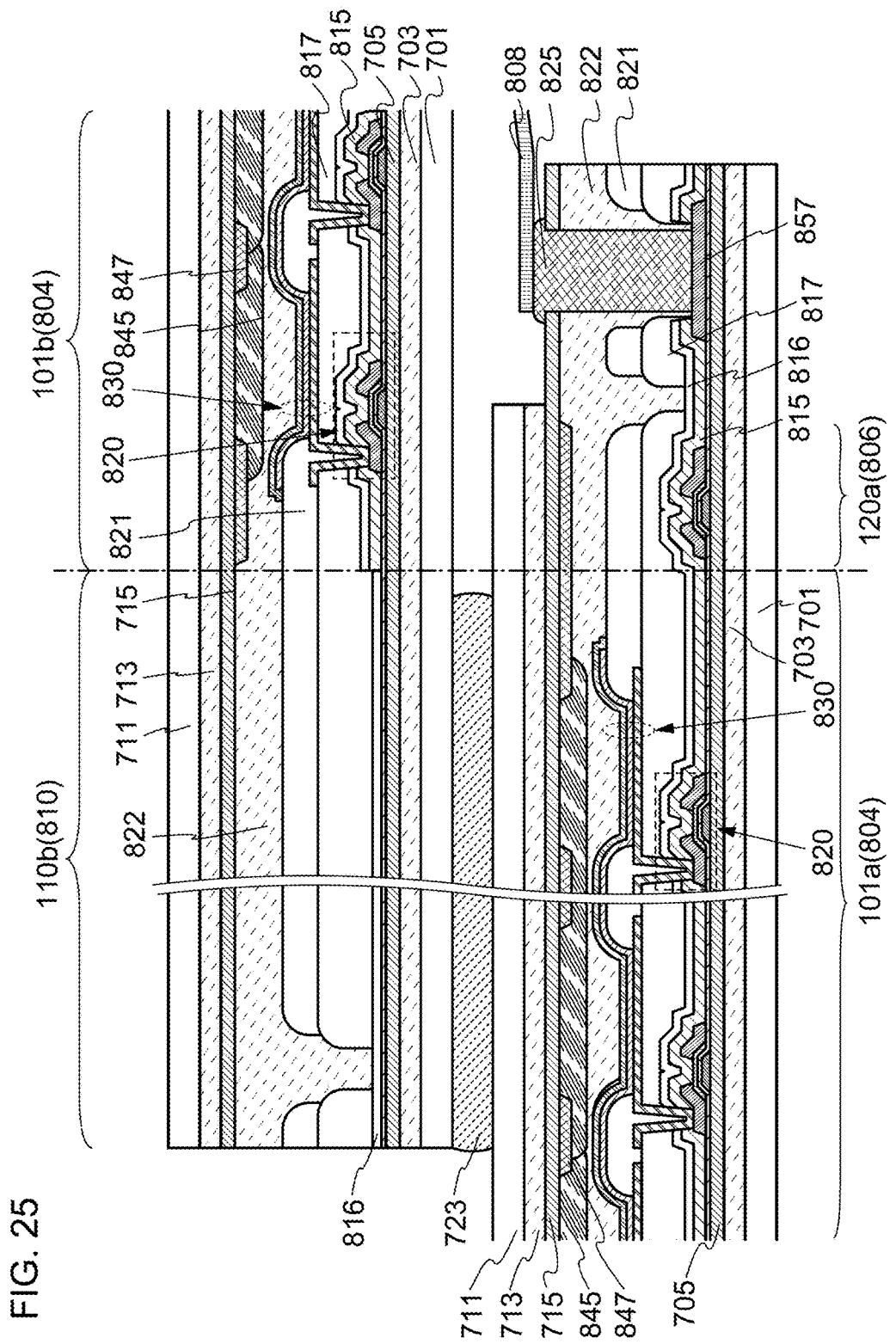
FIG. 25 illustrates a structure example of a display panel according to one embodiment.

FIG. 25 shows an example of a cross-sectional view of a state where two display panels each shown in FIG. 23B are attached to each other with an adhesive layer 723 therebetween. Note that the two display panels may be fixed to each other so as to be attachable to and detachable from each other using an adsorptive layer instead of the adhesive layer 723.

FIG. 25 shows the display region 201a (corresponding to the display portion 804 shown in FIG. 23A) and the region blocking visible light 220a (corresponding to the operating circuit portion 806 and the like shown in FIG. 23A) of the lower (rear) display panel and the display region 201b (corresponding to the display portion 804 shown in FIG. 23A) and the region transmitting visible light 201b (corresponding to the region transmitting visible light 810 shown in FIG. 23A) of the upper (front) display panel. Furthermore, the cross-sectional view shown in FIG. 25 shows an example of an overlapping portion (the region 270 in FIG. 14A) where the two display panels 200a and 200b described in Embodiment 2 overlap with each other.

In FIG. 25, the display panel positioned on the upper side (the display surface side) includes the region transmitting visible light 810 adjacent to the display portion 804. Furthermore, the display portion 804 of the lower display panel and the region transmitting visible light 810 of the upper display panel overlap each other. Thus, a non-display region between the display regions of the two overlapping display panels can be reduced and even removed. As a result, a large-sized display device in which a joint portion of the display panels is hardly seen by the user can be obtained.

In FIG. 25, the adhesive layer 723 transmitting visible light is provided between the display portion 804 of the lower display panel and the region transmitting visible light 810 of the upper display panel. The difference in refractive index between the adhesive layer 723 and the substrate 701 of the upper display panel and/or the substrate 711 of the lower display panel is preferably small. Such a structure can reduce reflection by the interface due to the difference in refractive index in a stack located over the display portion 804 of the lower display panel. In addition, display unevenness or luminance unevenness of a large display device can be suppressed.

[Examples of Materials and Formation Method]

Next, materials and the like that can be used for the display panel are described. Note that description of the components already described in this specification and the like is omitted in some cases.

For each of the substrates, a material such as glass, quartz, an organic resin, a metal, or an alloy can be used. The substrate through which light is extracted from the light-emitting element is formed using a material which transmits the light.

In particular, a flexible substrate is preferably used. For example, an organic resin; or glass, a metal, or an alloy that is thin enough to have flexibility can be used.

An organic resin, which has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when an organic resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

There is no particular limitation on a material of the metal substrate or the alloy substrate, but it is preferable to use, for example, aluminum, copper, nickel, or a metal alloy such as an aluminum alloy or stainless steel.

Furthermore, when a material with high thermal emissivity is used for the substrate, the surface temperature of the display panel can be prevented from rising, leading to inhibition of breakage or a decrease in reliability of the display panel. For example, the substrate may have a stacked-layer structure of a metal substrate and a layer with high thermal emissivity (the layer can be formed using a metal oxide or a ceramic material, for example).

As the substrate having flexibility and a light-transmitting property, a plastic substrate that is formed as a film, for example, a plastic substrate made from polyimide (PI), an aramid, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, and the like, or a glass substrate can be used. The substrate may include a fiber or the like (e.g., a prepreg). Furthermore, the substrate is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

The flexible substrate may have a stacked-layer structure in which a hard coat layer (e.g., a silicon nitride layer) by which a surface of the device is protected from damage, a layer for dispersing pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a highly reliable display panel can be provided.

For example, a flexible substrate in which a glass layer, an adhesive layer, and an organic resin layer are stacked from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. By providing such an organic resin layer, occurrence of a crack or a break in the glass layer can be inhibited and mechanical strength can be improved. With the substrate that includes such a composite material of a glass material and an organic resin, a highly reliable flexible display panel can be provided.

Here, a method for forming a flexible display panel is described.

For convenience, a structure including a pixel and a driver circuit, a structure including an optical member such as a color filter, a structure including a touch sensor, or a structure including a functional member is referred to as an element layer. An element layer includes a display element, for example, and may include a wiring electrically connected to a display element or an element such as a transistor used in a pixel or a circuit in addition to the display element.

Here, a support provided with an insulating surface over which an element layer is formed is called a base material.

As a method for forming an element layer over a flexible base material, there are a method in which an element layer is formed directly over a base material, and a method in which an element layer is formed over a supporting base material and has stiffness and then the element layer is separated from the supporting base material and transferred to the base material.

In the case where a material of the base material can withstand heating temperature in the process for forming the element layer, it is preferred that the element layer be formed directly over the base material, in which case a manufacturing process can be simplified. At this time, the element layer is preferably formed in a state where the base material is fixed to the supporting base material, in which case the transfer of the element layer in a device and between devices can be easy.

In the case of employing the method in which the element layer is formed over the supporting base material and then transferred to the base material, first, a separation layer and an insulating layer are stacked over a supporting base material, and then the element layer is formed over the insulating layer. Then, the element layer is separated from the supporting base material and then transferred to the base material. At this time, a material is selected such that separation at an interface between the supporting base material and the separation layer, at an interface between the separation layer and the insulating layer, or in the separation layer occurs. With such a method, the element layer can be formed at temperatures higher than the upper temperature limit of the base material, which improves the reliability of the display panel.

For example, it is preferable that stacked layers of a layer including a high-melting-point metal material, such as tungsten, and a layer including an oxide of the metal material be used as the separation layer, and stacked layers of a plurality of layers as the insulating layer, such as a silicon nitride layer and a silicon oxynitride layer be used over the separation layer. By using a high-melting-point metal material, a high-temperature process can be performed to form the element layer, resulting in high reliability. For example, impurities contained in the element layer can be further reduced, and the crystallinity of a semiconductor or the like included in the element layer can be further increased. For the base material, any of the above flexible materials can be preferably used.

Examples of the separation include peeling off by application of mechanical power, removal of the separation layer by etching, or separation by dripping of a liquid into part of the separation interface to penetrate the entire separation interface.

The separation layer is not necessarily provided in the case where separation can occur at an interface between the supporting base material and the insulating layer. For example, glass may be used as the supporting base material, an organic resin such as polyimide may be used as the insulating layer, a separation trigger may be formed by locally heating part of the organic resin by laser light or the like, and separation may be performed at an interface between the glass and the insulating layer. Alternatively, a layer containing a material with high thermal conductivity (e.g., a metal or a semiconductor) may be provided between the supporting base material and the insulating layer containing an organic resin, and this layer is heated by current so that separation easily occurs, and then separation is performed. In this case, the insulating layer containing an organic resin can also be used as the base material.

As the adhesive layer, a variety of curable resins such as a reactive curable resin, a thermosetting resin, an anaerobic resin, and a photo curable resin such as an ultraviolet curable resin can be used. Examples of such resins include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, an adhesive sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case entry of impurities such as moisture into the light-emitting element can be inhibited and the reliability of the display panel can be improved.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

Insulating films with high resistance to moisture are preferably used for the insulating layer 705 and the insulating layer 715. Alternatively, the insulating layer 705 and the insulating layer 715 preferably have a function of preventing diffusion of impurities to a light-emitting element.

As an insulating film having an excellent moisture-proof property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having an excellent moisture-proof property is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

In the display panel, it is necessary that at least one of the insulating layers 705 and 715, which is on the light-emitting surface side, transmit light emitted from the light-emitting element. In the case where the display panel includes the insulating layers 705 and 715, one of the insulating layers 705 and 715, which transmits light emitted from the light-emitting element, preferably has higher average transmittance than the other in a wavelength of 400 nm or more and 800 nm or less.

The insulating layers 705 and 715 each preferably include oxygen, nitrogen, and silicon. The insulating layers 705 and 715 each preferably include, for example, silicon oxynitride. Moreover, the insulating layers 705 and 715 each preferably include silicon nitride or silicon nitride oxide. It is preferable that the insulating layers 705 and 715 be each formed using a silicon oxynitride film and a silicon nitride film, which are in contact with each other. The silicon oxynitride film and the silicon nitride film are alternately stacked so that antiphase interference occurs more often in a visible region, whereby the stack can have higher transmittance of light in the visible region.

There is no particular limitation on the structure of the transistor in the display panel. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided. In each of the above structure examples, the insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide, indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to transmit light. Alternatively, a stacked film of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be prevented. Examples of a material for the metal film or the metal oxide film are titanium and titanium oxide. Alternatively, the conductive film having a property of transmitting visible light and a film containing any of the above metal materials may be stacked. For example, a stacked film of silver and indium tin oxide or a stacked film of an alloy of silver and magnesium and indium tin oxide can be used.

The lower electrode 831 and the upper electrode 835 can be formed of the conductive film that transmits visible light or the conductive film that reflects visible light.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the wavelength range in a visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material or the like in an excited state which is generated in the phosphorescent layer to a fluorescent material or the like in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporated separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the display panel.

As the insulating layer 815 and the insulating layer 816, for example, an inorganic insulating film such as a silicon oxide film, a silicon oxynitride film, or an aluminum oxide film can be used. Note that the insulating layer 815 and the insulating layer 816 may be formed using different materials. As the insulating layer 817 and insulating layers 817*a* and 817*b*, an organic material such as polyimide, acrylic, polyamide, polyimide amide, or a benzocyclobutene-based resin can be used, for example. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed using a photosensitive resin material to have an opening portion over the lower electrode 831 so that a side wall of the insulating layer 821 in the opening portion is formed as an inclined surface with a curvature.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

For example, a conductive layer functioning as an electrode or a wiring of the transistor, an auxiliary electrode of the light-emitting element, or the like, which is used for the display panel, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), zinc oxide (e.g., ZnO), indium tin oxide (e.g., $In_2O_3$—$SnO_2$), indium zinc oxide (e.g., $In_2O_3$—ZnO), or any of these metal oxide materials in which silicon oxide is contained can be used.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an inkjet method, an etching method using a photolithography method, or the like. In a white sub-pixel, a resin such as a transparent resin or a white resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the display portion, such as a driver circuit portion, in which case undesired leakage of guided light or the like can be inhibited.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the adhesive layer, a material which has high wettability with respect to the material of the adhesive layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

This embodiment can be combined as appropriate with any of the other embodiments.

Embodiment 4

In this embodiment, a touch panel that can be used in a display panel of one embodiment of the present invention will be described with reference to drawings. Note that the above description can be referred to for the components of the touch panel, which are similar to those of the display panel described in the above embodiments. Although a touch panel including a light-emitting element is described as an example in this embodiment, one embodiment of the present invention is not limited thereto. For example, a touch panel including another element (e.g., a display element), the example of which will be described later, can also be used in the display panel of one embodiment of the present invention.

Structure Example 1

Figure 26A:
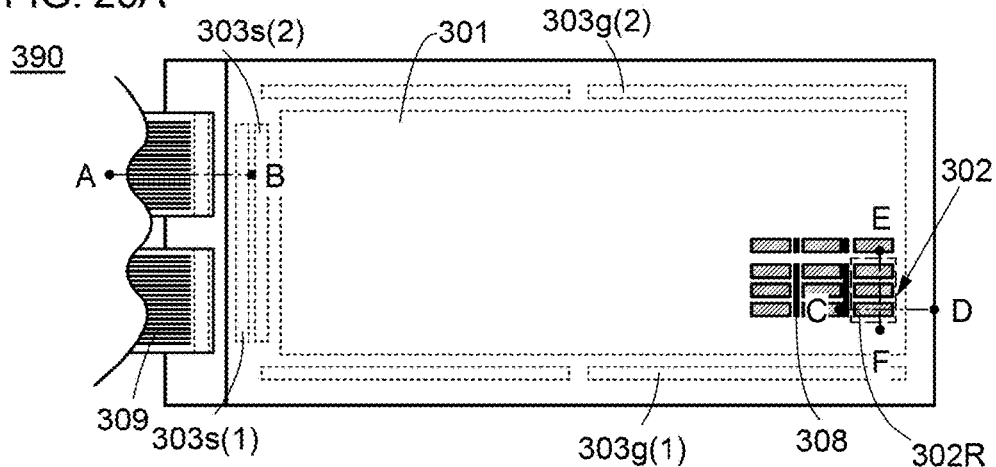
FIGS. 26A to 26C illustrate a structure example of a touch panel according to one embodiment.
Figure 26B:
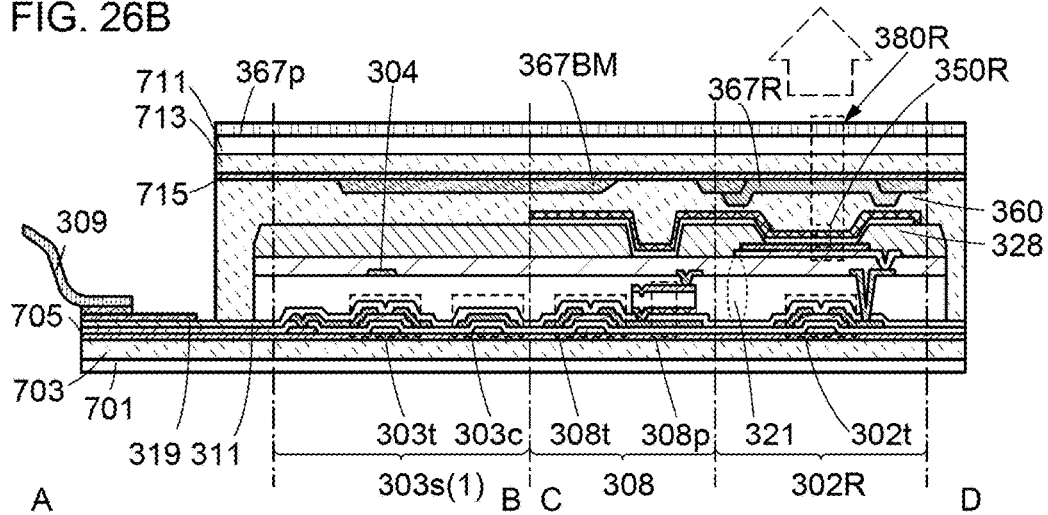
Figure 26C:
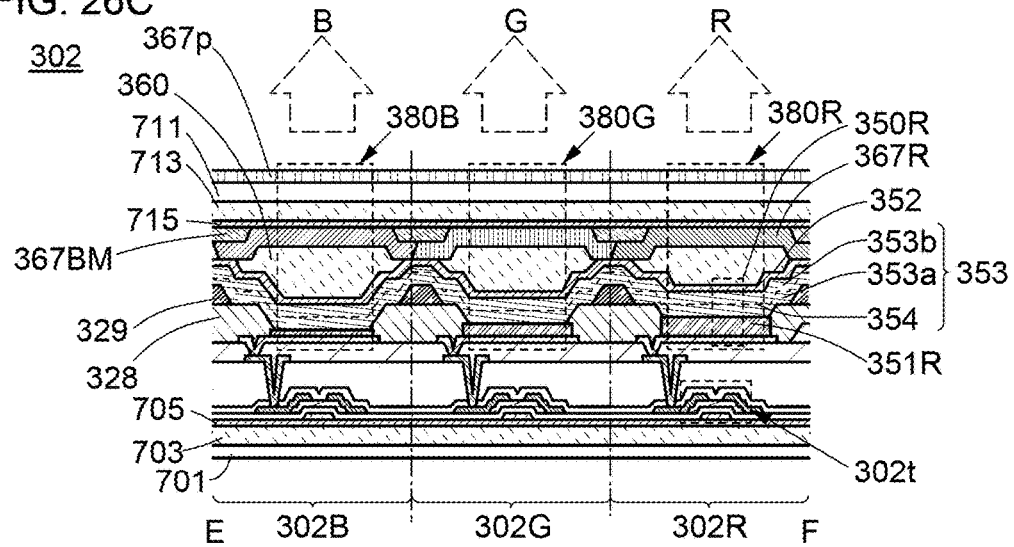

FIG. 26A is a top view of the touch panel. FIG. 26B is a cross-sectional view taken along the dashed-dotted line A-B and the dashed-dotted line C-D in FIG. 26A. FIG. 26C is a cross-sectional view taken along the dashed-dotted line E-F in FIG. 26A.

A touch panel 390 illustrated in FIG. 26A includes a display portion 301 (serving also as an input portion), a scan line driver circuit 303$g$(1), an imaging pixel driver circuit 303$g$(2), an image signal line driver circuit 303$s$(1), and an imaging signal line driver circuit 303$s$(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits supplies electric power for driving the light-emitting element. The pixel circuits are electrically connected to wirings through which selection signals are supplied. The pixel circuits are also electrically connected to wirings through which image signals are supplied.

The scan line driver circuit 303$g$(1) supplies selection signals to the pixels 302.

The image signal line driver circuit 303$s$(1) supplies image signals to the pixels 302.

A touch sensor is formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time it takes for an imaging pixel circuit to sense light.

The imaging pixel driver circuit 303$g$(2) supplies control signals to the imaging pixels 308.

The imaging signal line driver circuit 303$s$(2) reads out imaging signals.

As illustrated in FIGS. 26B and 26C, the touch panel 390 includes the substrate 701, the adhesive layer 703, the insulating layer 705, the substrate 711, the adhesive layer 713, and the insulating layer 715. The substrates 701 and 711 are bonded to each other with an adhesive layer 360.

The substrate 701 and the insulating layer 705 are bonded to each other with the adhesive layer 703. The substrate 711 and the insulating layer 715 are bonded to each other with the adhesive layer 713.

The substrates 701 and 711 are preferably flexible.

The above embodiments can be referred to for materials used for the substrates, the adhesive layers, and the insulating layers.

Each of the pixels 302 includes the sub-pixel 302R, a sub-pixel 302G, and a sub-pixel 302B (see FIG. 26C). The sub-pixel 302R includes a light-emitting module 380R, the sub-pixel 302G includes a light-emitting module 380G, and the sub-pixel 302B includes a light-emitting module 380B.

For example, the sub-pixel 302R includes the light-emitting element 350R and the pixel circuit. The pixel circuit includes a transistor 302t for supplying electric power to the light-emitting element 350R. Furthermore, the light-emitting module 380R includes the light-emitting element 350R and an optical element (e.g., a coloring layer 367R that transmits red light).

The light-emitting element 350R includes a lower electrode 351R, an EL layer 353, and an upper electrode 352, which are stacked in this order (see FIG. 26C).

The EL layer 353 includes a first EL layer 353a, an intermediate layer 354, and a second EL layer 353b, which are stacked in this order.

Note that a microcavity structure can be provided for the light-emitting module 380R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The light-emitting module 380R, for example, includes the adhesive layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the adhesive layer 360 and the coloring layer 367R and is emitted to the outside of the light-emitting module 380R as indicated by an arrow in FIG. 26B or 26C.

The touch panel 390 includes a light-blocking layer 367BM. The light-blocking layer 367BM is provided so as to surround the coloring layer (e.g., the coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t and the like. Note that the insulating layer 321 can be used as a layer for covering unevenness caused by the pixel circuits and the imaging pixel circuits. An insulating layer on which a layer that can inhibit diffusion of impurities to the transistor 302t and the like is stacked can be used as the insulating layer 321.

The touch panel 390 includes a partition 328 that overlaps with an end portion of the lower electrode 351R. In addition, a spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 26B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The touch panel 390 includes a wiring 311 through which a signal is supplied. The wiring 311 is provided with a terminal 319. Note that an FPC 309 through which a signal such as an image signal or a synchronization signal is supplied is electrically connected to the terminal 319. Note that a printed wiring board (PWB) may be attached to the FPC 309.

Note that transistors such as the transistors 302t, 303t, and 308t can be formed in the same process. Alternatively, the transistors may be formed in different processes.

Structure Example 2

Figure 27A:
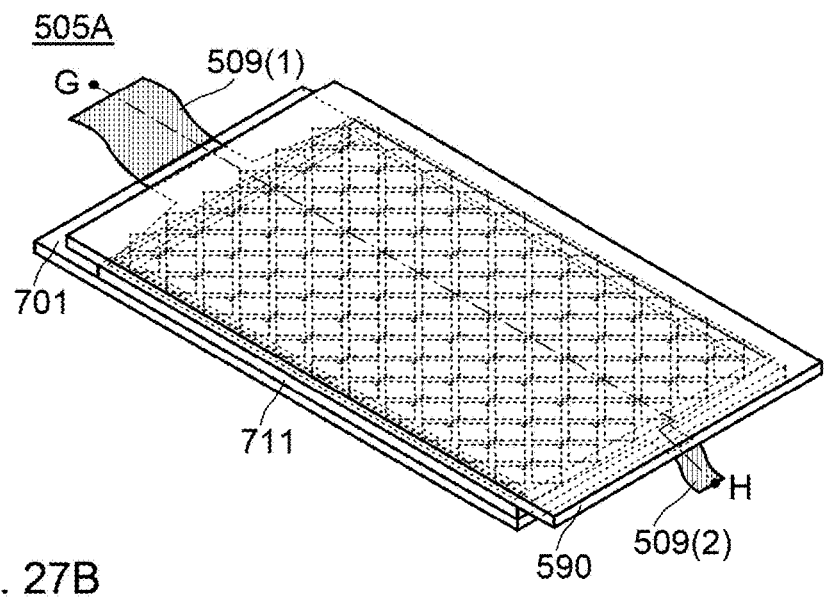
FIGS. 27A and 27B illustrate a structure example of a touch panel according to one embodiment.
Figure 27B:
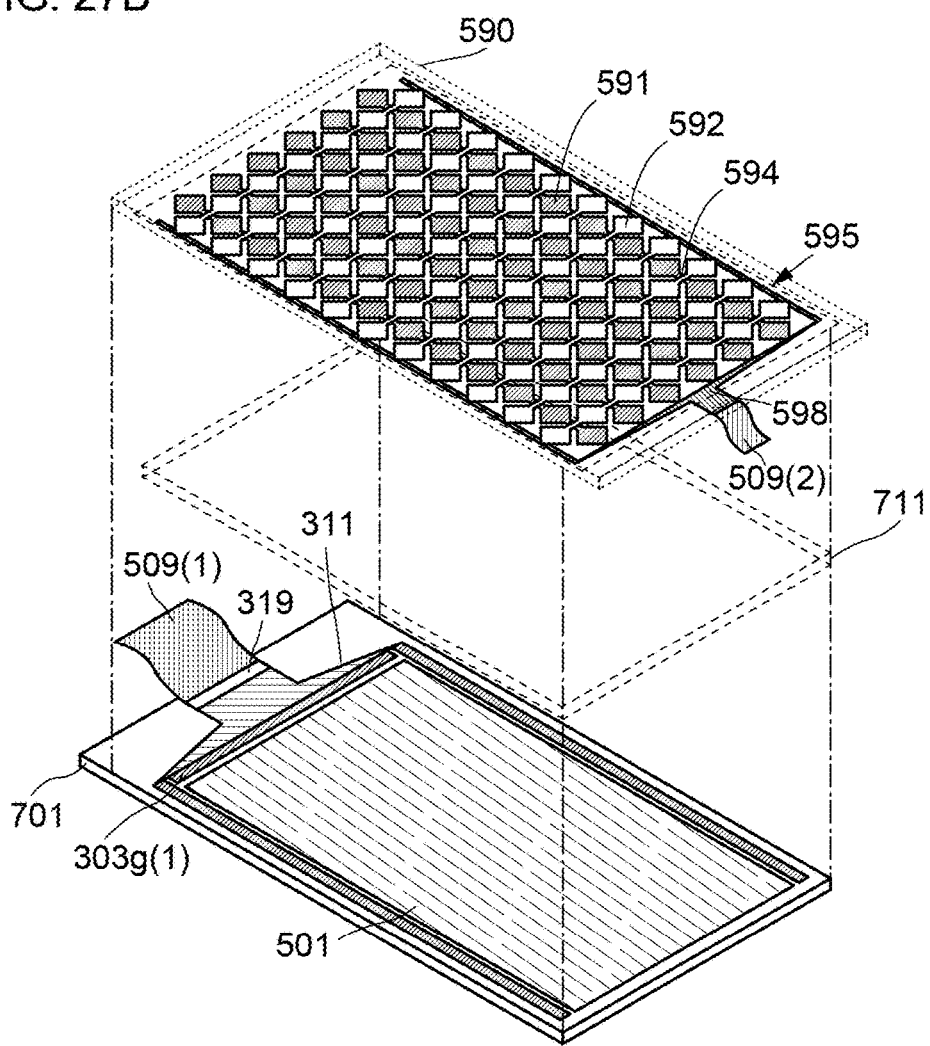
Figure 28A:
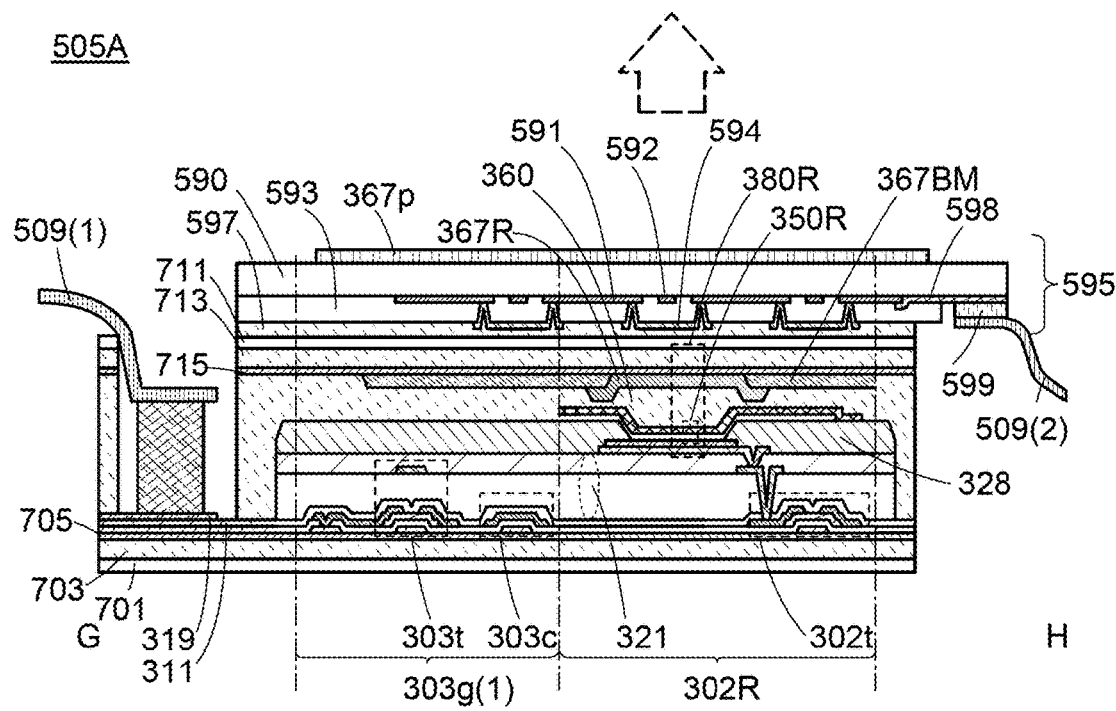
FIGS. 28A to 28C illustrate a structure example of a touch panel according to one embodiment.

FIGS. 27A and 27B are perspective views of a touch panel 505A. Note that FIGS. 27A and 27B illustrate only main components for simplicity. FIG. 28A is a cross-sectional view taken along the dashed-dotted line G-H in FIG. 27A.

As illustrated in FIGS. 27A and 27B, the touch panel 505A includes a display portion 501, the scan line driver circuit 303g(1), a touch sensor 595, and the like. Furthermore, the touch panel 505A includes the substrate 701, the substrate 711, and a substrate 590.

The touch panel 505A includes a plurality of pixels and a plurality of wirings 311. The plurality of wirings 311 can supply signals to the pixels. The plurality of wirings 311 are led to a peripheral portion of the substrate 701, and part of the plurality of wirings 311 form the terminal 319. The terminal 319 is electrically connected to an FPC 509(1).

The touch panel 505A includes the touch sensor 595 and a plurality of wirings 598. The plurality of wirings 598 are electrically connected to the touch sensor 595. The plurality of wirings 598 are led to a peripheral portion of the substrate 590, and part of the plurality of wirings 598 form a terminal. The terminal is electrically connected to an FPC 509(2). Note that in FIG. 27B, electrodes, wirings, and the like of the touch sensor 595 provided on the back side of the substrate 590 (the side facing the substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self capacitive touch sensor and a mutual capacitive touch sensor, which differ mainly in the driving method. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 27A and 27B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

Note that a more specific structure example of the touch sensor 595 will be described later.

As illustrated in FIG. 28A, the touch panel 505A includes the substrate 701, the adhesive layer 703, the insulating layer 705, the substrate 711, the adhesive layer 713, and the insulating layer 715. The substrates 701 and 711 are bonded to each other with the adhesive layer 360.

An adhesive layer 597 bonds the substrate 590 to the substrate 711 so that the touch sensor 595 overlaps with the display portion 501. The adhesive layer 597 transmits light.

The electrodes 591 and the electrodes 592 are formed using a conductive material that transmits light. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film including graphene oxide. As a reducing method, a method with application of heat or the like can be employed.

The resistance of a material used for conductive films such as the electrodes 591, the electrodes 592, and the wiring 594, i.e., a wiring and an electrode in the touch panel, is preferably low. Examples of the material include indium tin oxide, indium zinc oxide, zinc oxide, silver, copper, aluminum, a carbon nanotube, and graphene. Alternatively, a metal nanowire including a number of conductors with an extremely small width (for example, a diameter of several nanometers) may be used. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

Furthermore, a connection layer 599 electrically connects the wirings 598 to the FPC 509(2).

The display portion 501 includes a plurality of pixels arranged in a matrix. Each pixel has the same structure as Structure Example 1; thus, description is omitted.

Any of various kinds of transistors can be used in the touch panel. A structure in the case of using bottom-gate transistors is illustrated in FIGS. 28A and 28B.

For example, a semiconductor layer containing an oxide semiconductor, amorphous silicon, or the like can be used in the transistor 302t and the transistor 303t illustrated in FIG. 28A.

Figure 28B:
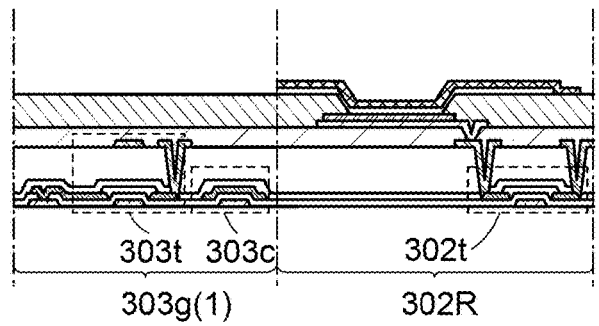

For example, a semiconductor layer containing polycrystalline silicon that is obtained by crystallization process such as laser annealing can be used in the transistor 302t and the transistor 303t illustrated in FIG. 28B.

Figure 28C:
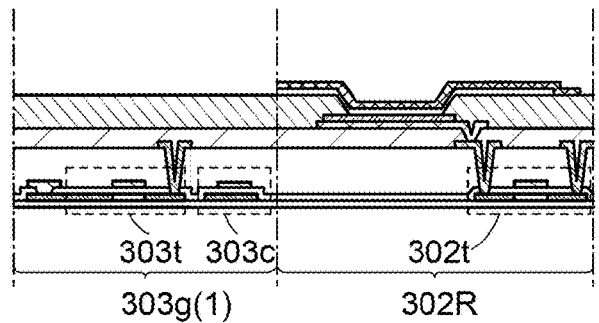

A structure in the case of using top-gate transistors is illustrated in FIG. 28C.

For example, a semiconductor layer including polycrystalline silicon, a single crystal silicon film that is transferred from a single crystal silicon substrate, or the like can be used in the transistor 302t and the transistor 303t illustrated in FIG. 28C.

Structure Example 3

Figure 29A:
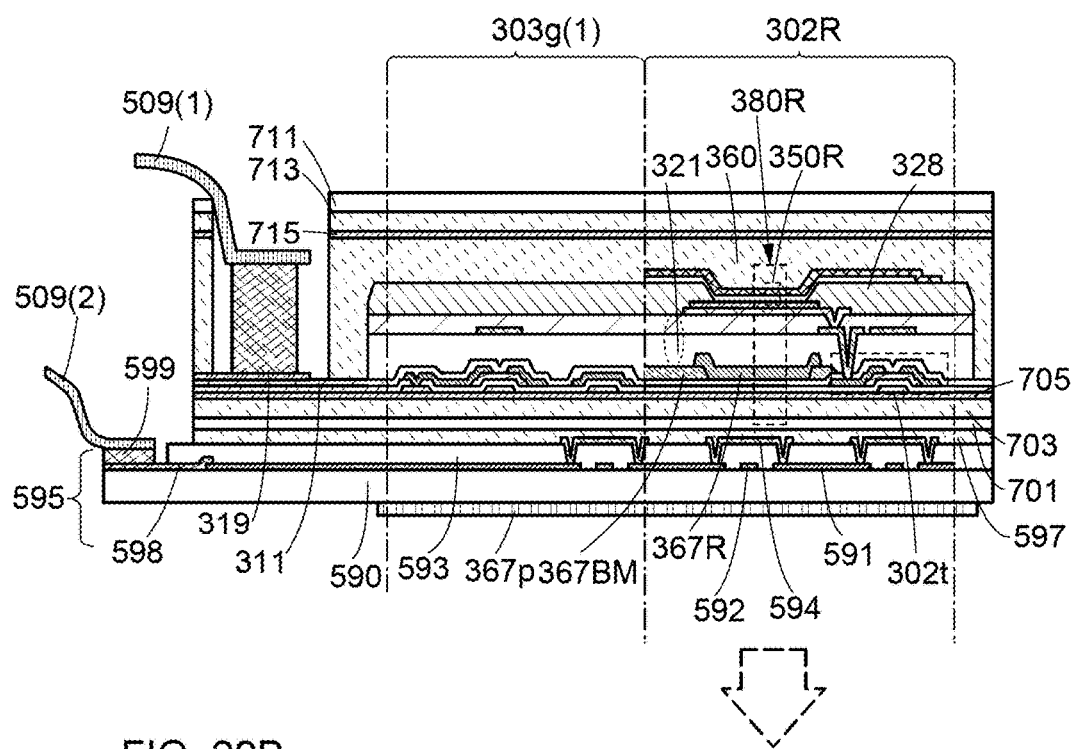
FIGS. 29A to 29C illustrate a structure example of a touch panel according to one embodiment.
Figure 29B:
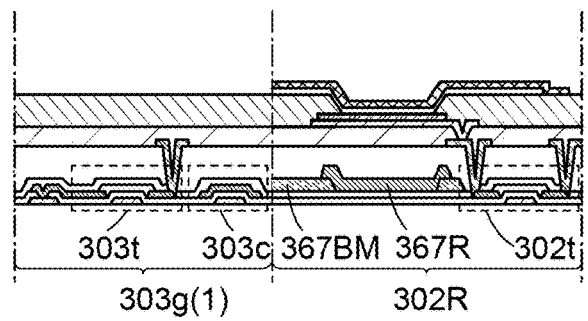
Figure 29C:
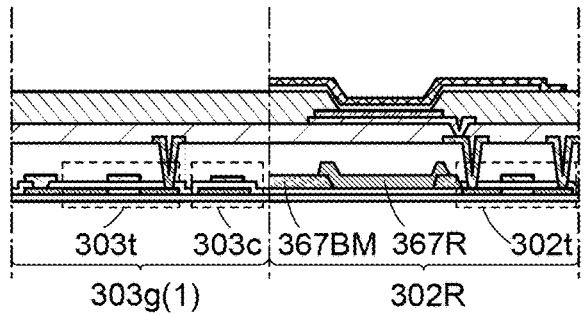

FIGS. 29A to 29C are cross-sectional views of a touch panel 505B. The touch panel 505B described in this embodiment is different from the touch panel 505A in Structure Example 2 in that received image data is displayed on the side where the transistors are provided, that the touch sensor is provided on the substrate 701 side of the display portion, and that the FPC 509(2) is provided on the same side as the FPC 509(1). Different structures will be described in detail below, and the above description is referred to for the other similar structures.

The coloring layer 367R is positioned in a region overlapping with the light-emitting element 350R. The light-emitting element 350R illustrated in FIG. 29A emits light to the side where the transistor 302t is provided. Accordingly, part of light emitted from the light-emitting element 350R passes through the coloring layer 367R and is emitted to the outside of the light-emitting module 380R as indicated by an arrow in FIG. 29A.

The touch panel 505B includes the light-blocking layer 367BM on the light extraction side. The light-blocking layer 367BM is provided so as to surround the coloring layer (e.g., the coloring layer 367R).

The touch sensor 595 is provided not on the substrate 711 side but on the substrate 701 side (see FIG. 29A).

The adhesive layer 597 bonds the substrate 590 to the substrate 701 so that the touch sensor 595 overlaps with the display portion. The adhesive layer 597 transmits light.

Note that a structure in the case of using bottom-gate transistors in the display portion 501 is illustrated in FIGS. 29A and 29B.

For example, a semiconductor layer containing an oxide semiconductor, amorphous silicon, or the like can be used in the transistor 302t and the transistor 303t illustrated in FIG. 29A.

For example, a semiconductor layer containing polycrystalline silicon can be used in the transistor 302t and the transistor 303t illustrated in FIG. 29B.

A structure in the case of using top-gate transistors is illustrated in FIG. 29C.

For example, a semiconductor layer containing polycrystalline silicon, a single crystal silicon film that is transferred, or the like can be used in the transistor 302t and the transistor 303t illustrated in FIG. 29C.

[Structure Example of Touch Sensor]

A more specific structure example of the touch sensor 595 is described below with reference to drawings.

Figure 30A:
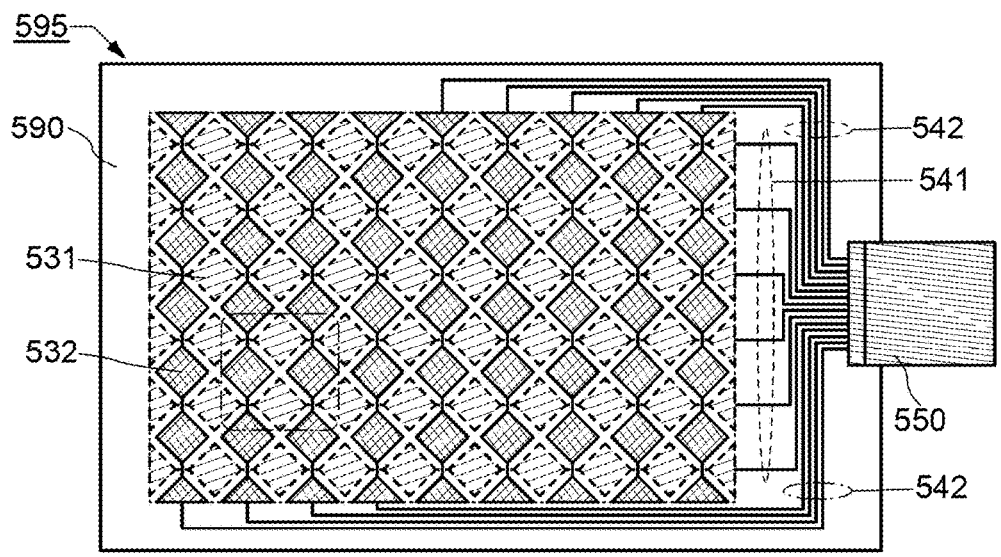
FIGS. 30A to 30D illustrate a structure example of a touch panel according to one embodiment.

FIG. 30A is a schematic top view of the touch sensor 595. The touch sensor 595 includes a plurality of electrodes 531, a plurality of electrodes 532, a plurality of wirings 541, and a plurality of wirings 542 over a substrate 590. The substrate 590 is provided with an FPC 550 which is electrically connected to each of the plurality of wirings 541 and the plurality of wirings 542.

Figure 30B:
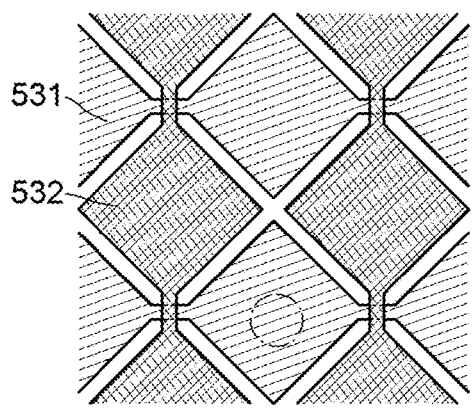

FIG. 30B shows an enlarged view of a region surrounded by a dashed dotted line in FIG. 30A. The electrodes 531 are each in the form of a series of rhombic electrode patterns aligned in a lateral direction of this figure. The rhombic electrode patterns aligned in a line are electrically connected to each other. The electrodes 532 are also each in the form of a series of rhombic electrode patterns aligned in a longitudinal direction in this figure and the rhombic electrode patterns aligned in a line are electrically connected. Part of the electrode 531 and part of the electrode 532 overlap and intersect with each other. At this intersection portion, an insulator is sandwiched in order to avoid an electrical short-circuit between the electrode 531 and the electrode 532.

Figure 30C:
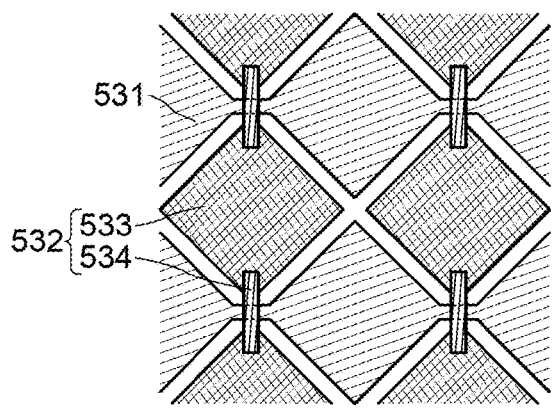

As shown in FIG. 30C, the electrodes 532 may form a plurality of island-shape rhombic electrodes 533 and bridge electrodes 534. The plurality of island-shape rhombic electrodes 533 are aligned in a longitudinal direction in this figure, and two adjacent electrodes 533 are electrically connected to each other by the bridge electrode 534. Such a structure makes it possible that the electrodes 533 and the electrodes 531 can be formed at the same time by processing the same conductive film. This can prevent variations in the thickness of these films, and can prevent the resistance value and the light transmittance of each electrode from varying from place to place. Note that although the electrodes 532 include the bridge electrodes 534 here, the electrodes 531 may have such a structure.

Figure 30D:
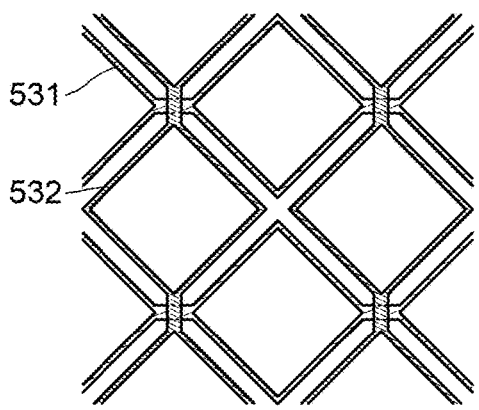

As shown in FIG. 30D, a design in which rhombic electrode patterns of the electrodes 531 and 532 shown in FIG. 30B are hollowed out and only edges are left may be used. At that time, when the electrodes 531 and the electrodes 532 are too small in width for the users to see, the electrodes 531 and the electrodes 532 can be formed using a light-blocking material such as a metal or an alloy, as described later. In addition, either the electrodes 531 or the electrodes 532 shown in FIG. 30D may include the above bridge electrodes 534.

One of the electrodes 531 is electrically connected to one of the wirings 541. One of the electrodes 532 is electrically connected to one of the wirings 542.

When a touch panel is formed in such a manner that the touch sensor 595 is stacked over a display surface of the display panel, a light-transmitting conductive material is preferably used for the electrodes 531 and the electrodes 532. In the case where a light-transmitting conductive material is used for the electrodes 531 and the electrodes 532 and light from the display panel is extracted through the electrodes 531 or the electrodes 532, it is preferable that a conductive film containing the same conductive material be arranged between the electrodes 531 and the electrodes 532 as a dummy pattern. Part of a space between the electrodes 531 and the electrodes 532 is filled with the dummy pattern, which can reduce variation in light transmittance. As a result, unevenness in luminance of light transmitted through the touch sensor 595 can be reduced.

As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide. As a reducing method, a method with application of heat or the like can be employed.

Further, a metal film or an alloy film which is thin enough to have a light-transmitting property can be used. For example, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material or the alloy material (e.g., titanium nitride), or the like may be used. Alternatively, a stacked film in which two or more of conductive films containing the above materials are stacked may be used.

For the electrodes 531 and the electrodes 532, a conductive film which is processed to be too thin to see by the users may be used. Such a conductive film is processed into a lattice shape (a mesh shape), for example, which makes it possible to achieve high conductivity and high visibility of the display device. It is preferable that the conductive film have a portion in which the width is greater than or equal to 30 nm and less than or equal to 100 µm, preferably greater than or equal to 50 nm and less than or equal to 50 µm, and further preferably greater than or equal to 50 nm and less than or equal to 20 µm. In particular, the conductive film having the pattern width of 10 µm or less is extremely difficult to see by the users, which is preferable.

Figure 31A:
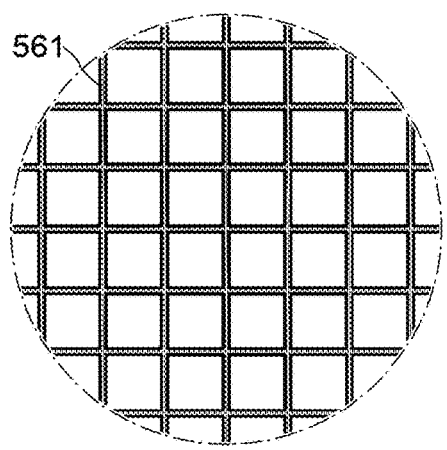
FIGS. 31A to 31D illustrate a structure example of a touch panel according to one embodiment.

As examples, enlarged schematic views of part of the electrodes 531 or the electrodes 532 (part in a ring formed by a dashed-dotted line in FIG. 30B) are shown in FIGS. 31A to 31D. FIG. 31A shows an example of the case in which a lattice-shape conductive film 561 is used. The lattice-shape conductive film 561 is preferably placed so as not to overlap the display element included in the display device because light from the display device is not blocked. In that case, it is preferable that the direction of the lattice be provided so as to be the same as the direction of the display element arrangement and that the pitch of the lattice be an integer multiple of the pitch of the display element arrangement.

Figure 31B:
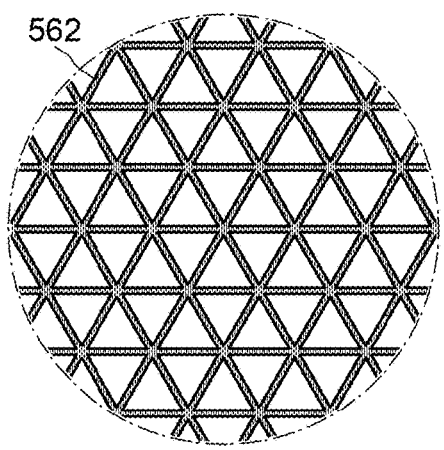

FIG. 31B shows an example of a lattice-shape conductive film 562, which is processed so as to be provided with triangle openings. Such a structure makes it possible to further reduce the resistance compared with the structure shown in FIG. 31A.

Figure 31C:
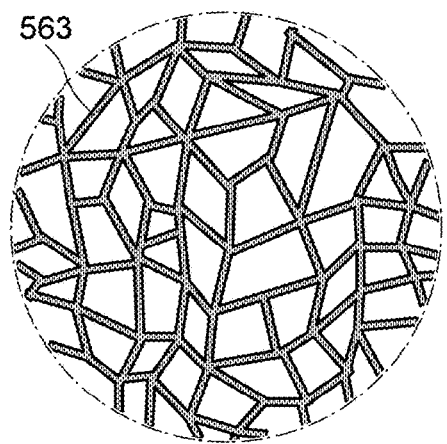

In addition, a conductive film 563, which has an irregular pattern shape, may be used as shown in FIG. 31C. Such a structure can prevent generation of moiré when overlapping with the display portion of the display device. Note that "moiré" refers to a fringe pattern created by diffraction or interference when external light or the like passes through or external light is reflected by narrow conductive films or the like spaced uniformly.

Figure 31D:
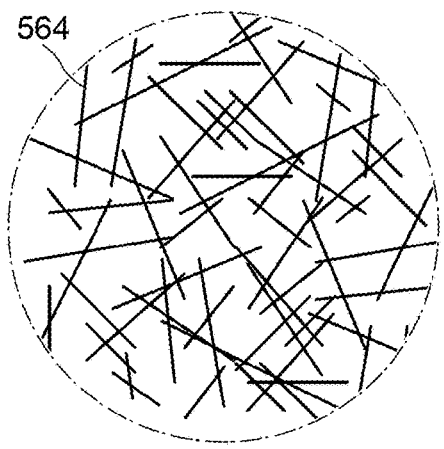

Conductive nanowires may be used for the electrodes 531 and the electrodes 532. FIG. 31D shows an example of the case in which nanowires 564 are used. The nanowires 564 are dispersed at appropriate density so as to be in contact with the adjacent nanowires, which can form a two-dimensional network; therefore, a conductive film with extremely high light-transmitting property can be provided. For example, a nanowire which has a mean value of the diameters of greater than or equal to 1 nm and less than or equal to 100 nm, preferably greater than or equal to 5 nm and less than or equal to 50 nm, further preferably greater than or equal to 5 nm and less than or equal to 25 nm can be used. As the nanowire 564, a metal nanowire such as an Ag nanowire, a Cu nanowire, and an Al nanowire, a carbon nanotube, or the like can be used. In the case of using an Ag nanowire, for example, light transmittance of 89% or more and a sheet resistance of 40 ohm/square or more and 100 ohm/square or less can be achieved.

Although examples in which a plurality of rhombuses are aligned in one direction are shown in FIG. 30A and the like as top surface shapes of the electrodes 531 and the electrodes 532, the shapes of the electrodes 531 and the electrodes 532 are not limited thereto and can have various top surface shapes such as a belt shape (a rectangular shape), a belt shape having a curve, and a zigzag shape. In addition, although the above shows the electrodes 531 and the electrodes 532 are arranged to be perpendicular to each other, they are not necessarily arranged to be perpendicular and the angle formed by two of the electrodes may be less than 90°.

Figure 32A:
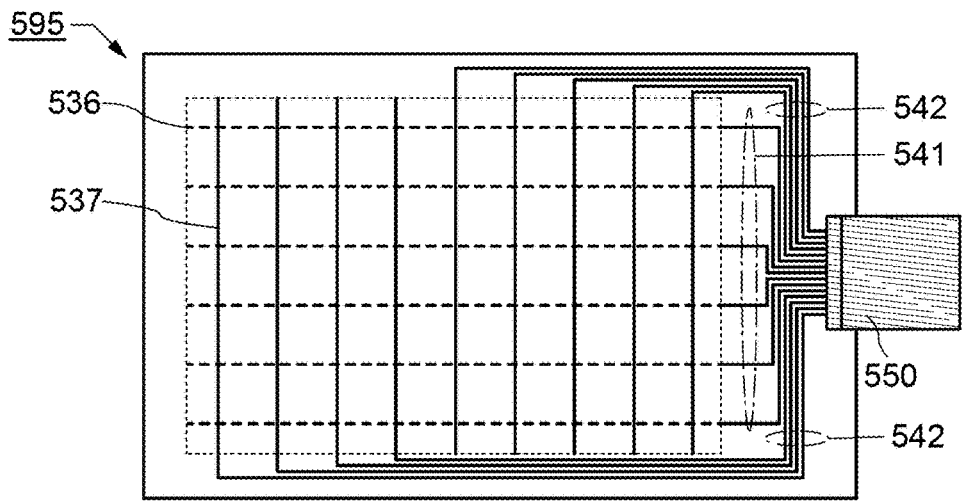
FIGS. 32A to 32C illustrate a structure example of a touch panel according to one embodiment.
Figure 32B:
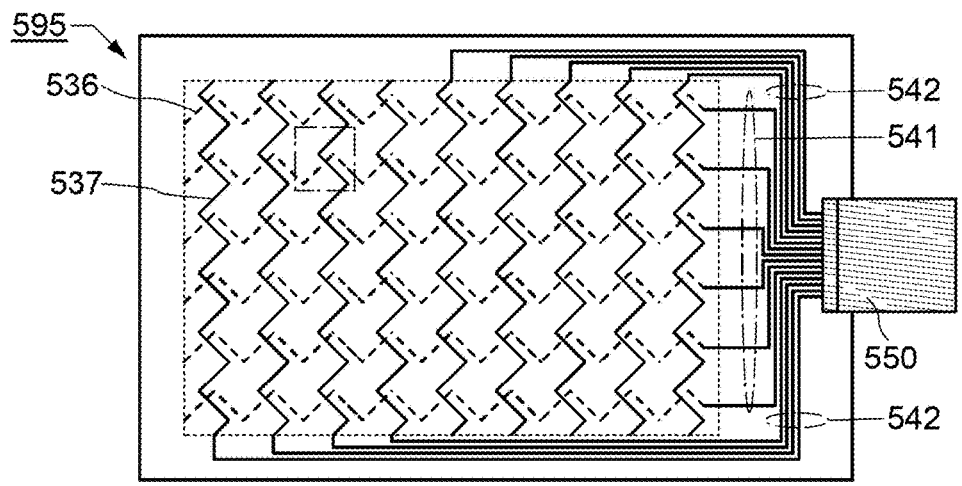
Figure 32C:
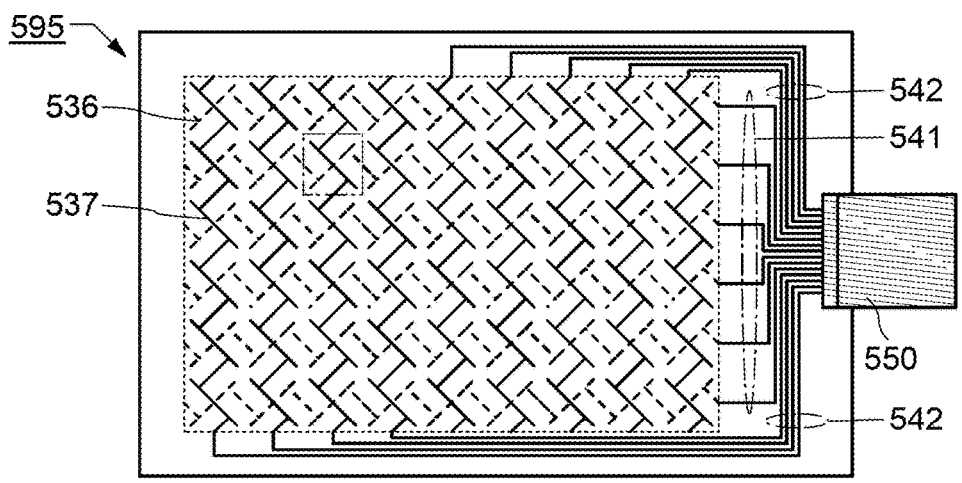

FIGS. 32A to 32C illustrate examples of the case where electrodes 536 and electrodes 537, which have a top surface shape of thin lines, are used instead of the electrodes 531 and the electrodes 532. FIG. 32A shows an example in which linear electrodes 536 and 537 are arranged so as to form a lattice shape.

FIG. 32B shows an example in which the electrodes 536 and the electrodes 537 have a top surface shape of a zigzag shape. As shown in FIG. 32B, the electrodes 536 and the electrodes 537 are arranged so as not to cross the straight-line portions at the centers but so as to place the centers of the straight-line portions in different positions from each other; therefore, the length of closely facing parallel parts of the electrodes 536 and the electrodes 537 can be longer. This is preferable because the capacitance between the electrodes can be increased and the sensitivity can be increased. Alternatively, as shown in FIG. 32C, the electrodes 536 and the electrodes 537 are arranged so as to have a design in which part of the straight-line portion of a zigzag shape is projected, which can increase the capacitance between the electrodes because the length of the parts facing each other can be longer even when the centers of the straight-line portions are placed in the same position.

Figure 33A:
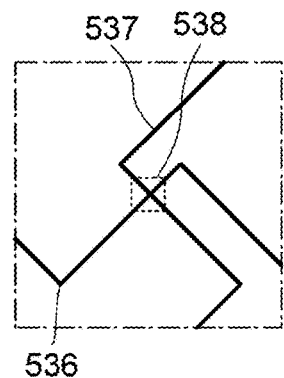
FIGS. 33A to 33F illustrate a structure example of a touch panel according to one embodiment.
Figure 33B:
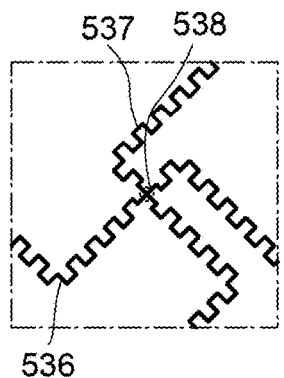
Figure 33C:
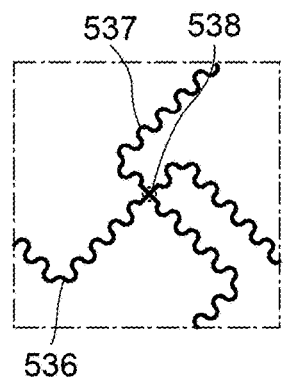
Figure 33D:
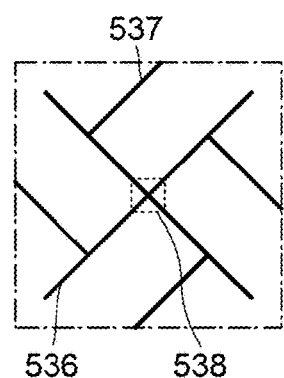
Figure 33E:
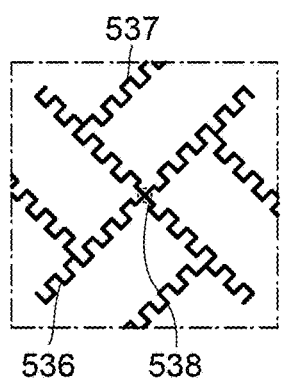
Figure 33F:
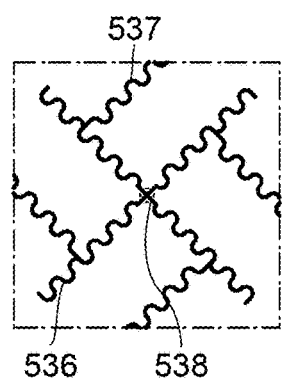

FIGS. 33A to 33C show enlarged views of a region surrounded by a dashed dotted line in FIG. 32B, and FIGS. 33D to 33F show enlarged views of a region surrounded by a dashed dotted line in FIG. 32C. In these drawings, the electrodes 536, the electrodes 537, and intersection portions 538 at which the electrodes 536 and the electrodes 537 intersect are illustrated. The straight-line portions of the electrodes 536 and the electrodes 537 shown in FIGS. 33A and 33D may have a serpentine shape that meanders with angled corners as shown in FIGS. 33B and 33E or may have a serpentine shape that continuously meanders as shown in FIGS. 33C and 33F.

The above is the description of Structure Example of Touch Sensor.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light depending on a current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, a display medium whose contrast, luminance, reflectance, transmittance, or the like is changed by an electric or magnetic effect may be included. Examples of a display device using an EL element include an EL display. Display devices using electron emitters include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, Electronic Liquid Powder (registered trademark), or electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. Such provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

In this specification and the like, an active matrix method in which an active element is included in a pixel or a passive matrix method in which an active element is not included in a pixel can be used, for example.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Since the size of the element is small, the aperture ratio can be improved, so that power consumption can be reduced or higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Since an active element (a non-linear element) is not used, the aperture ratio can be improved, so that power consumption can be reduced or higher luminance can be achieved, for example.

Note that an example of the case where a variety of display is performed using the display panel is shown here; however, one embodiment of the present invention is not limited thereto. For example, data is not necessarily displayed. As an example, the display panel may be used as a lighting device. By using the display panel as a lighting device, it can be used as interior lighting having an attractive design. Alternatively, it can be used as lighting with which various directions can be illuminated. Further alternatively, it may be used as a light source, for example, a backlight, a front light, or the like. In other words, it may be used as a lighting device for the display panel.

At least part of this embodiment can be implemented in combination with any of the embodiments described in this specification as appropriate.

Embodiment 5

A power feeding system capable of feeding power to a battery of the display unit and the like of one embodiment of the present invention will be described.

In one embodiment of the present invention, power may be fed to a battery by a method for feeding power to an object (hereinafter, also referred to as a power receiving device) in a state where contact with a power supply source (hereinafter, also referred to as a power transmitting device) is not made (such a method is also referred to as contactless power feeding, wireless feeding, or the like). Examples of the contactless power feeding include a magnetic resonance method, an electromagnetic induction method, an electrostatic induction method, and the like.

In this embodiment, a power feeding system using a magnetic resonance method is described as an example. The magnetic resonance method is a method for forming an energy propagation path by providing resonator coupling between resonance coils each of which is provided in a power transmitting device and a power receiving device. The magnetic resonance method has a longer power transmittable distance than other methods capable of contactless power feeding (e.g., an electromagnetic induction method and an electrostatic induction method).

Here, input impedance of the power receiving device can change depending on the charge condition of the battery. That is, the input impedance of the power receiving device can change dynamically during the power feeding. In that case, when output impedance of a power transmitting device is constant, an impedance mismatch is inevitably caused. Thus, in the power feeding by a magnetic resonance method, it may be difficult to maintain power feeding efficiency at a high level during the power feeding.

Thus, the power receiving device of one embodiment of the present invention includes a DC-DC converter configured to detect a voltage (a former voltage) proportional to a direct-current voltage input from the outside and a voltage (a latter voltage) proportional to a current input from the outside and to hold a ratio of the former voltage and the latter voltage constant on the basis thereof.

Specifically, in the DC-DC converter included in the power receiving device of one embodiment of the present invention, the ratio of the first voltage proportional to an input voltage (the first direct-current voltage) and the second voltage proportional to an input current (the current generated in the load) is held constant, whereby input impedance can be kept constant. Furthermore, impedance conversion can be performed in the DC-DC converter. Thus, in the case where a battery to which power is supplied exists on an output side of the DC-DC converter, input impedance of the DC-DC converter can be kept constant regardless of the charging state of the battery. Accordingly, when power is supplied to a power receiving device including the DC-DC converter and the battery by a magnetic resonance method, power feeding efficiency can be kept high during the power feeding.

[Power Feeding System]

Figure 34A:
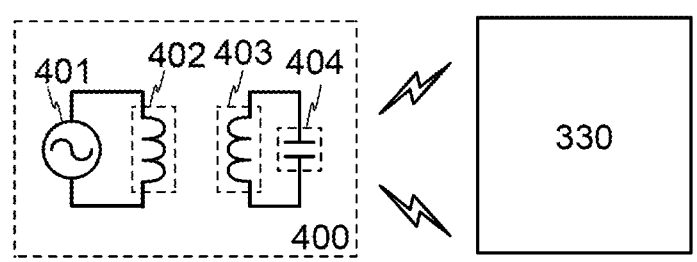
FIGS. 34A and 34B illustrate a structure example of a power feeding system and a power receiving system according to one embodiment.

FIG. 34A illustrates a configuration example of a power feeding system where power feeding is performed by a magnetic resonance method. The power feeding system illustrated in FIG. 34B includes a power transmitting device 400 and a power receiving device 330 illustrated in FIG. 34A. Further, the power transmitting device 400 includes a high-frequency power supply 401, a coil 402 to which a high-frequency voltage generated by the high frequency power supply 401 is applied, and a resonance coil 403 in which a high-frequency voltage is induced by electromagnetic induction with the coil 402. Note that, in the resonance coil 403, stray capacitance 404 exists between wirings forming the resonance coil 403. Note that as illustrated in FIG. 34A, it is preferable that the resonance coil 403 be not directly connected to other components.

[Power Receiving Device]

Figure 34B:
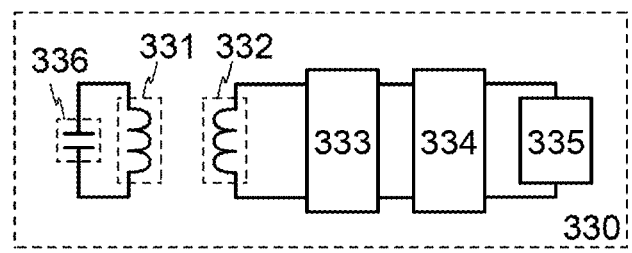

FIG. 34B is a diagram illustrating a configuration example of a power receiving device in which power feeding is performed by a magnetic resonance method. A power receiving device 330 illustrated in FIG. 34B includes a resonance coil 331 in which a high-frequency voltage is induced by magnetic resonance, a coil 332 in which a high-frequency voltage is induced by electromagnetic induction with the resonance coil 331, a rectifier circuit 333 for rectifying the high-frequency voltage induced by the coil 332, a DC-DC converter 334 to which a direct-current voltage output from the rectifier circuit 333 is input, and a battery 335 in which power feeding is performed utilizing the direct-current voltage output from the DC-DC converter. Note that, in the resonance coil 331, stray capacitance 336 exists between wirings forming the resonance coil 331.

Note that as illustrated in FIG. 34B, it is preferable that the resonance coil 331 be not directly connected to another component. If another component is directly connected to the resonance coil 331, the series resistance and capacitance of the resonance coil 331 are increased. In this case, a Q value of a circuit including the resonance coil 331 and another component is lower than that of a circuit only including the resonance coil 331. This is because the configuration where the resonance coil 331 is directly connected to another component has lower power feeding efficiency than the configuration where the resonance coil 331 is not directly connected to another component.

The DC-DC converter 334 is capable of keeping input impedance constant. Further, the input impedance of the DC-DC converter 334 does not depend on the impedance of the battery 335 which exists on the output side. In other words, impedance conversion is performed by the DC-DC converter 334. Thus, the input impedance of the DC-DC converter 334 also serves as the input impedance of the power receiving device 330. Accordingly, input impedance of the power receiving device 330 does not vary even in the case where the impedance of the battery 335 varies in accordance with the charging state of the battery 335. As a result, power feeding with high power feeding efficiency is achieved regardless of the charging state of the battery 335 in the power receiving device 330.

In the power feeding system illustrated in FIG. 34A, the power receiving device 330 illustrated in FIG. 34B is used as a power receiving device. Thus, in the power feeding system in FIG. 34A, power feeding can be performed regardless of variations in input impedance of the power receiving device. That is, in the power feeding system illustrated in FIG. 34A, power feeding with high power feeding efficiency can be performed without a dynamic change in the power feeding condition.

Next, a structure example of a DC-DC converter which can be used as the DC-DC converter 334 is described.

[Structure Example of DC-DC Converter]

Figure 35A:
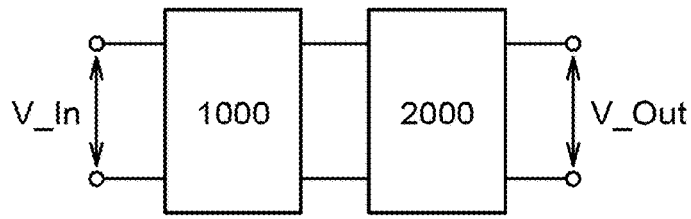
FIG. 35A to 35D illustrate a structure example of a DC-DC converter according to one embodiment.

FIG. 35A illustrates a structure example of the DC-DC converter. The DC-DC converter in FIG. 35A includes an input power detection unit 1000 to which a direct-current voltage (V_In) is input and a voltage conversion unit 2000 that converts the direct-current voltage (V_In) into a direct-current voltage (V_Out) and outputs the direct-current voltage (V_Out).

Figure 35B:
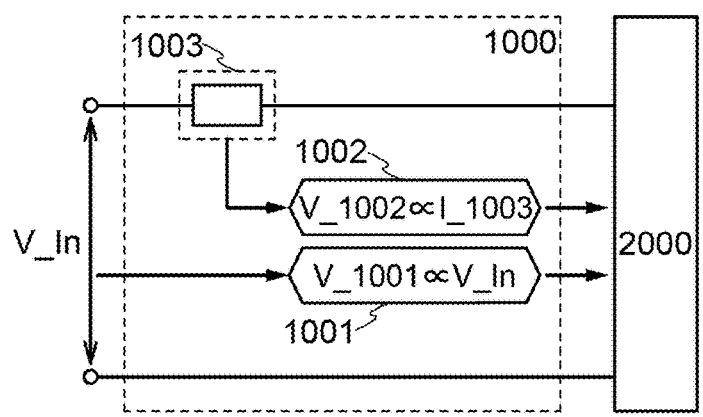
Figure 35C:
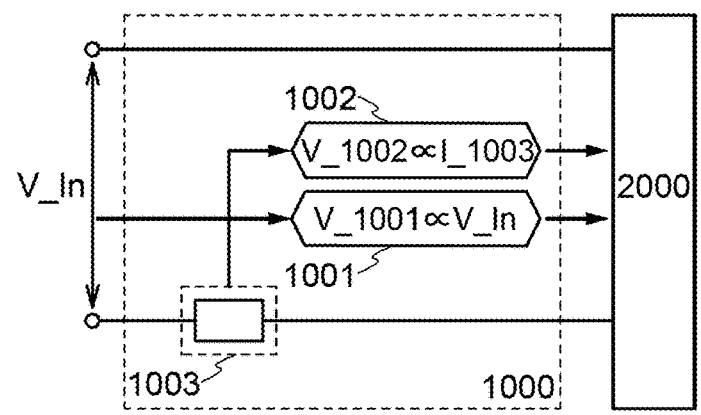

FIGS. 35B and 35C each illustrate a configuration example of the input power detection unit 1000 in FIG. 35A. The input power detection unit 1000 illustrated in FIG. 35B includes a load 1003 whose one end is electrically connected to a high-potential-side input node and whose the other end is electrically connected to the voltage conversion unit 2000, a means 1001 that detects a voltage (V_1001) proportional to the direct-current voltage (V_In), and a means 1002 that detects a voltage (V_1002) proportional to a current (I_1003) generated in the load 1003. Note that the voltage (V_1001) detected by the means 1001 and the voltage (V_1002) detected by the means 1002 are input to the voltage conversion unit 2000. Note that the input power detection unit 1000 illustrated in FIG. 35C has the same configuration as the input power detection unit 1000 illustrated in FIG. 35B except that one end of the load 1003 is electrically connected to a low-potential-side input node. In one embodiment of the present invention, as illustrated in FIGS. 35B and 35C, the load 1003 included in the input power detection unit 1000 is provided so as to be electrically connected to either the high-potential-side input node or the low-potential-side input node.

Figure 35D:
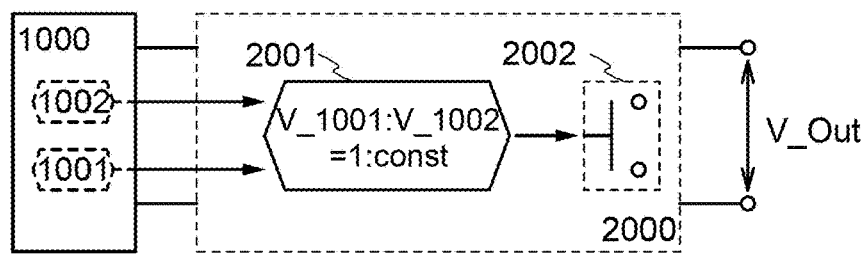

FIG. 35D illustrates a configuration example of the voltage conversion unit 2000 in FIG. 35A. The voltage conversion unit 2000 in FIG. 35D includes a switch 2002 that controls a current generated in the load 1003 by switching and a means 2001 that controls the switching of the switch 2002 in accordance with the voltage (V_1001) and the voltage (V_1002).

Note that as the voltage conversion unit 2000 illustrated in FIG. 35D, a circuit including the means 2001 and a voltage conversion circuit such as a step-up converter, a flyback converter, or an inverting converter is used, and a switch included in the voltage conversion circuit is applicable to the switch 2002.

In the DC-DC converter illustrated in FIG. 35A, even in the case where an input voltage (an input direct-current voltage (V_In)) varies, input impedance can be kept constant by the control of an input current (the current (I_1003) generated in the load 1003). Specifically, in the DC-DC converter illustrated in FIGS. 35A to 35D, the current I_1003) generated in the load 1003 can be controlled by the switching of the switch 2002. Further the switching of the switch 2002 is controlled by the means 2001. Here, the means 2001 controls the switching of the switch 2002 in accordance with the voltage (V_1001) detected by the means 1001 and the voltage (V_1002) detected by the means 1002. That is, the means 2001 controls the switching of the switch 2002 in accordance with the voltage (V_1001) proportional to the input voltage and the voltage (V_1002) proportional to the input current. Thus, in the DC-DC converter illustrated in FIGS. 35A to 35D, input impedance can be kept constant by such a design that the ratio of the voltage (V_1001) and the voltage (V_1002) is held constant by the switching of the switch 2002 controlled by the means 2001.

[Example of DC-DC Converter]

Figure 36A:
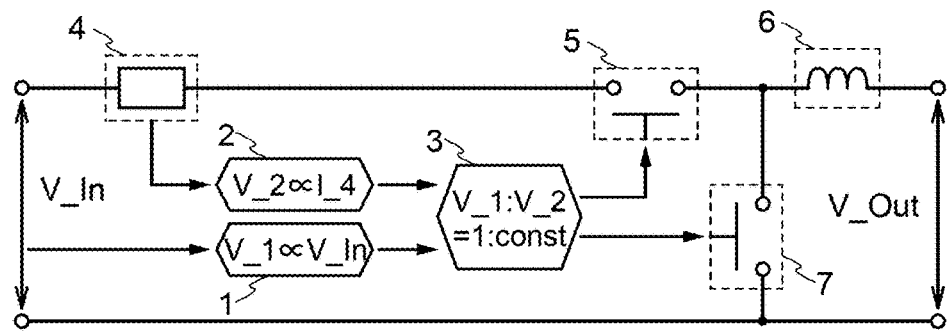
FIG. 36A to 36D illustrate a structure example of a DC-DC converter according to one embodiment.

FIG. 36A illustrates an example of a DC-DC converter according to one embodiment of the present invention. The DC-DC converter illustrated in FIG. 36A includes a load 4 whose one end is electrically connected to a high-potential-side input node, a switch 5 whose one end is electrically connected to the other end of the load 4, an inductor 6 whose one end is connected to the other end of the switch 5 and whose the other end is electrically connected to a high-potential-side output node, and a switch 7 whose one end is electrically connected to the other end of the switch 5 and the one end of the inductor 6 and whose the other end is electrically connected to a low-potential-side input node and a low-potential-side output node (hereinafter this state is also referred to as "grounded"). Note that a resistance load, an inductive load, or the like can be used as the load 4. Further, a transistor, a relay, or the like can be used as the switch 5 and the switch 7. Further, an air core coil, a core coil, or the like can be used as the inductor 6.

Further, the DC-DC converter illustrated in FIG. 36A includes a means 1 which detects a voltage (V_1) proportional to an input direct-current voltage (V_In), a means 2 which detects a voltage (V_2) proportional to a current (I_4) generated in the load 4, and a means 3 which holds the ratio of the voltage (V_1) and the voltage (V_2) constant by controlling switching of the switch 5 in accordance with the voltage (V_1) and the voltage (V_2), turns off the switch 7 in a period when the switch 5 is turned on, and turns on the switch 7 in a period when the switch 5 is turned off.

In the DC-DC converter illustrated in FIG. 36A, the current (I_4) generated in the load 4 becomes zero in the period when the switch 5 is turned off; then, the current (I_4) generated in the load 4 increases with time in the period following the change of the switch from the off state to the on state. This is due to self-induction of the inductor 6, and an average value of the current (I_4) that is generated in the load 4 and increases with time converges at a constant value. Thus, in the DC-DC converter illustrated in FIG. 36A, the amount of current to be output can be controlled by the switching of the switch 5.

In the DC-DC converter illustrated in FIG. 36A, the switching of the switch 5 by the means 3 is controlled in accordance with the voltage (V_1) detected by the means 1 and the voltage (V_2) detected by the means 2. Here, the means 1 is a means which detects a voltage proportional to an input voltage (voltage at an input node) and the means 2 is a means which detects a voltage proportional to an input current (current generated in the load 4). Thus, the means 3 controls the switching of the switch 5 so as to hold the ratio of the voltage (V_1) and the voltage (V_2) constant, so that input impedance of the DC-DC converter illustrated in FIG. 36A can be kept constant.

In the DC-DC converter illustrated in FIG. 36A, the switch 7 is provided so as to prevent a breakdown of the switch 5. Specifically, in the case where the switch 5 changes from an on state to an off state, current continuously flows through the inductor 6 due to self-induction of the inductor 6. If the switch 7 is not provided, a sharp rise or drop in the potential of the node to which the other end of the switch 5 and the one end of the inductor 6 are electrically connected may occur when the switch 5 changes from an on state to an off state. Thus, in that case, a high voltage is applied to the switch 5. As a result, the switch 5 may be broken down. On the other hand, in the DC-DC converter illustrated in FIG. 36A, a current path generated in the inductor 6 can be secured by the switch 7 turned on. That is, the breakdown of the switch 5 can be prevented.

[Specific Example of Means 1]

Figure 36B:
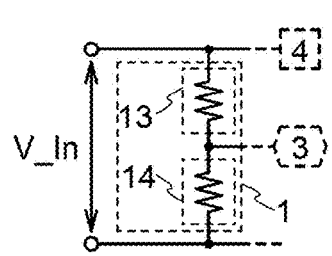

As the means 1, a circuit illustrated in FIG. 36B can be used. The circuit illustrated in FIG. 36B includes a resistor 13 whose one end is electrically connected to the high-potential-side input node and a resistor 14 whose one end is electrically connected to the other end of the resistor 13 and whose the other end is grounded. Further, the potential of a node where the other end of the resistor 13 and the one end of the resistor 14 are electrically connected to each other is input to the means 3. That is, the circuit illustrated in FIG. 36B is a circuit which detects the voltage (V_1) proportional to the input voltage (V_In) utilizing resistance voltage division and outputs the voltage (V_1) to the means 3.

[Specific Example of Means 2]

Figure 36C:
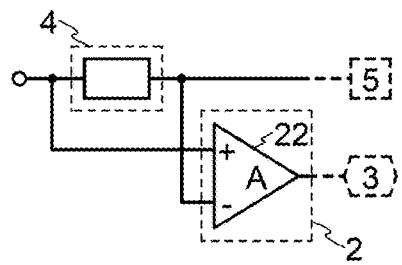

The circuit illustrated in FIG. 36C can be used as the means 2. The circuit illustrated in FIG. 36C includes an instrumentation amplifier 22 to which a voltage of the one end of the load 4 is input as a non-inverting input signal and a voltage of the other end of the load 4 is input as an inverting input signal. The instrumentation amplifier 22 outputs to the means 3 a voltage proportional to a difference between the voltage input to a non-inverting input terminal and the voltage input to an inverting input terminal. That is, the instrumentation amplifier 22 outputs to the means 3 a voltage proportional to the voltage applied between both ends of the load 4. Note that since the voltage applied between the both ends of the load 4 is proportional to the current (I_4) generated in the load 4, it can also be said that the instrumentation amplifier 22 outputs the current (I_4) generated in the load 4 to the means 3. That is, in the circuit illustrated in FIG. 36C, the instrumentation amplifier 22 detects the voltage (V_2) proportional to the current (I_4) generated in the load 4 and outputs the voltage (V_2) to the means 3.

[Specific Example of Means 3]

Figure 36D:
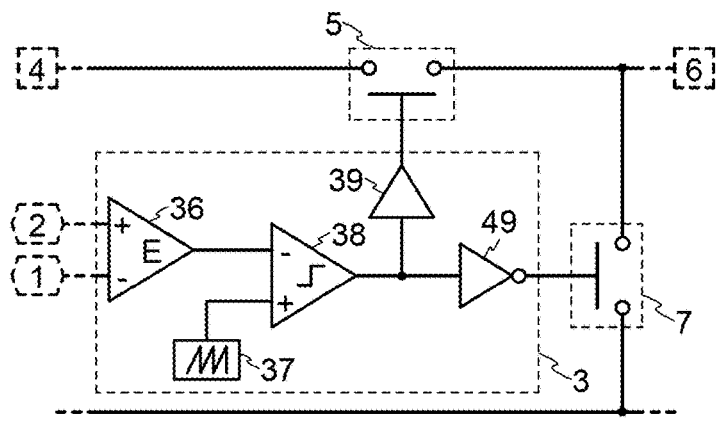

The circuit illustrated in FIG. 36D can be used as the means 3. The circuit illustrated in FIG. 36D includes an error amplifier 36 to which the voltage (V_2) detected by the means 2 and the voltage (V_1) detected by the means 1 are input as a non-inverting input signal and an inverting input signal, respectively; a triangle wave oscillator 37; a comparator 38 to which a voltage (triangle wave) output from the triangle wave oscillator 37 and a voltage output from the error amplifier 36 are input as a non-inverting input signal and an inverting input signal, respectively; a buffer 39 to which a voltage output from the comparator 38 is input and which controls the switching of the switch 5 by outputting a voltage which has the same phase as that of the voltage output from the comparator 38; and an inverter 49 which controls switching of the switch 7 by outputting a voltage that has a phase opposite to that of the voltage output from the comparator 38. Note that a configuration in which the switching of the switch 5 is directly controlled by the voltage output from the comparator 38 (a configuration in which the buffer 39 is omitted from the means 3 in FIG. 36D) can also be employed.

The error amplifier 36 amplifies a difference between the voltage input to the non-inverting input terminal and the voltage input to the inverting input terminal and outputs the amplified difference. That is, the error amplifier 36 amplifies the difference between the voltage (V_2) and the voltage (V_1) and outputs the amplified difference.

The comparator 38 compares the voltage input to the non-inverting input terminal and the voltage input to the inverting input terminal, and outputs a binary voltage. Specifically, a voltage at a high level is output in a period where the voltage output from the error amplifier 36 is lower than the triangle wave, and a voltage at a low level is output in a period where the voltage output from the error amplifier 36 is higher than the triangle wave. That is, the lower the voltage output from the error amplifier 36 is, the higher the duty cycle of the output signal of the comparator 38 becomes. The amount of current output from the DC-DC converter is determined in accordance with the duty cycle. Specifically, the higher the duty cycle is, the larger the current (the current (I_4) generated in the load 4) output from the DC-DC converter becomes. That is, the lower the voltage output from the error amplifier 36 is, the larger the current (I_4) generated in the load 4 becomes.

Here, the voltage output from the error amplifier 36 changes in accordance with the voltage (V_1) that is detected by the means 1 and is proportional to the input voltage (V_In) and the voltage (V_2) that is detected by the means 2 and is proportional to the current (I_4) generated in the load 4. For example, when the input voltage (V_In) becomes higher, the voltage output from the error amplifier 36 is lowered. In other words, when the input voltage (V_In) becomes higher, the duty cycle of the output signal of the comparator 38 becomes higher. Accordingly, in the circuit illustrated in FIG. 36D, the duty cycle of the output signal of the comparator 38 becomes high when the input voltage (V_In) becomes high; thus, the current (I_4) generated in the load 4 also becomes large. In short, in the circuit illustrated in FIG. 36D, the value of the current (I_4) generated in the load 4 can be changed in accordance with the variation in the value of the input voltage (V_In). Thus, in the circuit illustrated in FIG. 36D, by adjusting the design condition, the ratio of the voltage (V_1) that is detected by the means 1 and is proportional to the input voltage and the voltage (V_2) that is detected by the means 2 and is proportional to the current (I_4) generated in the load 4 can be held constant.

[Modification Example of DC-DC Converter]

Figure 37A:
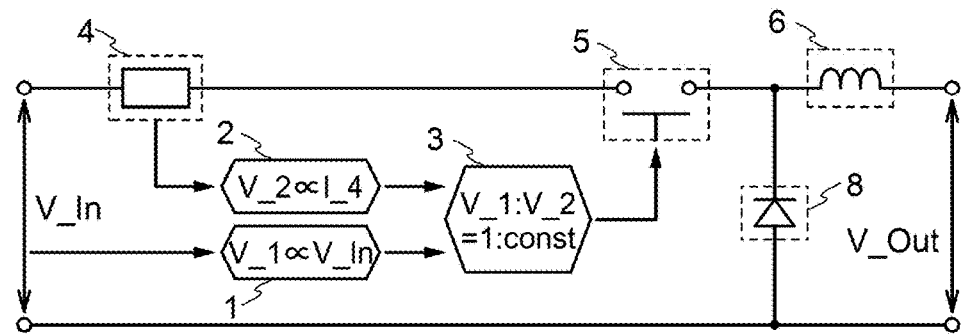
FIG. 37A to 37C illustrate a structure example of a DC-DC converter according to one embodiment.

The DC-DC converter illustrated in FIG. 37A has a structure in which the switch 7 of the DC-DC converter illustrated in FIG. 36A is replaced with a diode 8. The DC-DC converter illustrated in FIG. 37A has the same function and effect as those in FIG. 36A.

Figure 37B:
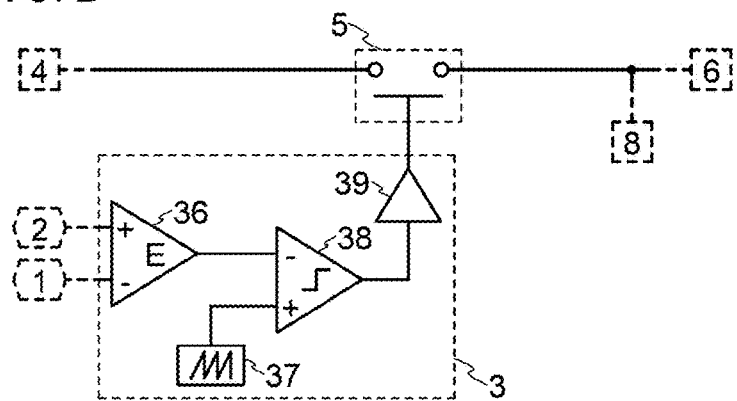

Note that in the DC-DC converter illustrated in FIG. 37A, the circuit illustrated in FIG. 36B can be used as the means 1, and the circuit illustrated in FIG. 36C can be used as the means 2. Further, the circuit illustrated in FIG. 37B can be used as the means 3. In short, the circuit illustrated in FIG. 37B has a configuration in which the inverter 49 is omitted from the circuit illustrated in FIG. 36D.

Figure 37C:
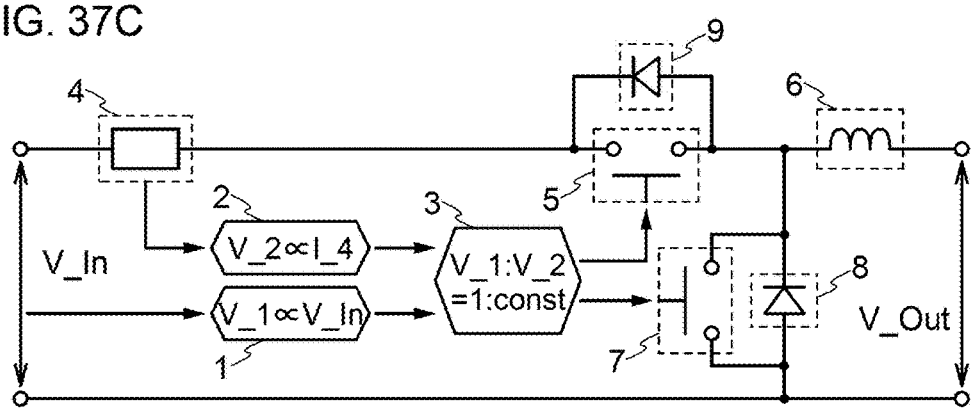

Further, as illustrated in FIG. 37C, a DC-DC converter in which the diode 8 illustrated in FIG. 37A and a diode 9 whose anode is electrically connected to the other end of the switch 5, the one end of the inductor 6, the one end of the switch 7, and a cathode of the diode 8, and whose cathode is electrically connected to the other end of the load 4 and the one end of the switch 5 are added to the DC-DC converter illustrated in FIG. 36A may be used. Accordingly, an effect of suppressing breakdown of the switch 5 can be enhanced.

A DC-DC converter in which only the diode 8 or 9 is omitted from the DC-DC converter illustrated in FIG. 37C may be used as the DC-DC converter 334.

At least part of this embodiment can be implemented in combination with any of the embodiments described in this specification as appropriate.

Embodiment 6

Described below are application examples of the display panel, the display device, the display unit, or the display system of one embodiment of the present invention.

Figure 38A:
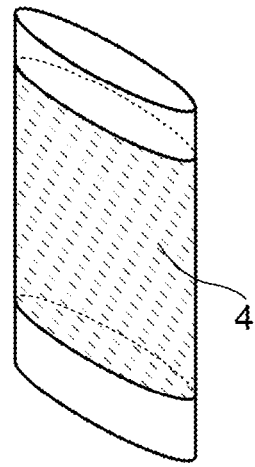
FIGS. 38A to 38E illustrate application examples of a display device or the like according to one embodiment.
Figure 38B:
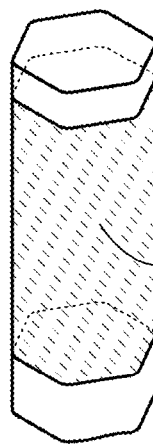
Figure 38C:
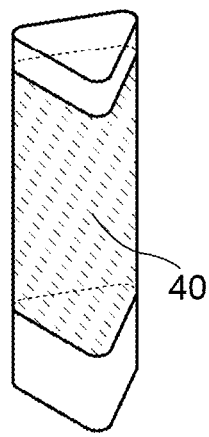
Figure 38D:
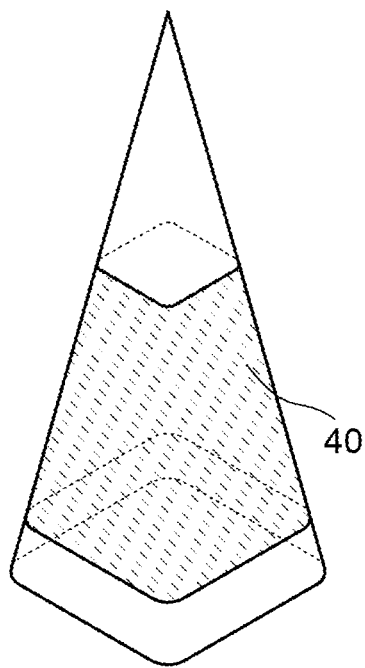
Figure 38E:
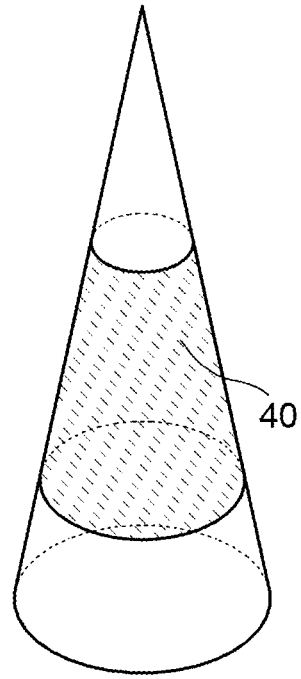

Although the display region is formed along the outer or inner curved side surface of a column in the non-limiting examples, the display region can be applied to 3D objects. The display region 40 is formed on the side surface of a columnar body having an oval bottom surface in FIG. 38A, a rounded hexagonal bottom surface in FIG. 38B, and a rounded triangle bottom surface in FIG. 38C. The display region 40 is formed on the side surface of a cone having a rounded square bottom surface in FIG. 38D and the side surface of a cone in FIG. 38E.

Figure 39A:
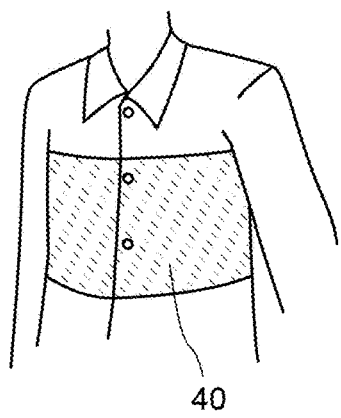
FIGS. 39A to 39C illustrate application examples of a display device or the like according to one embodiment.
Figure 39B:
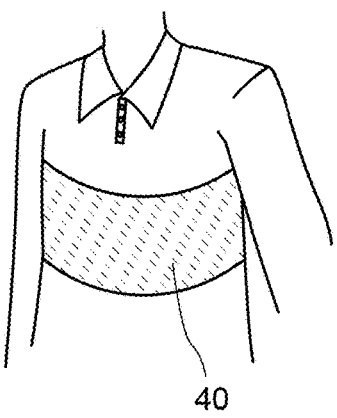
Figure 39C:

FIGS. 39A to 39C are examples in which the display regions 40 are formed on clothes. The display region 40 is formed on a shirt in FIG. 39A, in which case a seamless display region can be formed by fastening the buttons. The display region 40 is formed on a polo shirt in FIG. 39B, in which case a continuous image can be displayed from the front side to the back side of the polo shirt. The display regions 40 are formed around a neck and a cuff of a cut and sewn in FIG. 39C.

Note that the display region 40 can be formed on other clothes without limitation thereon: for example, a top, such as a shirt or a blouse; a bottom, such as slacks or skirt; and a dress or overalls. The display region 40 may also be formed on a muffler, a scarf, a tie, or the like.

When the display region 40 is detached from clothes, only the clothes can be washed so that the display region 40 is prevented from being damaged by the washing. Note that in the case where the display region 40 is washable, the clothes may be washed without detaching the display region 40.

Figure 40A:
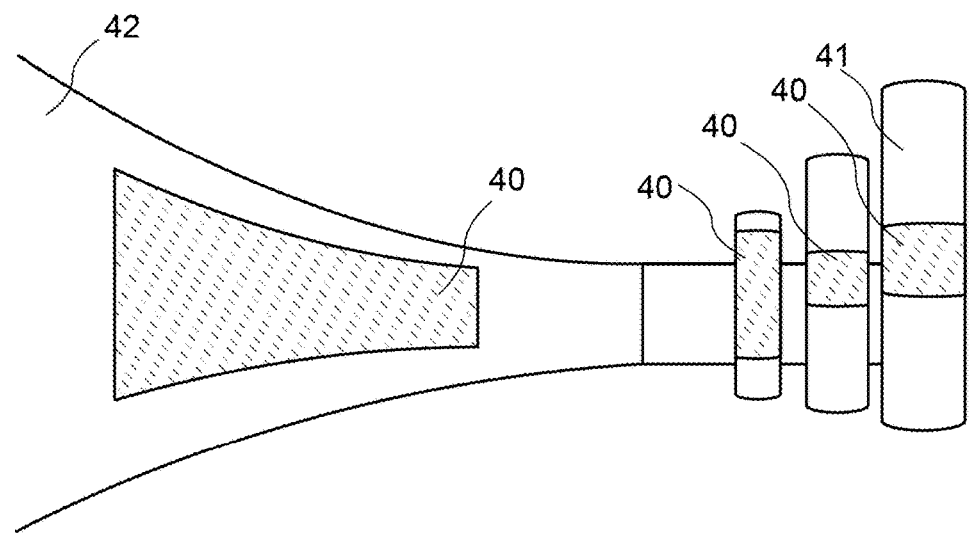
FIGS. 40A and 40B illustrate application examples of a display device or the like according to one embodiment.

FIG. 40A is an example in which a display region is formed on columns 41 and a curved wall 42. The use of a flexible display panel as a display panel in a display region allows formation of the display region along a curved surface.

Figure 40B:
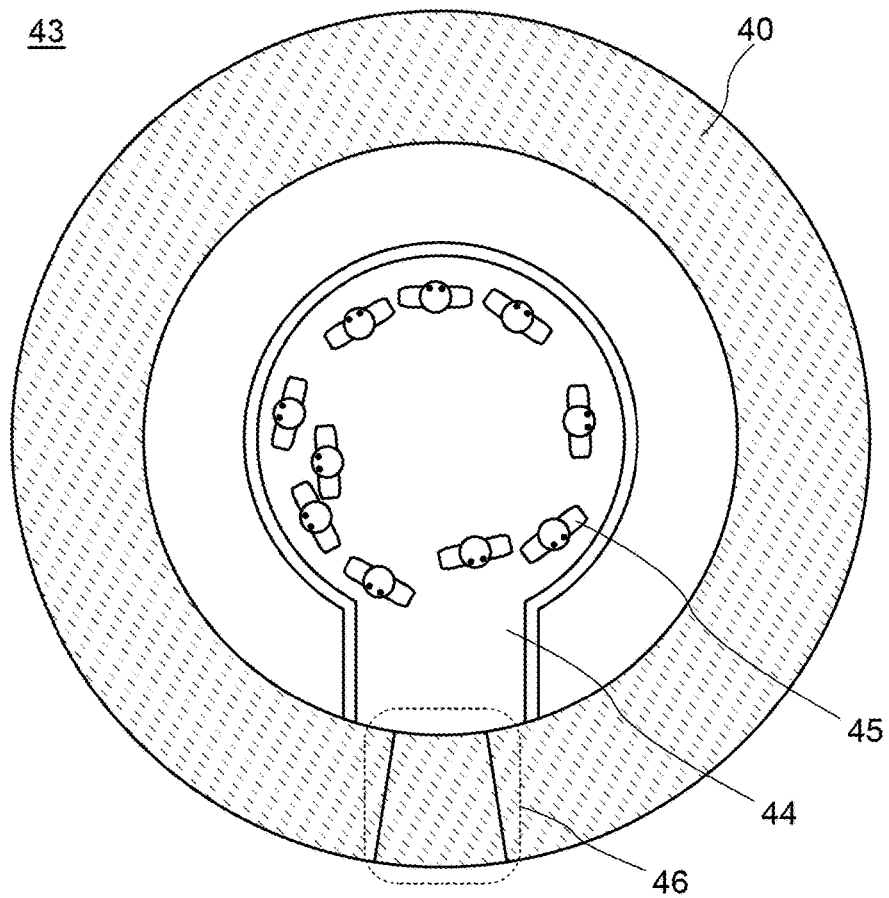

FIG. 40B is a top view of an amusement facility 43 where the ring-shaped display region 40 is used. Visitors 45 can enjoy a 360-degree view of images from a stage 44 surrounded by the display region 40. Furthermore, images can be displayed on the surface of a door 46, leading to an enhancement of a sense of reality.

At least one of the display panel 100, the display device 30, the display unit 20, and the display system 10 can be used for the display region 40, which are embodiments of the present invention.

At least part of this embodiment can be implemented in combination with any of the embodiments described in this specification as appropriate.

[Example]

In this example, the display device including a ring-shaped display region of one embodiment of the present invention was fabricated.

A display panel used for the display device fabricated in this example was formed as follows: over a glass substrate, a tungsten film was formed first as a separation layer, and then, a layer to be separated including an insulating layer, a transistor, a light-emitting element, and the like was formed over the separation layer. Furthermore, a separation layer was formed over another glass substrate, and a layer to be separated including an insulating layer, a coloring layer, a light-blocking layer, and the like was formed over the separation layer. Then, the two substrates were bonded to each other using an adhesive material. The layers to be separated were separated from the respective glass substrates, and flexible substrates were bonded to the layers using an adhesive material. In this manner, the display panel was fabricated.

As the transistor, a transistor including a c-axis aligned crystalline oxide semiconductor (CAAC-OS) was used for a semiconductor layer where a channel is formed. Unlike amorphous semiconductor, the CAAC-OS has few defect states, so that the reliability of the transistor can be improved. Moreover, since the CAAC-OS does not have a grain boundary, a stable and uniform film can be formed over a large area, and stress that is caused by bending a flexible display panel or a display device does not easily make a crack in a CAAC-OS film.

A CAAC-OS is a crystalline oxide semiconductor having c-axis alignment of crystals in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

In this example, a channel-etched transistor including an In—Ga—Zn-based oxide was used. The transistor was fabricated over a glass substrate at a process temperature lower than 500° C.

As the light-emitting element, a tandem (stack) organic EL element emitting white light is used. The light-emitting element has a top emission structure, where light generated by the light-emitting element is extracted to the outside of the display panel through a color filter.

The fabricated display panel had a 13.5-inch-diagonal display portion, 1280×720 pixels, a pixel size of 234 μm×234 μm, a resolution of 108 ppi, and an aperture ratio of 61.1%. The display panel had a frame frequency of 60 Hz, a built-in scan driver, and a COF-mounted source driver. The thickness of the display panel was smaller than or equal to 100 μm.

The fabricated display panel was fixed to the inner or outer surface of a plastic columnar support member. Two kinds of display devices each including a ring-shaped display region were fabricated.

Figure 41A:
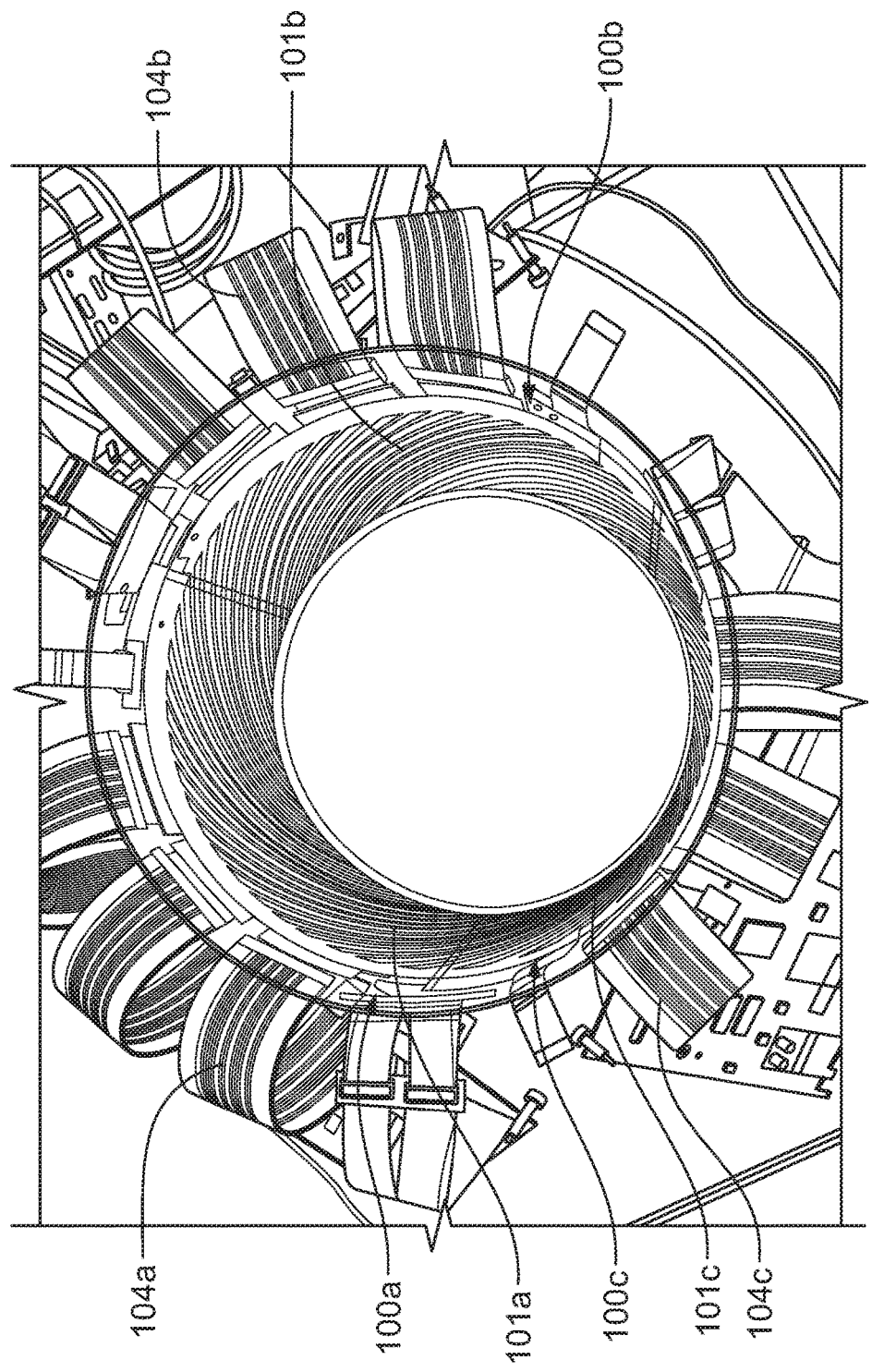

FIG. 41A is a photograph of the fabricated display device including three bonded display panels (display panels 100a, 100*b*, and 100*c*) whose display surfaces face inward. FIG. 41A is a photograph of the display device seen from above. FIG. 41B is a photograph in which FIG. 41A is partly enlarged.

Each display panel 100 is bonded with a plurality of FPCs 104 which is connected to a driving device. The FPCs 104 are bonded on the long side of the display panels.

FIG. 41A is a photograph which was taken when slant stripes were displayed on each of the three display panels in synchronization with each other. As shown, the display device was able to display a ring-shaped seamless image along the inner curved surface of the cylinder.

Each display panel 100 includes the region 110 transmitting visible light and adjacent to the display region. In an overlapping part between two display panels, the region 110 of one display panel which is disposed on the display surface side overlaps with a display region of the other display panel which is disposed on the side opposite to the display surface side. FIG. 41B shows the region 110*a* of the display panel 100*a* overlaps with part of the display region 101*b* of the display panel 100*b*. As shown, a seamless image can be displayed at the joint between the two display panels.

FIG. 41C is a photograph of a display device in which a single display panel 100 is fixed on the outer surface of a cylindrical support member.

In FIG. 41C, the region 110 transmitting visible light of the display panel 100 overlaps with part of the display region 101.

As in the photograph of FIG. 41C, which was taken when vertical stripes were displayed, the display device was able to display a ring-shaped seamless image along the outer curved surface of the cylinder.

As described above, it was confirmed that the display device of one embodiment of the present invention, in which a single or a plurality of display panels forms a ring so that a region transmitting visible light and adjacent to a display region of a display panel overlaps with part of the display region, was able to display ring-shaped seamless images.

This application is based on Japanese Patent Application serial No. 2015-009453 filed with Japan Patent Office on Jan. 21, 2015 and Japanese Patent Application serial No. 2015-040295 filed with Japan Patent Office on Mar. 2, 2015, the entire contents of which are hereby incorporated by reference.

What is claimed is:

1. A display device comprising:
a support having a curved surface;
a first display panel over the support; and
a second display panel over the support,
wherein each of the first display panel and the second display panel comprises a first part and a second part,
wherein the first display panel and the second display panel are flexible,
wherein the first part is configured to display an image,
wherein the second part is configured to transmit visible light,
wherein the first display panel and the second display panel are curved along the curved surface of the support to overlap with each other,
wherein the first part of the first display panel overlaps with the second part of the second display panel, and
wherein the first part of the second display panel overlaps with the second part of the first display panel.

2. The display device according to claim 1, wherein the support has a cylindrical shape.

3. The display device according to claim 1, wherein the first display panel and the second display panel are configured to be detached from the support.

4. A display device comprising:
a support having a curved surface; and
a first display panel to an n-th display panel over the support, where n is an integer of 2 or more,
wherein each of the first display panel to the n-th display panel comprises a first part and a second part,
wherein the first display panel to the n-th display panel are flexible,
wherein the first part is configured to display an image,
wherein the second part is configured to transmit visible light,
wherein the first display panel to the n-th display panel comprise every two adjacent display panels which are curved along the curved surface of the support to partly overlap with each other,
wherein the first part of a k-th display panel, where k is an integer of 1 or more and n−1 or less, overlaps with the second part of an (k+1)-th display panel, and
wherein the first part of the n-th display panel overlaps with the second part of the first display panel.

5. The display device according to claim 4, wherein the support has a cylindrical shape.

6. The display device according to claim 4, wherein the first display panel and the second display panel are configured to be detached from the support.

7. A display unit comprising:
a display panel; and
a support,
wherein the display panel comprises a first part and a second part,
wherein the display panel is flexible,
wherein the first part is configured to display an image,
wherein the second part is configured to transmit visible light,
wherein the support comprises a first surface having a curved surface and an attachment mechanism on a side opposite to the first surface,
wherein the attachment mechanism is configured to fix the support to a frame,
wherein the display panel is fixed along the first surface of the support, and
wherein the second part of the display panel partly extends beyond the support.

8. The display unit according to claim 7, further comprising:
a flexible printed circuit; and
a driving device,
wherein the driving device is configured to output a first signal to the display panel,
wherein the driving device is fixed to the support other than the first surface, and
wherein the driving device is electrically connected to the display panel through the flexible printed circuit.

9. The display unit according to claim 8, further comprising a power receiving device,
wherein the power receiving device comprises a power receiving resonance coil, a power receiving coil, a rectifier circuit, a DC-DC converter, and a battery,
wherein the power receiving resonance coil is configured to induce a high-frequency voltage by magnetic resonance,
wherein the power receiving coil is configured to induce a high-frequency voltage by electromagnetic induction with the power receiving resonance coil, wherein the rectifier circuit is configured to rectify the high-frequency voltage induced by the power receiving coil, wherein the DC-DC converter is configured to receive a direct current voltage that is output from the rectifier circuit, and wherein the battery is configured to feed power using the direct current voltage that is output from the DC-DC converter.

10. The display unit according to claim 9, wherein the driving device comprises the power receiving device.

11. A display system comprising n display units according to claim 7;

the frame; and an output device, wherein the frame comprises a ring-shaped arm and a leg supporting the arm, wherein the output device is configured to output a second signal to the display unit, wherein the display unit is configured to be attached to the arm with the attachment mechanism, and wherein when a first to an n-th display units are attached to the arm, the first part of the display panel of a k-th display unit where k is an integer of 1 or more and n−1 or less overlaps with the second part of the display panel of a (k+1)-th display unit, and the first part of the display panel of the n-th display unit overlaps with the second part of the display panel of the first display unit.

12. The display system according to claim 11, wherein the frame comprises a plurality of protrusions or depressions each fitting the attachment mechanism of the display unit.

13. The display system according to claim 11, wherein the frame comprises a mechanism for opening and closing the arm.

14. The display system according to claim 11, wherein the output device is configured to output the second signal to the display unit wirelessly.

15. The display system according to claim 11, wherein the output device comprises a memory device or a terminal for connecting with an external memory device.

16. The display system according to claim 11, wherein the output device is configured to obtain information over a network.

17. The display system according to claim 11, further comprising a protective member, wherein the protective member overlaps with a display surface of the display unit, and wherein the protective member comprises a light-transmitting material in a region overlapping with a display region of the display panel included in the display unit.

* * * * *